(12) United States Patent
Asai et al.

(10) Patent No.: US 8,238,700 B2
(45) Date of Patent: Aug. 7, 2012

(54) MULTILAYER PRINTED CIRCUIT BOARD

(75) Inventors: Motoo Asai, Ibi-gun (JP); Hiroaki Kodama, Ibi-gun (JP); Kazuhito Yamada, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 161 days.

(21) Appl. No.: 12/757,418

(22) Filed: Apr. 9, 2010

(65) Prior Publication Data
US 2010/0195954 A1 Aug. 5, 2010

Related U.S. Application Data

(63) Continuation of application No. 11/733,361, filed on Apr. 10, 2007, now abandoned, which is a continuation of application No. PCT/JP2005/018367, filed on Oct. 4, 2005.

(30) Foreign Application Priority Data

Oct. 22, 2004 (JP) ................................. 2004-308781

(51) Int. Cl.
*G02B 6/12* (2006.01)
*G02B 6/10* (2006.01)
(52) U.S. Cl. .......................................... 385/14; 385/131
(58) Field of Classification Search .................... 385/14, 385/129–132
See application file for complete search history.

(56) References Cited

U.S. PATENT DOCUMENTS

| | | | |
|---|---|---|---|
| 6,330,377 B1 * | 12/2001 | Kosemura | 385/14 |
| 6,996,305 B2 * | 2/2006 | Kim et al. | 385/15 |
| 7,062,117 B2 | 6/2006 | Uchida | |
| 7,070,207 B2 | 7/2006 | Asai | |
| 7,072,535 B2 | 7/2006 | Uchida | |
| 7,230,278 B2 | 6/2007 | Yamada et al. | |
| 7,437,030 B2 | 10/2008 | Asai et al. | |
| 7,674,987 B2 | 3/2010 | Kodama et al. | |
| 7,693,382 B2 | 4/2010 | Asai | |
| 7,729,570 B2 | 6/2010 | Yamada et al. | |
| 2004/0145873 A1 | 7/2004 | Kim et al. | |
| 2006/0012967 A1 | 1/2006 | Asai et al. | |
| 2007/0062221 A1 * | 3/2007 | Ishida et al. | 65/386 |

(Continued)

FOREIGN PATENT DOCUMENTS

DE 44 39 239 A1 5/1996

(Continued)

OTHER PUBLICATIONS

Extended European Search Report dated Mar. 15, 2010 in counterpart EP Application No. 05790477.3.

(Continued)

*Primary Examiner* — Daniel Petkovsek
(74) *Attorney, Agent, or Firm* — Oblon, Spivak, McClelland, Maier & Neustadt, L.L.P.

(57) ABSTRACT

A multilayer printed circuit board including insulating layers, conductor circuits formed between the insulating layers, and optical circuits formed between the insulating layers and including a first optical circuit. The first optical circuit is positioned on a first outermost insulating layer of the insulating layers, and the insulating layers, conductor circuits and optical circuits are layered to form a multilayer structure having a first surface and a second surface on an opposite side of the first surface such that the multilayer structure is structured to mount optical elements on the first surface and second surface of the multilayer structure, respectively.

16 Claims, 38 Drawing Sheets

U.S. PATENT DOCUMENTS

| | | |
|---|---|---|
| 2007/0223935 A1 | 9/2007 | Asai et al. |
| 2008/0170819 A1 | 7/2008 | Kodama et al. |
| 2008/0247703 A1 | 10/2008 | Kodama et al. |
| 2008/0247704 A1 | 10/2008 | Kodama et al. |
| 2008/0308311 A1 | 12/2008 | Kodama et al. |
| 2010/0135611 A1 | 6/2010 | Asai et al. |

FOREIGN PATENT DOCUMENTS

| | | |
|---|---|---|
| DE | 198 26 648 A1 | 12/1999 |
| EP | 1 376 180 A2 | 1/2004 |
| GB | 2 340 959 A | 3/2000 |
| JP | 11-113033 | 4/1999 |
| JP | 2002-250830 | 9/2002 |
| JP | 2002-277694 | 9/2002 |
| JP | 2003-215372 | 7/2003 |
| JP | 2004-69798 | 3/2004 |
| JP | 2004-191617 | 7/2004 |

OTHER PUBLICATIONS

Japansese Office Action dated Apr. 13, 2010 in relevant JP Application No. 2004-308781.

* cited by examiner

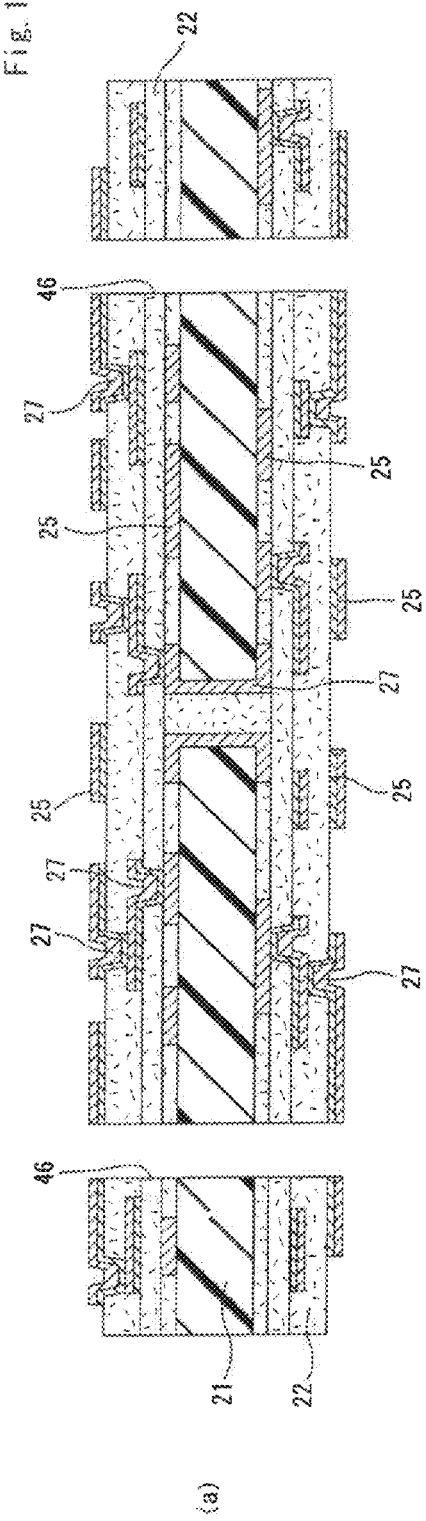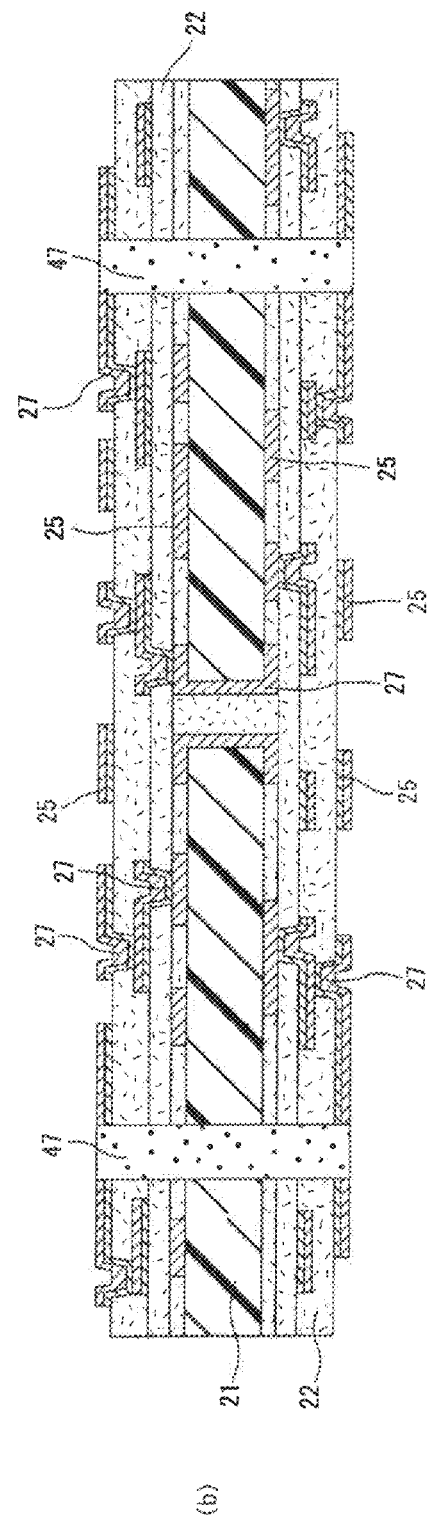
Fig. 15

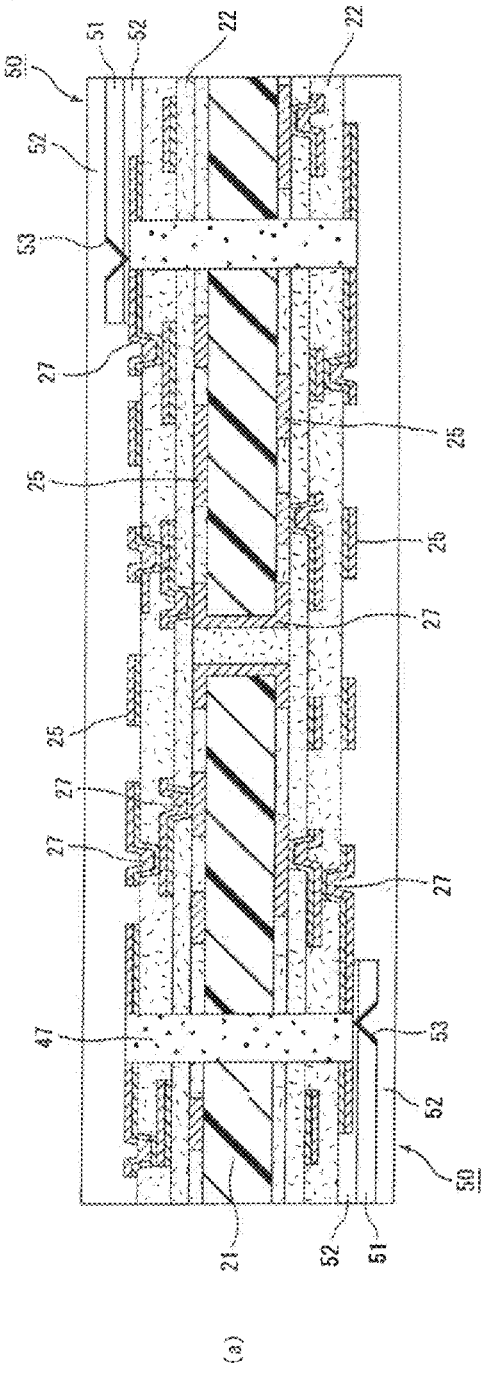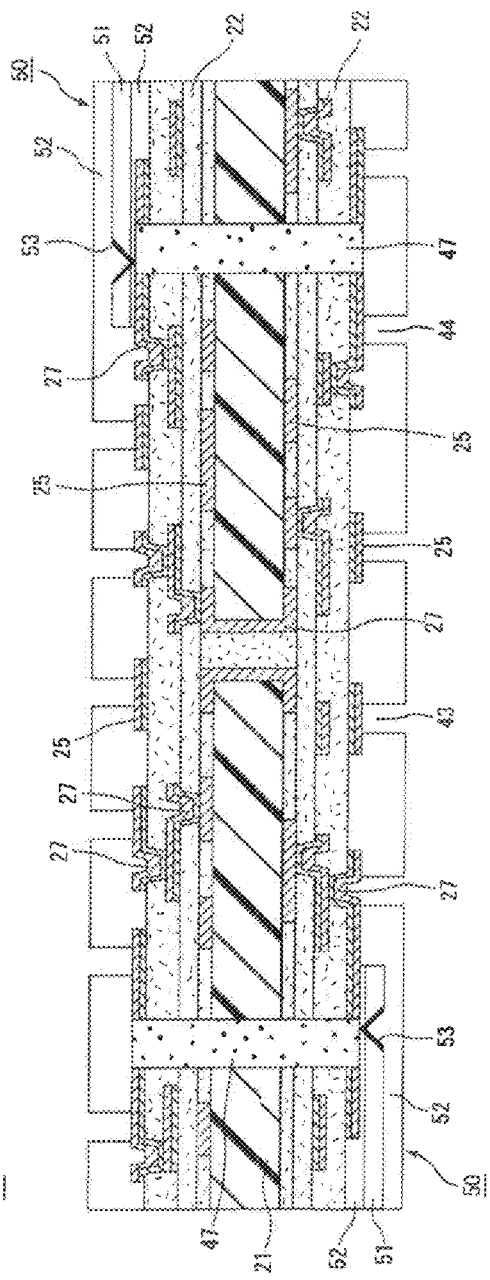
Fig. 16

Fig. 21
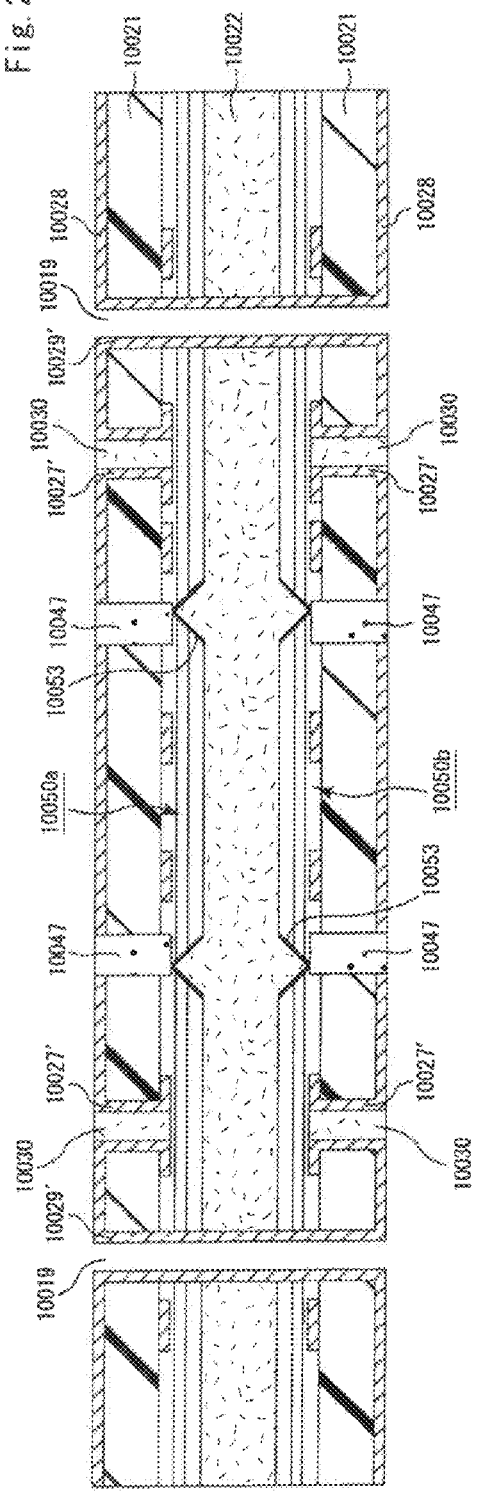
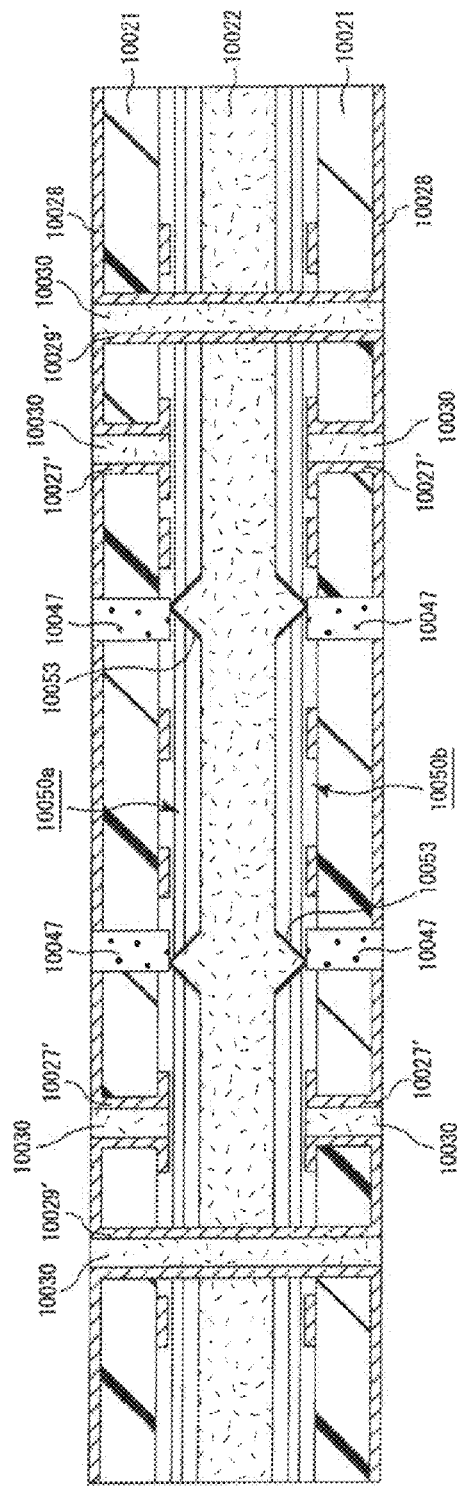
(a)
(b)

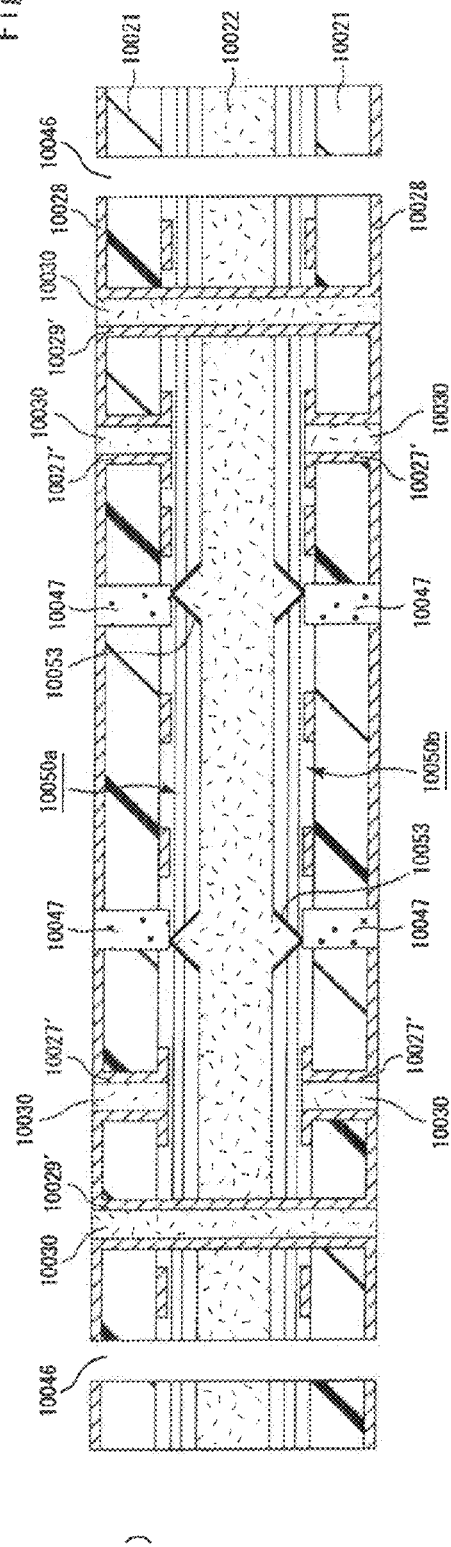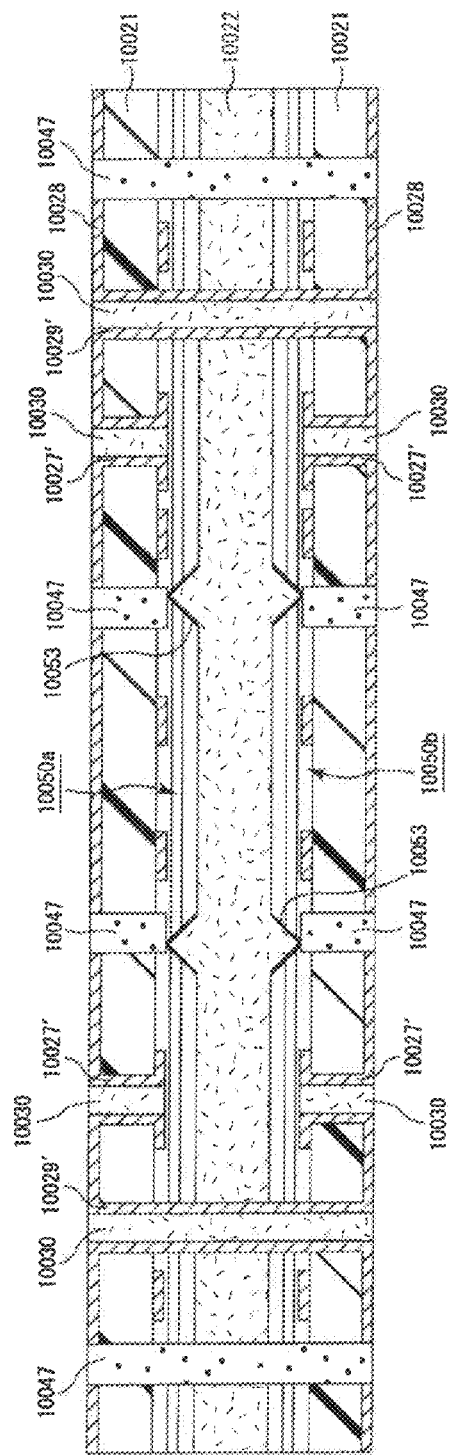
Fig. 22

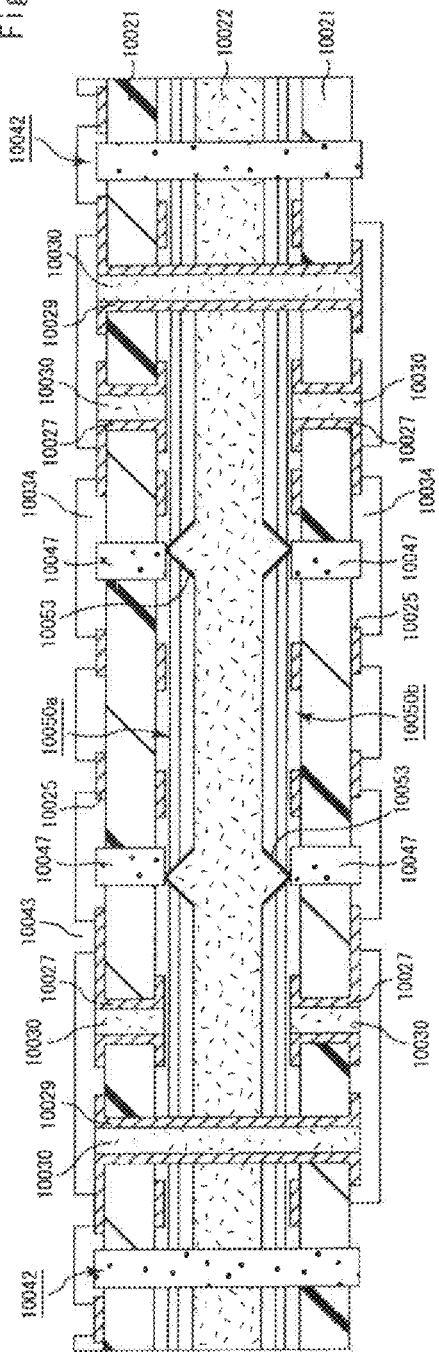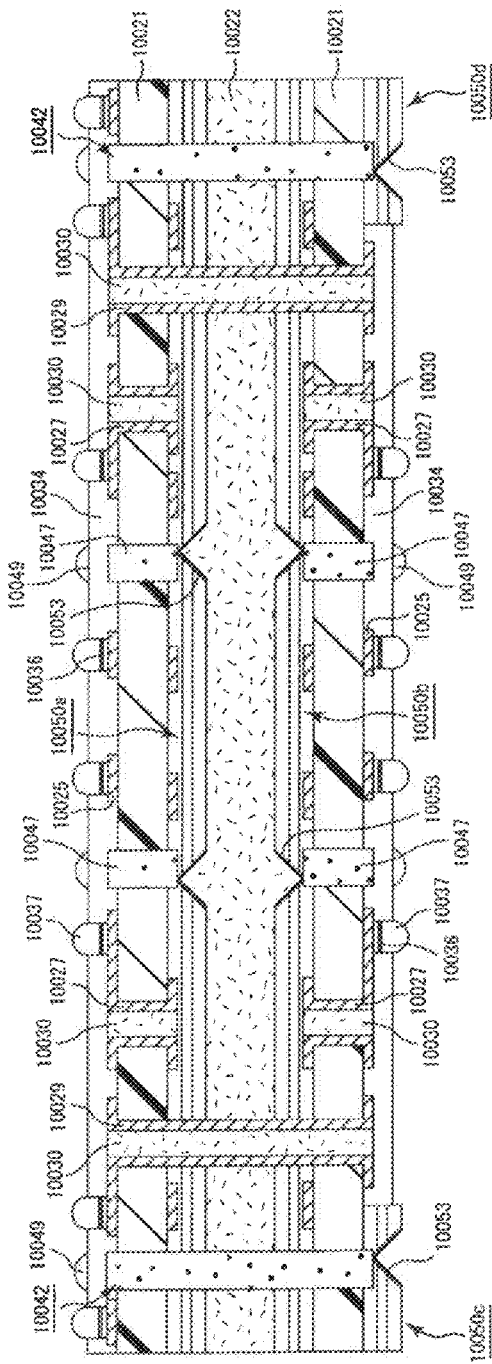
Fig. 24

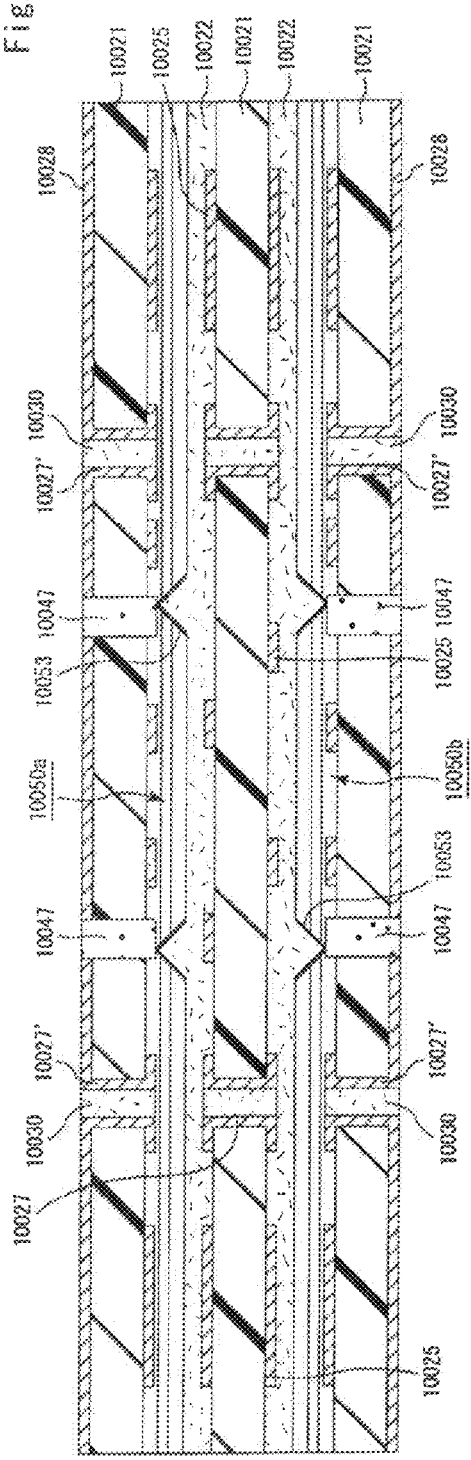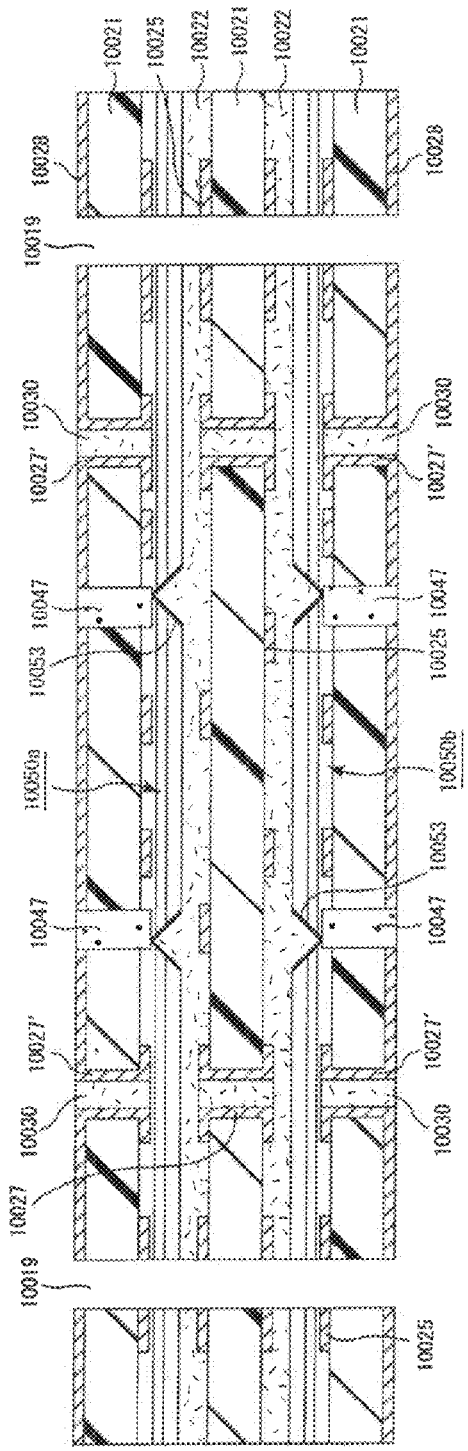
Fig. 26

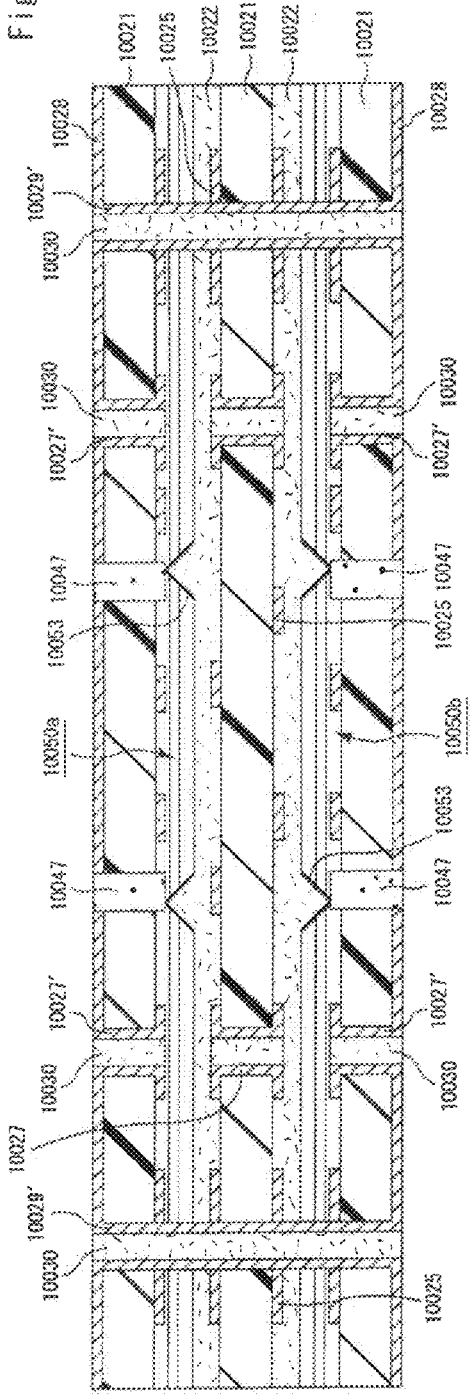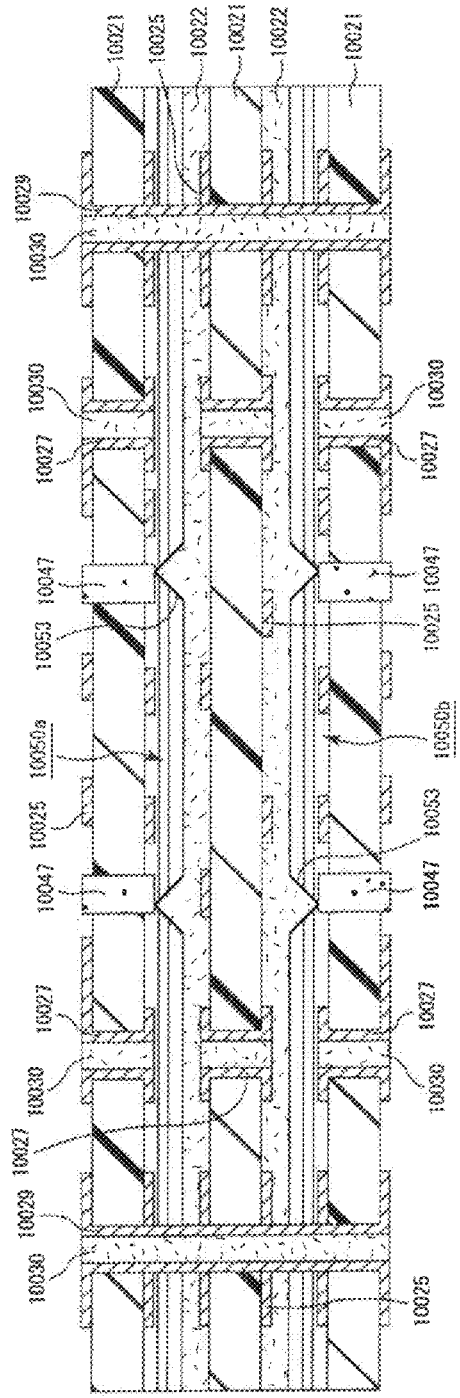
Fig. 27

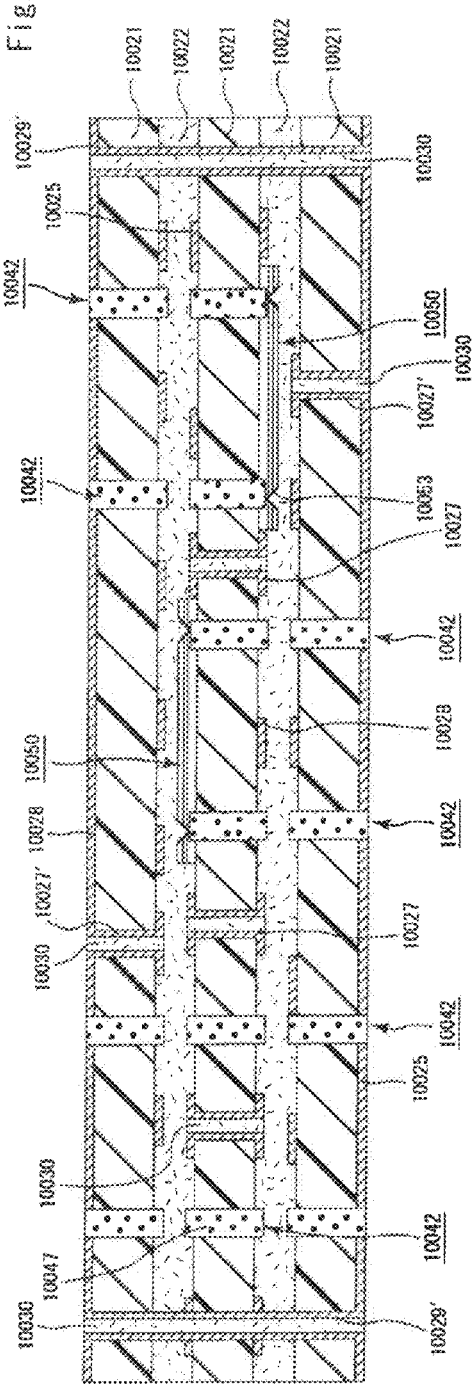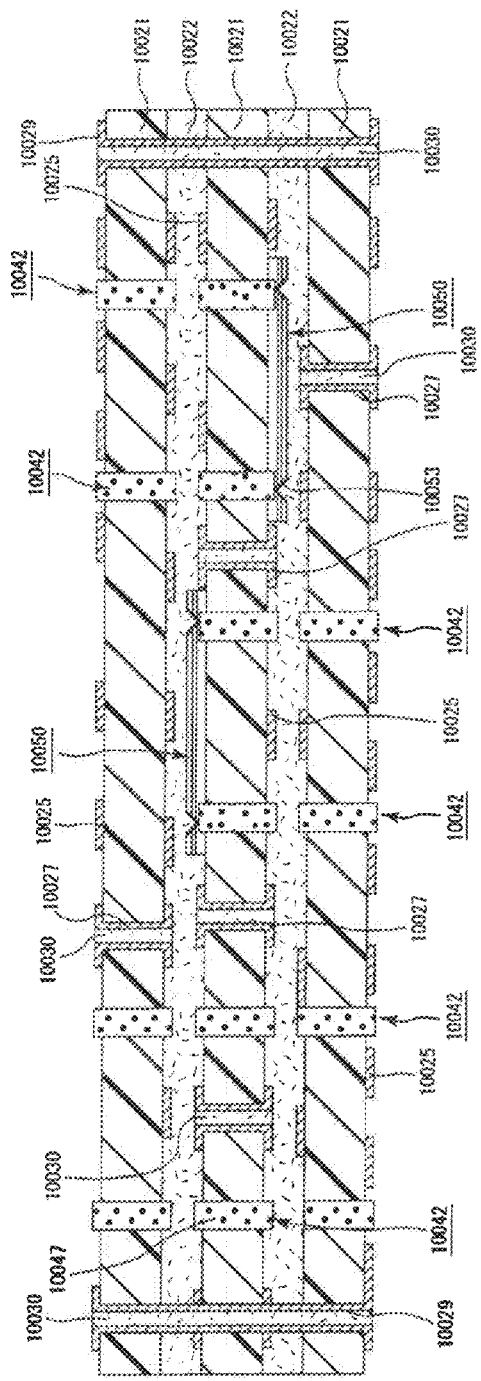
Fig. 36

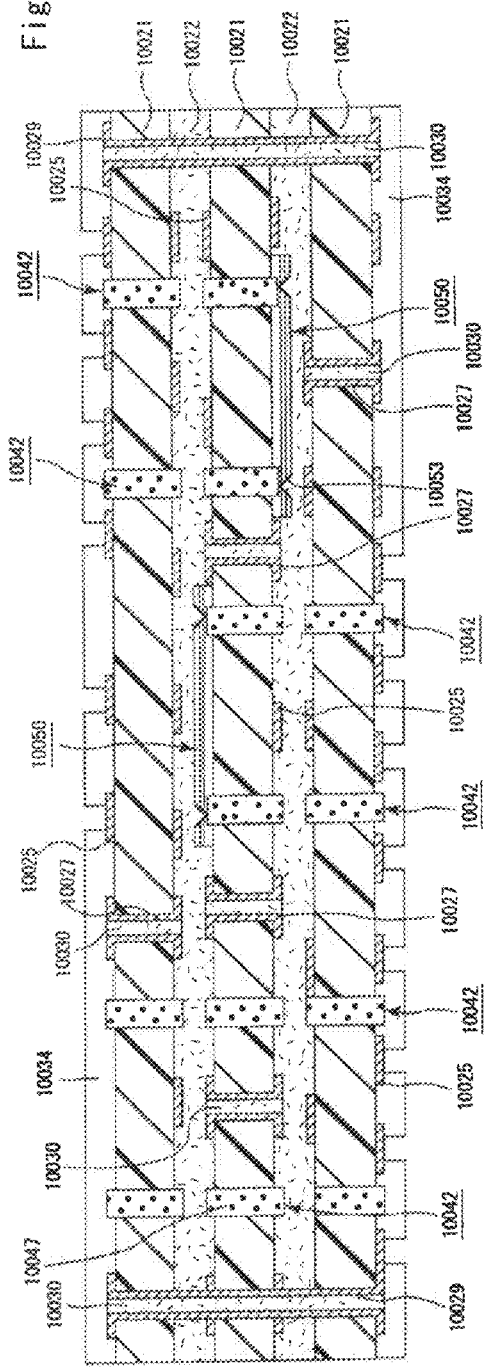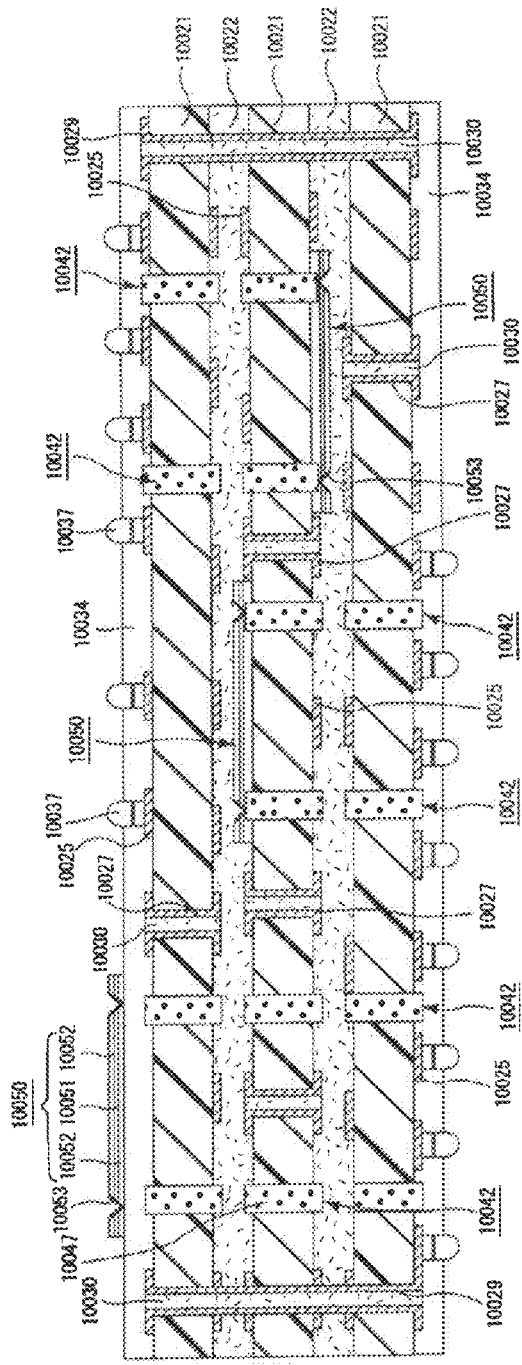
Fig. 37

MULTILAYER PRINTED CIRCUIT BOARD

CROSS-REFERENCE TO RELATED APPLICATIONS

This application is a continuation of and claims benefit of priority from U.S. application Ser. No. 11/733,361, filed Apr. 10, 2007, the entire contents of which are hereby incorporated by reference. U.S. application Ser. No. 11/733,361 is a continuation application of PCT/JP2005/018367 filed on Oct. 4, 2005, which claims priority of JP-A2004-308781 filed on Oct. 22, 2004. The contents of these applications are incorporated herein by reference in their entirety.

BACKGROUND OF THE INVENTION

1. Field of the Invention

The present invention relates to a multilayer printed circuit board which can be used for optical communications.

2. Discussion of the Background

In recent years, together with the expansion of high speed Internet networks, it has been suggested that optical communications be used in communication between trunk networks and terminal equipment (personal computers, mobile units, games and the like), communication between terminal equipments and communication within terminal equipment, in addition to communication within trunk networks.

In trunk networks, increase in the speed of switching apparatuses, such as switching systems and routers, is progressing, together with increase in the amount of information, and therefore, transmission of signals between a daughter board and a switching board in, for example, bookshelf type backplane boards through optical communication has been examined, and optical communication through optical fibers using optical connectors has been examined (see JP-A 1999-113033).

In addition, provision of an optical transceiver in terminal equipment allowing optical communication through optical fibers has also been examined.

The contents of JP-A 1999-113033 are incorporated herein by reference in their entirety.

Electronic parts are mounted on the two surfaces of printed circuit boards used as a daughter board and inside terminal equipment, in order to achieve higher performance and miniaturization of switching apparatuses and terminal equipment in printed circuit boards, and furthermore, miniaturization and increase in the density of mounting of electronic parts are achieved together with increase in the number of mounted parts.

In addition, in the case where optical communication through optical fibers is used, as described above, an optical connector is mounted in the periphery of an end portion of the printed circuit board which forms, for example, a daughter board, and furthermore, this optical connector is connected to a photoelectric conversion element mounted on the printed circuit board. In addition, an optical transceiver is also provided to terminal equipment, usually in such a state as to be mounted on a multilayer printed circuit board.

Thus, it has become necessary for optical connectors and photoelectric conversion elements and optical transceivers to be mounted on a printed circuit board, and in this case, it is necessary to secure a new space for mounting on a printed circuit board, causing a problem that the printed circuit board increases in size, and furthermore, connection with an optical fiber is required and the location in which this is mounted is limited to the periphery of an end portion of the printed circuit board, and as a result, a problem arises that there is less freedom in design.

SUMMARY OF THE INVENTION

A multilayer printed circuit board according to the present invention is a multilayer printed circuit board where a plurality of insulating layers, conductor circuits and a plurality of optical circuits are formed and layered, wherein the above described optical circuits are formed and layered so as to be located in different layers.

In the multilayer printed circuit board according to the present invention, an optical signal transmitting region is desirably formed so as to penetrate through the above described at least one insulating layer, and an optical circuit is optically coupled with at least one end of the above described optical signal transmitting region.

In addition, the above described optical signal transmitting region is desirably formed of a resin composite.

In the multilayer printed circuit board according to the present invention, desirably, it is visually confirmed that a portion of one optical circuit and a portion of another optical circuit from among optical circuits in different layers are superposed on one another when viewed in the direction perpendicular to one main surface of the multilayer printed circuit board.

In the multilayer printed circuit board according to the present invention, an optical element and/or a package substrate on which an optical element is mounted are/is mounted independently on each of two surfaces.

In the multilayer printed circuit board according to the present invention, a via hole for connecting conductor circuits sandwiching the above described insulating layer is desirably formed, and the above described via hole is desirably a penetrating via hole and/or a non-penetrating via hole.

In addition, in the above described multilayer printed circuit board, desirably, the above described optical circuits have a core and a clad, and it is visually confirmed that the above described core and a portion of the above described non-penetrating via hole are superposed on one another when viewed in the direction perpendicular to one main surface of said printed circuit board.

In the multilayer printed circuit board according to the present invention, at least two insulating layers are formed, and an optical circuit is desirably formed on an outer layer of one or both of two outermost insulating layers, and furthermore, an optical circuit is desirably further formed between the above described insulating layers.

In addition, in the multilayer printed circuit board according to the present invention, at least two insulating layers are formed, and the optical circuits are desirably formed only between the above described insulating layers.

In addition, in the above described multilayer printed circuit board, the above described optical circuits are desirably optical waveguides or optical fiber sheets.

In the above described multilayer printed circuit board according to the present invention, the above described optical circuits are organic optical waveguides.

In addition, in the above described multilayer printed circuit board, particles are mixed in with the above described organic optical waveguides.

In addition, in the above described multilayer printed circuit board, the above described organic optical waveguides are formed of a core and a clad, and particles are mixed in only with the clad.

BRIEF DESCRIPTION OF THE DRAWINGS

FIGS. 15(a) and 15(b) are cross-section views for schematically illustrating part of a method for manufacturing a multilayer printed circuit board according to the present invention.

FIGS. 16(a) and 16(b) are cross-section views for schematically illustrating part of a method for manufacturing a multilayer printed circuit board according to the present invention.

FIGS. 21(a) and 21(b) are cross-section views for schematically illustrating part of a method for manufacturing a multilayer printed circuit board according to the present invention.

FIGS. 22(a) and 22(b) are cross-section views for schematically illustrating part of a method for manufacturing a multilayer printed circuit board according to the present invention.

FIGS. 24(a) and 24(b) are cross-section views for schematically illustrating part of a method for manufacturing a multilayer printed circuit board according to the present invention.

FIGS. 26(a) and 26(b) are cross-section views for schematically illustrating part of a method for manufacturing a multilayer printed circuit board according to the present invention.

FIGS. 27(a) and 27(b) are cross-section views for schematically illustrating part of a method for manufacturing a multilayer printed circuit board according to the present invention.

FIGS. 36(a) and 36(b) are cross-section views for schematically illustrating part of a method for manufacturing a multilayer printed circuit board according to the present invention.

FIGS. 37(a) and 37(b) are cross-section views for schematically illustrating part of a method for manufacturing a multilayer printed circuit board according to the present invention.

DESCRIPTION OF THE EMBODIMENTS

Figure 1:
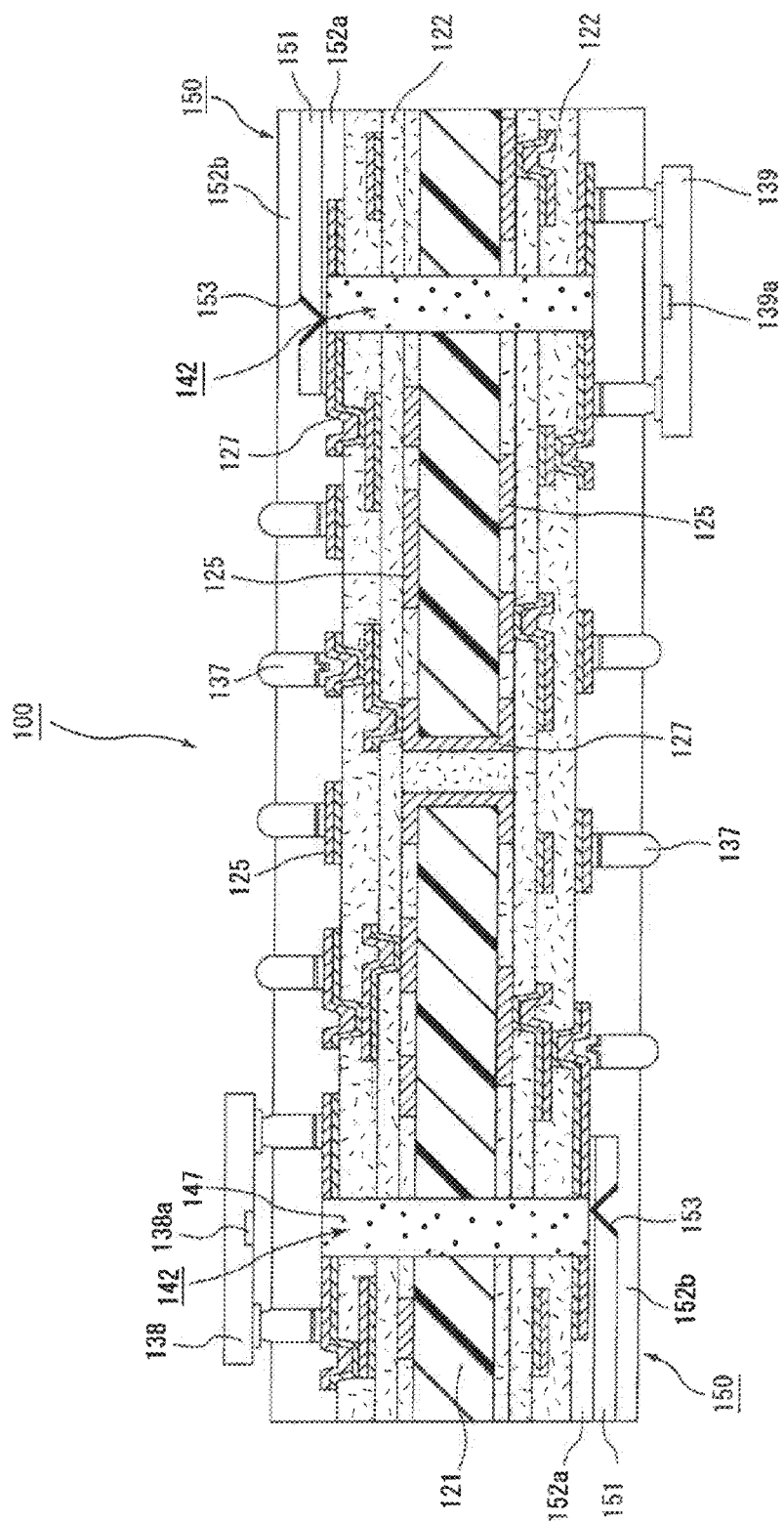
FIG. 1 is a cross-section view schematically showing a multilayer printed circuit board according to one embodiment of the present invention.

In the following, a multilayer printed circuit board according to an embodiment of the present invention is described.

The multilayer printed circuit board according to the present invention is a multilayer printed circuit board where a plurality of insulating layers, conductor circuits and a plurality of optical circuits are formed and layered, wherein the above described optical circuits are formed and layered so as to be located in different layers.

In the multilayer printed circuit board according to the present invention, the optical circuits are formed and layered so as to be located in different layers.

In the multilayer printed circuit board according to the present invention, optical circuits for transmitting an optical signal are formed in different layers and appropriate locations for forming optical circuits can be selected taking the locations where optical parts are mounted and the locations where conductor circuits are formed into consideration, and therefore, there is more freedom in design for the multilayer printed circuit board, and at the same time, miniaturization of the multilayer printed circuit board can be achieved.

In addition, increase in the density of wires (circuits) can be easily introduced in the multilayer printed circuit board according to the present invention. This is because there is more freedom in terms of the locations where optical circuits are formed and the locations where optical parts are mounted, and thus, free space increases when designing the multilayer printed circuit board. Therefore, it also becomes possible to increase the density with which various kinds of optical parts and electronic parts are mounted.

Here, the above described free space refers to a region where a conductor circuit is formed or an electronic part, such as an IC chip or a condenser, is mounted.

In addition, in the multilayer printed circuit board according to the present invention, in the case where an optical signal transmitting region which penetrates through at least one insulating layer is formed, and furthermore, at least one end of the above described optical signal transmitting region is optically coupled with an optical circuit, an optical signal can be transmitted, for example, between optical parts which are mounted on each of the two surfaces of the above described multilayer printed circuit board via the above described optical signal transmitting region.

Here, in the present specification, optical connection between an optical signal transmitting region and an optical circuit means a state where the connection is formed so that an optical signal can be transmitted between the two, and a specific configuration for this is described in the following.

Furthermore, in the case where an optical circuit is formed inside the multilayer printed circuit board according to the present invention, it is easy to make the multilayer printed circuit board fire retardant, making the multilayer printed circuit board much more reliable.

In the following, examples where the above described optical circuits are formed in different layers are described in detail in reference to the drawings, and an example where optical circuits are formed outside both of the two outermost insulating layers, an example where one optical circuit is formed outside either of the two outermost insulating layers (in this case, the other optical circuit is formed between insulating layers), an example where optical circuits are formed only between insulating layers, and the like can be cited.

Here, in the above described multilayer printed circuit boards, a plurality of optical circuits may be formed in the same layer, as long as some optical circuits are formed in different layers as described above.

As the above described optical circuits, optical waveguides, optical fiber sheets and the like can be cited.

As the above described optical waveguides, organic optical waveguides and the like and inorganic optical waveguides comprising silica glass, a compound semiconductor and the like can be cited. From among these, organic optical waveguides comprising a polymer material and the like is desirable. This is because these have excellent adhesiveness with insulating layers and processing is easy.

As the above described polymer material, there are no particular limitations, as long as long as absorption of light in the communication wavelength band is little, and thermosetting resins, thermoplastic resins, photosensitive resins, thermosetting resins which are partially converted to a photosensitive resin, resin compounds of a thermosetting resin and a thermoplastic resin, compounds of a photosensitive resin and a thermoplastic resin, and the like can be cited.

Specifically, acrylic resins such as PMMA (polymethyl methacrylate), heavy-hydrogenated PMMA, heavy-hydrogen fluoridated PMMA; polyimide resins such as fluorinated polyimide; epoxy resins; UV setting epoxy resins; polyolefin based resins; silicone resins such as heavy-hydrogenated silicone resin; siloxane resins; polymers manufactured from benzocyclobutene; and the like can be cited.

In addition, it is desirable for the thickness of the core of the above described optical waveguides to be at least about 1 μm and at most about 100 μm, and it is desirable for the width to be at least about 1 μm and at most about 100 μm. In the case where the above described width is less than about 1 μm, formation thereof sometimes not easy, while in the case where the above described width exceeds about 100 μm, this may cause freedom in design for the conductor circuits and the like which form the multilayer printed circuit board to be impeded.

In addition, it is desirable for the ratio of the thickness to the width of the core of the above described optical waveguides to be close to 1:1. This is because the light receiving portion of the above described light receiving elements and the light emitting portion of the above described light emitting elements are usually in circular form in a plan view. Here, the above described ratio of the thickness to the width is not particularly limited, and it usually falls in the range of about (1:2) to about (2:1).

In addition, it is desirable for the above described optical waveguides to be an optical waveguide having multiple modes, and in the case where the above described optical waveguides are optical waveguides having multiple modes for a communication wavelength of 0.85 μM, it is more desirable for the thickness and the width of the core to be at least about 20 μm and at most about 80 μm, and it is most desirable for these to be about 50 μm.

An optical waveguide having multiple modes is desirable because it makes positioning of optical waveguides and optical elements relatively easy in comparison with optical waveguides having a single mode, and the allowance for positional deviation is high.

In addition, particles may be mixed in with the above described waveguides. This is because mixing in of particles makes it difficult for cracking to occur in the optical waveguides. That is to say, in the case where no particles are mixed in with the optical waveguides, cracking may occur in the optical waveguides, due to the difference in the coefficient of thermal expansion between the optical waveguides and other layers (for example insulating layers), while in the case where particles are mixed in with the optical waveguides so as to adjust the coefficient of thermal expansion, and thus, the difference in the coefficient of thermal expansion with the other layers described above becomes smaller, it becomes difficult for cracking to occur in the optical waveguides.

As the above described particles, the same particles as those included in the resin composite that forms the below described optical signal transmitting region can be cited as examples. Any of these particles may be used alone, or two or more kinds may be used together.

As the above described particles, inorganic particles are desirable, and particles comprising silica, titania or alumina are desirable. In addition, particles having a mixed composition which are formed by mixing and fusing at least two kinds from among silica, titania and alumina are also desirable.

In addition, the form of particles for the above described resin particles, for example, is not particularly limited, and spherical form, elliptic spherical form, crushed form, polygonal form and the like can be cited.

In addition, it is desirable for the particle diameter of the above described particles to be shorter than the communication wavelength. This is because transmission of optical signals may be hindered in the case where the particle diameter is longer than the communication wavelength.

It is desirable for the lower limit of the above described particle diameter to be about 0.01 µm and for the upper limit to be about 0.8 µM. This is because in the case where particles outside this range are included, the distribution in particle size becomes too wide, making the inconsistency in viscosity of the resin composite great when the particles are mixed into the resin composite, and thus, reproducibility in terms of preparation of the resin composite becomes low and it sometimes becomes difficult to prepare a resin composite having a predetermined viscosity.

It is more desirable for the lower limit of the above described particle diameter to be about 0.1 µm and for the upper limit to be about 0.8 µm. Particles within this range are appropriate for making it easy to apply the resin composite using spin coating, roll coating and the like, and in addition, when a resin composite into which particles are mixed is prepared, it is easy to adjust the viscosity to a predetermined value.

It is most desirable for the lower limit of the above described particle diameter to be about 0.2 µM and for the upper limit to be about 0.6 µm. This range is particularly suitable for application of the resin composite and for formation of the core of optical waveguides. Furthermore, inconsistency in the formed optical waveguides, particularly inconsistency in the core, becomes smallest, making the properties of the multilayer printed circuit board excellent.

In addition, two or more kinds of particles having different particle diameters may be included, as long as the particles have particle diameters within this range.

A desirable lower limit for the amount of the above described particles mixed in is about 10% by weight, and a more desirable lower limit is about 20% by weight. Meanwhile, a desirable upper limit for the above described particles is about 80% by weight, and a more desirable upper limit is about 70% by weight. In the case where the amount of particles mixed in is less than about 10% by weight, the effects of mixing in particles may not be gained, while in the case where the amount of particles mixed in exceeds about 80% by weight, transmission of optical signals may be hindered.

In addition, though the form of the above described optical waveguides is not particularly limited, it may be film form, because this makes formation easy.

In addition, in the case where the above described optical waveguides are formed of a core and a clad, though the above described particles may be mixed in with both the core and the clad, it is desirable for the particles not to be mixed in with the core, and for the particles to be mixed in only with the clad which coats the surrounding of the core. The reason for this is as follows.

That is to say, in the case where particles are mixed in with an optical waveguide, an air layer may be formed in the interface between the particles and the resin component of the optical waveguide, depending on the adhesiveness between the particles and the resin component, and in such a case, the air layer may change the direction of refraction of light, making the transmission loss in the optical waveguide great, while in the case where particles are mixed in only with the clad, no such problem that the transmission loss in the optical waveguide becomes great arises when particles as those described above are mixed in, and at the same time, it becomes difficult for cracking to occur in the optical waveguide, and the above described effects can be gained.

In addition, as the above described optical fiber sheet, an optical fiber sheet where a plurality of optical fibers are placed in parallel and the surrounding thereof are coated with a cover resin layer made of a resin composite and the like so that a film is formed can be cited. In this case, the optical fibers may be placed in parallel only in one layer, or optical fibers placed in parallel may be combined in a plurality of layers.

As the above described optical fibers, there are no particular limitations, and silica glass based optical fibers (SOF), polymer clad optical fibers (PCF), hard polymer clad optical fibers (HPCF), plastic optical fibers (POF) and the like can be cited. From among these, silica glass based optical fibers (SOF) are desirable, taking into consideration that the thickness can be reduced. From the viewpoint of positioning, a plastic optical fiber (POF) is desirable.

Only one optical fiber of which the surrounding is coated with a resin composite and which is in film form can also be used as the above described optical fiber sheet.

In addition, it is desirable for an optical path conversion mirror to be formed in the above described optical circuits. This is because the formation of an optical path conversion mirror makes it possible to change the optical path to a desired angle, so that it can be optically coupled with an end portion of the optical signal transmitting region. In this case, the optical path conversion mirror may make contact with air or a resin having a different index of refraction, or a metal vapor deposition layer may be formed. As the above described metal vapor deposition layer, gold, silver, platinum, copper, nickel, palladium, aluminum, chromium, alloys of these and the like can be cited. These may be used alone or in combination.

The above described optical path conversion mirror can be formed by cutting an optical circuit, and if necessary, forming a metal vapor deposition layer, as described below. In addition, a member having an optical path diverting portion may be placed at an end portion of an optical circuit, instead of forming an optical path conversion mirror in the optical circuit.

In addition, in the case where an optical path conversion mirror is formed as described above, though the angle at which it is formed is not particularly limited, and an appropriate angle may be selected in accordance with the optical path, an optical path conversion mirror is usually formed so that the angle formed with the surface that makes contact with the insulating layer is about 45° or about 135°. It is particularly desirable for the above described angle to be about 45° when the optical path conversion mirror is formed, and in this case, formation thereof particularly easy.

In addition, in the above described multilayer printed circuit board, desirably, it is visually confirmed that a portion of one optical circuit and a portion of another optical circuit from among optical circuits in different layers are superposed on one another when viewed in the direction perpendicular to one main surface of the multilayer printed circuit board.

In the case where the optical circuits are provided in such locations, there is great freedom in design in terms of the location of the optical circuits, and therefore, a design which allows optical signals to be transmitted over the shortest distance becomes possible, and thus, transmission loss within the multilayer printed circuit board can be reduced.

In addition, by improving the freedom in design for optical circuits, the multilayer printed circuit board can be miniaturized and wires (circuits) can be mounted with high density, and furthermore, the density of optical parts and electronic parts mounted on the surface can also be increased.

Here, as the configuration where it is visually confirmed that a portion of one optical circuit and a portion of another optical circuit are superposed on one another, an example where the two are partially superposed on one another as they cross perpendicularly, cross diagonally or run in parallel can be cited.

It is desirable in the multilayer printed circuit board according to the present invention for an optical signal transmitting region to be formed so as to penetrate through at least one insulating layer in such a manner that at least one end of the above described optical signal transmitting region is optically coupled with one end of the above described optical circuit.

This is because by forming such an optical signal transmitting region, freedom in design becomes greater when optical circuits are formed so as to be located in different layers.

The above described optical signal transmitting region may be formed of only a space, or a space that is partially or entirely filled in with a resin composite. In the case where the entirety of the above described optical signal transmitting region is filled in with a resin composite, the above described optical signal transmitting region is formed of the resin composite.

As the resin component in the above described resin composite, there are no particular limitations, as long as it has a little absorption in the communication wavelength band, and thermosetting resins, thermoplastic resins, photosensitive resins, thermosetting resins which are partially converted to a photosensitive resin, and the like can be cited as examples.

Specifically, epoxy resins; UV setting epoxy resins; polyolefin based resins; acrylic resins such as PMMA (polymethyl methacrylate), heavy-hydrogenated PMMA, and heavy-hydrogen fluoridated PMMA; polyimide resins such as fluorinated polyimide; silicone resins such as heavy-hydrogenated silicone resin; polymers manufactured from benzocyclobutene; and the like can be cited as examples.

In addition, the above described resin composite may include particles, for example resin particles, inorganic particles, metal particles or the like, in addition to the above described resin component. When these particles are included, matching in the coefficient of thermal expansion can be achieved between the optical signal transmitting region and the insulating layers and the like, and in addition, the optical signal transmitting region may become fire retardant, depending on the kind of particles.

As the above described particles, inorganic particles, resin particles, metal particles and the like can be cited as examples.

As the above described inorganic particles, particles comprising aluminum compounds such as alumina and aluminum hydroxide; calcium compounds such as calcium carbonate and calcium hydroxide; potassium compounds such as potassium carbonate; magnesium compounds such as magnesia, dolomite, basic magnesium carbonate, and talc; silicon compounds such as silica and zeolite; titanium compounds such as titania; and the like can be cited as examples. In addition, the particles may have a mixed composite where at least two kinds of inorganic materials are mixed and fused.

As the above described resin particles, particles comprising a thermosetting resin, a thermoplastic resin or the like can be cited as examples, and specifically, particles comprising an amino resin (melamine resin, urea resin or guanamine resin), an epoxy resin, a phenol resin, a phenoxy resin, a polyimide resin, a polyphenylene resin, a polyolefin resin, a fluorine resin, a bismaleimide-triazine resin or the like can be cited as examples.

As the above described metal particles, gold, silver, copper, tin, zinc, stainless steel, aluminum, nickel, iron, lead and the like can be cited as examples. It is desirable for the surface layer of the above described metal particles to be coated with resin and the like, in order to secure insulating properties.

In addition, these particles may be used alone, or two or more kinds may be used together.

In addition, it is desirable for the form, the maximum length, content and the like of the above described particles to be the same as those of the particles included in the above described optical waveguides.

In addition, in the case where the optical signal transmitting region is filled in with a resin composite in the multilayer printed circuit board according to the present invention, it is desirable for the transmittance of light transmitting through this resin composite to be about 70%/mm or more. This is because in the case where the above described transmittance is less than about 70%/mm, sufficient optical signal transmitting performance cannot be gained. It is more desirable for the above described transmittance to be about 90%/mm or more.

Here, in the present specification, transmittance of a resin composite refers to the transmittance of propagating light per length of 1 mm. In addition, the above described transmittance refers to transmittance measured at 25° C.

In addition, the above described optical signal transmitting region may have a form through which optical signals can be transmitted via an optical circuit having a single channel, or a form through which optical signals can be transmitted via an optical circuit having multiple channels.

In addition, the optical signal transmitting region which can transmit optical signals via an optical circuit having multiple channels as described above may have a collective through hole structure which can transmit optical signals for all channels, or a individual through hole structure which can transmit optical signals for each channel. Here, in either case, the number of channels is not limited. In addition, there may be an optical signal transmitting region having a collective through hole structure and an optical signal transmitting region having a individual through hole structure together in one multilayer printed circuit board.

As the form of the optical signal transmitting region having a collective through hole structure as described above, a round pillar, a rectangular pillar, a cylindroid shape, a form of a plurality of round pillars aligned in parallel and connected through portions on the sides of adjacent round pillars, and a pillar form with a bottom surrounded by a line and an arc can be cited as examples.

In addition, in the case where the form of the above described optical signal transmitting region is a form of a plurality of round pillars aligned in parallel and connected through portions on the sides of adjacent round pillars, some round pillars may be formed as dummy round pillars which do not actually function as a portion of the optical signal transmitting region.

In addition, it is desirable for the size of the optical signal transmitting region having a collective through hole structure as described above to be at least about 100 μm and at most about 5 mm longitudinally and laterally. In addition, in the case where the form of the above described optical signal transmitting region is cylindrical, it is desirable for the diameter to be in the above described range.

In the case where the diameter of the cross section is less than about 100 μm as described above, transmission of optical signals may be hindered, while in the case where the diameter exceeds about 5 mm, the problem regarding transmission loss of optical signals does not improve, making miniaturization of the above described multilayer printed circuit board difficult.

In addition, as the form of each optical signal transmitting region having a individual through hole structure as described above, a round pillar, a rectangular pillar, a cylindroid shape, a pillar form with a bottom surrounded by a line and an arc, and the like can be cited as examples.

It is desirable in the optical signal transmitting region having a individual through hole structure as described above for the lower limit of the diameter in the cross section to be about 100 μm, in terms of the size of each optical signal transmitting region, and it is desirable for the upper limit to be about 500 μm. The reason for this is as follows. In the case where the above described diameter is less than about 100 μm, there is a risk that the optical path may be clogged, and it may be difficult for the optical signal transmitting region to be filled in with an uncured resin composite. Meanwhile, in the case where the above described diameter is made more than about 500 μm, the transmitting properties for optical signals do not increase very much, and this may result in hindering freedom in design for the conductor circuit and the like which form the multilayer printed circuit board.

A more desirable lower limit for the diameter is about 250 μm, and a more desirable upper limit for the diameter is about 350 μm.

Here, diameter in the cross section in a portion of the above described optical signal transmitting region which penetrates through the above described substrate and the above described insulating layers means the diameter in the cross section in the case where the above described optical signal transmitting region is in cylindrical shape, the long diameter in the cross section in the case of a cylindroid shape, and the length of the longest portion in the cross section in the case of a quadrangular pillar or a polygonal pillar. In addition, in the present invention, cross section in the optical signal transmitting region means the cross section in the direction parallel to the main surface of the multilayer printed circuit board.

Here, it is desirable for the above described optical signal transmitting region to be formed so as to have a size which prevents propagating light from being reflected from the wall surface upon transmission of the optical signal, and in order to do so, it is desirable for the design to be such that collimated light is allowed to transmit through the optical signal transmitting region, by providing the below described micro lens.

The walls of the above described optical signal transmitting region may be formed of resin or metal.

Here, an insulating layer is usually exposed from the wall surface of the above described optical signal transmitting region, and therefore, the walls are formed of the same material as the insulating layers. Accordingly, in the case where the insulating layers are made of resin, the walls of the above described optical signal transmitting region are formed of the resin without any particular processing.

Here, a resin layer may be separately formed on the wall surface of the above described optical signal transmitting region, and in this case, it is desirable for the resin layer to be formed so as to function as a clad, when the resin composite with which the above described optical signal transmitting region is filled in functions as a core.

In addition, in the case where the walls of the above described optical signal transmitting region are formed of a metal, examples of the material include copper, nickel, chromium, titanium, precious metals, and the like.

In addition, in the case where the walls of the above described optical signal transmitting region are formed of a metal, that is to say, in the case where a metal layer is formed on the wall surface of the optical signal transmitting region, this metal layer may be formed of one layer or two or more layers.

In addition, in some cases, the above described metal layer may function as a via hole, that is to say, may electrically connect conductor circuits sandwiching a substrate or conductor circuits sandwiching a substrate and an insulating layer.

In addition, in the case where a resin layer or a metal layer is formed on the wall surface of the above described optical signal transmitting region, it is desirable for the surface (surface which makes contact with the resin composite with which the inside is filled in) to be made coarse, so that the surface roughness (Ra) becomes at least about 0.1 μm and at most about 5.0 μm. This is because the adhesiveness with the resin composite increases.

Here, the above described surface may be made coarse through an etching process and the like.

Meanwhile, in the case where a resin layer or a metal layer is formed on the wall surface of the above described optical signal transmitting region, optical signals can be transmitted as light is reflected from this resin layer or metal layer, and in this case, it is desirable for the surface coarseness on the wall surface to be small. This is because the transmission loss of optical signals can be reduced.

In particular, in the case of multilayer boards having a great number of layers, the optical signal transmitting region becomes long, and therefore, it is effective to use a method for transmitting optical signals while light is reflected.

Here, the form of the above described optical signal transmitting region, the location where it is formed and the number of optical signal transmitting regions as that described above are not particularly limited in the multilayer printed circuit board according to the present invention, and an appropriate form, location and number can be selected taking into consideration the design of the multilayer printed circuit board, that is to say, the locations in which optical parts are mounted and the locations where optical circuits and conductor circuits are formed.

In the case where an optical signal transmitting region is formed in the multilayer printed circuit board according to the present invention, a micro lens may be provided on an end portion and the like on the side opposite to the side of the optical signal transmitting region which is optically coupled with an optical circuit. The above described micro lens may be provided directly, or may be provided via an optical adhesive.

This is because when a micro lens is provided, optical signals can be focused through the micro lens, making it possible for optical signals to be transmitted more certainly.

The above described micro lens is not particularly limited, and micro lenses used as an optical lens can be cited, and as specific examples of the material, optical glass, resins for optical lenses, and the like can be cited. As the above described resins for optical lenses, the same materials as the above described polymer materials described as resin composites, such as acrylic resins and epoxy resins, with which the above described optical signal transmitting region is filled in can be cited as examples.

In addition, as the form of the above described micro lens, a form of a convex lens having a convex surface only on one side can be cited as an example, and in this case, an appropriate radius of curvature for the above described convex lens surface can be selected taking the design of the optical signal transmitting region into consideration. Specifically, it is desirable to increase the radius of curvature, for example, when it is necessary to increase the focal distance, and it is desirable to decrease the radius of curvature when it is necessary to decrease the focal distance.

Here, the form of the above described micro lens is not limited to a form of a convex lens, and may be any form which allows optical signals to be focused in a desired direction.

It is desirable for the transmittance of the above described micro lens for light having the communication wavelength to be about 70%/mm or more.

This is because in the case where the transmittance of light having the communication wavelength is less than about 70%/mm, loss of optical signals is great, which leads to reduction in the transmission of optical signals. It is more desirable for the above described transmittance to be about 90%/mm or more.

In addition, the above described micro lens may include particles such as resin particles, inorganic particles or metal particles.

This is because when particles are included, the strength of the micro lens increases, so that the form can be maintained more certainly and the coefficient of thermal expansion can be matched with the above described substrate or the insulating layers, and thus, it becomes more difficult for cracking to occur due to the difference in the coefficient of thermal expansion.

In the case where particles are included in the above described micro lens, it is desirable for the index of refraction of the resin component of the micro lens and the index of refraction of the above described particles to be approximately the same. Therefore, it is desirable for the particles included in the micro lens to be a mixture of two or more kinds of particles having different indices of refraction, so that the index of refraction of the particles becomes approximately the same as the index of refraction of the resin component.

Specifically, in the case where the resin component is an epoxy resin having an index of refraction of 1.53, for example, it is desirable for the particles included in the micro lens to be particles gained by mixing and fusing silica particles having an index of refraction of 1.46 and titanium particles having an index of refraction of 2.65.

Here, as the method for mixing particles, a kneading method, a method for creating particles after two or more kinds of particles are melted and mixed, and the like can be cited.

Here, as specific examples of the above described particles, the same kinds of particles as those which can be mixed in with the above described optical signal transmitting region can be cited.

Though the particle diameter of the above described particles is not particularly limited, it is desirable for the upper limit to be about 0.8 µm and the lower limit to be about 0.01 µm.

This is because the above described micro lens is usually provided using an inkjet apparatus or a dispenser, and the minimum size of the inner diameter of the application nozzle of inkjet apparatuses and the inner diameter of the nozzle of dispensers is currently about 20 µm, and in the case where the particle diameter is in the above described range, application becomes possible without the nozzle being clogged.

In addition, it is more desirable for the lower limit of the above described particle diameter to be about 0.1 µm.

It is more desirable for the above described particle diameter to be in this range taking into consideration the stability of the viscosity and inconsistency in the applied amount in the application using an inkjet apparatus or a dispenser.

A desirable lower limit for the amount of particles mixed in with and included in the above described micro lens is about 5% by weight, and a more desirable lower limit is about 10% by weight. Meanwhile, a desirable upper limit for the above described amount of particles mixed in is about 60% by weight, and a more desirable upper limit is about 50% by weight. This is because, in the case where the amount of particles mixed in is less than about 5% by weight, the effects of mixing in particles sometimes cannot be gained, while in the case where the amount of particles mixed in exceeds about 60% by weight, transmission of optical signals may be hindered.

Here, in the case where the multilayer printed circuit board according to the present invention has an optical circuit having multiple channels and this multilayer printed circuit board is provided with micro lenses, these micro lenses may be micro lenses that are independent of each other or may form a micro lens array where a plurality of lenses are arranged in parallel.

Though the above described micro lenses may be provided directly as described above, or provided by using an optical adhesive, it is desirable for them to be provided directly.

The above described optical adhesive is not particularly limited, and an epoxy resin based, acryl resin based or silicone resin based optical adhesive and the like can be used.

As for the properties of the above described optical adhesive, the following is desirable: a viscosity of at least about 0.2 Pa·s and at most about 1.0 Pa·s, an index of refraction of at least about 1.4 and at most about 1.6, light transmittance of about 80%/mm or more, a coefficient of thermal expansion (CTE) of at least about $4.0 \times 10^{-5}$ (/° C.) and at most about $9.0 \times 10^{-5}$ (/° C.).

In addition, it is desirable for the thickness of the above described optical adhesive to be about 50 µm or less.

In addition, in the case where the above described micro lens is provided, a surface process may be carried out in the region in which it is provided.

When resin is applied in order to form a micro lens using an inkjet apparatus and the like, there tends to be inconsistency in the form of the micro lens, specifically the degree of sagging, due to inconsistency in the conditions for the process up to the formation of the solder resist layer and inconsistency in the wettability in the portion in which the micro lens is provided, caused by the difference in the length of time over which the solder resist layer is left, but inconsistency in the degree of sagging can be reduced by carrying out a surface process with a water repellant coating agent, and the like.

As the above described surface process, a process using a water repellant coating agent such as a fluorine based polymer coating agent (surface tension: at least about 10 and at most about 12 mN/m), a water repellant process using $CF_4$ plasma, a hydrophilic process using $O_2$ plasma or the like can be cited as examples.

In addition, the above described micro lens may be provided via a lens marker.

As the above described lens marker, one disclosed in JP-A 2002-331532 can be cited as an example.

The contents of JP-A 2002-331532 are incorporated herein by reference in their entirety.

In addition, in the case where a lens marker is formed, it is desirable for the above described micro lens to be provided on a lens marker on which a water repellent process or a hydrophilic process is carried out.

This is because of the following. In the case where the surface of the lens marker is dirty, the resin composite (resin composite for a lens) used for the formation of the micro lens does not spread uniformly, and leading to a problem that a micro lens having a desired form cannot be formed, but the dirt on the surface of the lens marker can be removed by carrying out a water repellent process or a hydrophilic process as described above, and thus, the above described resin component for a lens can be spread uniformly over the lens marker.

Furthermore, it is desirable for a hydrophilic process to be carried out, rather than a water repellent process, on the lens marker.

This is because in the case where a hydrophilic process is carried out, the resin composite for a lens that has been dropped onto the lens marker tends to spread over the entirety of the lens marker when the micro lens is provided, and in addition, the spread of this resin stops at the outer periphery of the lens marker without fail, which is suitable for the formation of a micro lens having a predetermined form, due to the surface tension.

In the multilayer printed circuit board according to the present invention, it is desirable for an optical element and/or a package substrate on which an optical element is mounted (hereinafter, also referred to as package substrate mounted with an optical element) to be mounted on the two surfaces independently of each other.

Here, "on the two surfaces independently of each other" means in the above described embodiment that only optical elements or a package substrate mounted with an optical element or both optical elements and a package substrate mounted with an optical element are mounted on the surface of the multilayer printed circuit board, and at this time, it is not necessary for the same to be mounted on one surface of the multilayer printed circuit board and on the other surface, but, for example, optical elements may be mounted on one surface and package substrates mounted with an optical element may be mounted on the other surface. Of course, the same may be mounted on the two surfaces.

As the above described optical elements, light receiving elements, light emitting elements and the like can be cited as examples.

Appropriate elements may be used from among these, taking into consideration the configuration of the above described multilayer printed circuit board, the required properties and the like.

As the material for the above described light receiving elements, Si, Ge, InGaAs and the like can be cited. InGaAs is desirable from among these, because of the excellent light receiving sensitivity.

As the above described light receiving elements, a PD (photo diode), an APD (avalanche photo diode) and the like can be cited as examples.

As the above described light emitting elements, an LD (semiconductor laser), a DFB-LD (distribution feedback-type semiconductor laser), an LED (light emitting diode), and an infra-type, an oxidation constriction-type VCSEL (plane emission semiconductor laser), and the like can be cited as examples.

Appropriate elements may be used from among these, taking into consideration the configuration of above described multilayer printed circuit board, the required properties and the like.

As the material for the above described light emitting elements, a compound of gallium, arsenic and phosphorous (GaAsP), a compound of gallium, aluminum and arsenic (GaAlAs), a compound of gallium and arsenic (GaAs), a compound of indium, gallium and arsenic (InGaAs), a compound of indium, gallium, arsenic and phosphorous (InGaAsP) and the like can be cited.

An appropriate material may be used from among these, taking the communication wavelength into consideration, and GaAlAs can be used in the case where the communication wavelength is, for example, a band of 0.85 μm, and InGaAs or InGaAsP can be used in the case where the communication wavelength is a band of 1.31 μm or a band of 1.55 μm.

In addition, the optical elements, for example the light receiving elements or the light emitting elements, may be optical elements having multiple channels, and the number of channels is not particularly limited. Here, in the case where the optical elements form an array element having multiple channels, the array element may have light receiving portions or light emitting portions arranged linearly or two-dimensionally.

In addition, the above described optical elements may be mounted through flip chip bonding or wire bonding.

As the above described package substrates mounted with an optical element, package substrates on which optical elements as those described above are mounted can be used.

In addition, in the case where optical elements or package substrates mounted with an optical element are mounted as described above, these may be filled in with an underfill.

The material for the above described underfill is not particularly limited, and thermosetting resins, photosensitive resins, thermosetting resins to which a photosensitive group is partially added, resin compounds including any of these and thermoplastic resins, and the like, for example, can be used. In addition, commercially available resins can be used for the underfill.

In addition, it is desirable for the transmittance of the above described underfill for light having the communication wavelength to be about 70%/mm or more. This is because in the case where the transmittance of light having the communication wavelength is less than about 70%/mm, loss of optical signals is great, which leads to reduction in the transmission of optical signals. It is more desirable for the above described transmittance to be about 90%/mm or more.

As the above described thermosetting resins, epoxy resins, phenol resins, polyimide resins, polyester resins, bismaleimide resins, polyolefin based resins, polyphenylene ether resins, polyphenylene resins, fluorine resins, and the like can be cited as examples.

As the above described photosensitive resins, acrylic resins and the like can be cited as examples.

In addition, as the above described thermosetting resins to which a photosensitive group is partially added, thermosetting resins as those described above, of which the thermosetting group is made to react with a methacrylic acid or an acrylic acid so as to be converted to acryl, and the like can be cited as examples.

As the above described thermoplastic resins, phenoxy resins, polyether sulfone (PES), polysulfone (PSF), polyphenylene sulfone (PPS), polyphenylene sulfide (PPES), polyphenylene ether (PPE), polyether imide (PI), and the like can be cited as examples.

In addition, particles may be included in the above described underfill. In the case where particles are included, the coefficient of thermal expansion can be adjusted by adjusting the amount mixed in, and therefore, matching of the coefficient of thermal expansion can be achieved between the underfill and the package substrates or the optical elements.

As specific examples of the above described particles, the same particles as those which can be included in the above described optical signal transmitting region can be cited.

In addition, in the case where particles as those described above are included in the above described underfill, it is desirable for the lower limit of the amount of the particles mixed in to be about 20% by weight, and it is desirable for the upper limit to be about 70% by weight. This is because an amount in this range is usually appropriate for matching the coefficient of thermal expansion with the package substrates or the optical elements, and provides the fluidity required at the time of filling.

A more desirable lower limit is about 30% by weight, and a more desirable upper limit is about 60% by weight.

In addition, insulating layers and conductor circuits are layered in the above described multilayer printed circuit board, and it is desirable for a penetrating via hole or a non-penetrating via hole to be further formed as a via hole for connecting conductor circuits which sandwich an insulating layer.

In the case where a penetrating via hole is formed, conductor circuits in different layers can be connected in a simple structure and collectively, even when the optical circuits are formed in an inner layer (between insulating layers) of the multilayer printed circuit board.

In addition, in the case where a non-penetrating via hole is formed, the diameter of the via hole can be made small, which is appropriate for increasing the density of wires (circuits) on the multilayer printed circuit board.

Here, one or both of a non-penetrating via hole and a penetrating via hole can be formed in accordance with the design of the multilayer printed circuit board, and there is great freedom in design for conductor circuits, so that increase in the density of wires (circuits) can be achieved, even when the optical circuits are in an inner layer, when these are formed.

In addition, in the case where a non-penetrating via hole is formed as described above and the above described optical circuits have a core and a clad, desirably, it is visually confirmed that the above described core and a portion of the above described non-penetrating via hole are superposed on one another when viewed in the direction perpendicular to one main surface of said printed circuit board.

In this case, it is not necessary to wire optical circuits in such a manner that the optical circuits detour around portions where non-penetrating via holes are not formed, and thus, optical circuits can be formed in a layer where non-penetrating via holes are not formed, which is appropriate for wiring the optical circuits and the conductor circuits with high density.

Here, in this case, the up-and-down positional relationship between the above described core and the above described non-penetrating via hole is not important.

In the multilayer printed circuit board according to the present invention, the above described optical circuits are formed so as to located in different layers, and specifically, it is desirable for an optical circuit to be formed outside one or both insulating layers from among the two outermost insulating layers, and furthermore, it is desirable for an optical circuit to be formed between the above described insulating layers.

In addition, it is also desirable for an optical circuit to be formed only between the above described insulating layers.

Accordingly, as the multilayer printed circuit boards according to the preferred embodiments of the present invention, (1) an example where optical circuits are formed on the two outermost insulating layers, (2) an example where optical circuits are formed on one outermost insulating layer and on an inner insulating layer, (3) an example where optical circuits are formed on the two outermost insulating layers and an inner insulating layer, and (4) an example where optical circuits are formed on different inner insulating layers can be cited.

In the following, these embodiments are described in reference to the drawings.

In the following, specific embodiments of the multilayer printed circuit boards according to the present invention are described in reference to the drawings.

FIG. 1 is a cross-sectional diagram schematically showing an embodiment of a multilayer printed circuit board according to the present invention.

As shown in FIG. 1, in a multilayer printed circuit board 100, conductor circuits 125 and insulating layers 122 are formed and layered on the two surfaces of a substrate 121 (insulating layer), and the conductor circuits sandwiching the substrate 121 and the conductor circuits sandwiching the insulating layer 122 are electrically connected through non-penetrating via holes 127.

In addition, in this multilayer printed circuit board 100, optical signal transmitting regions 142 which penetrate through a substrate 121 where insulating layers 122 are formed on the two surfaces are formed and optical signal transmitting regions 142 are filled in with a resin composite 147. Accordingly, optical signals inputted/outputted via optical elements 138 and 139 mounted on the multilayer printed circuit board 100 are transmitted via optical signal transmitting regions 142.

In the multilayer printed circuit board 100, on one surface, an optical waveguide 150 made of a core 151 and a clad 152a and 152b is formed as the entire outermost layer, and a light receiving element 138 is mounted, and on the other surface, an optical waveguide 150 is formed as the entire outermost layer and a light emitting element 139 is mounted. Furthermore, each of the optical waveguides and the optical elements, from among these optical waveguides and optical elements (light emitting elements and light receiving elements) which face each other with the substrate therebetween are formed and mounted in locations where optical signals can be transmitted via optical signal transmitting regions 142 which are filled in with a resin composite.

Here, optical path conversion mirrors 153 are formed in optical waveguides 150, and a metal vapor deposition layer is formed on these optical path conversion mirrors 153.

In addition, the angle formed between these optical path conversion mirrors 153 and the surface of optical waveguides 150 which make contact with the insulating layers is 45°.

In addition, optical elements 138 and 139 are mounted on the two surfaces of the multilayer printed circuit board via solder connection portions. In optical waveguides 150, a lower clad 152a and a core 151 are formed on top of an outermost insulating layer in a predetermined location, and furthermore, an upper clad 152b is formed so as to cover the outermost conductor circuits and the insulating layer, in addition to the core and the lower clad, and this upper clad 152b functions as a so-called solder resist layer.

Here, the thickness of lower clad 152a is greater than the thickness of the conductor circuit in the outermost layer.

Furthermore, solder bumps 137 are formed on the outermost layers of the multilayer printed circuit board 100, and these solder bumps 137 can electrically connect an IC chip, a variety of electronic parts (for example condensers), an external substrate and the like to the multilayer printed circuit board 100.

Figure 2:
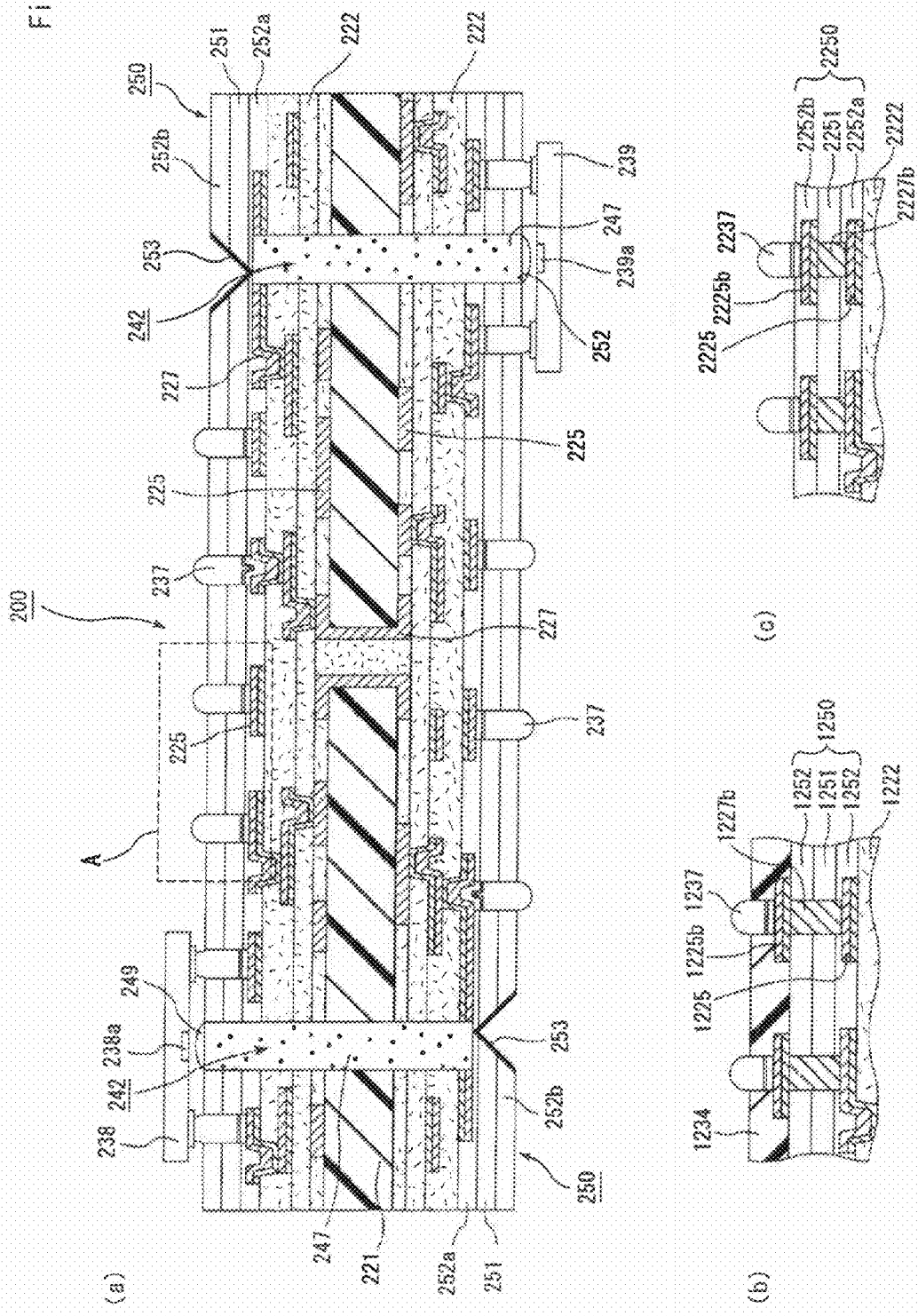
FIG. 2(a) is a cross-section view schematically showing a multilayer printed circuit board according to another embodiment of the present invention.
FIGS. 2(b) and 2(c) are cross-section views showing an enlarged portion of a multilayer printed circuit board according to other embodiments of the present invention.

The multilayer printed circuit board according to the present invention is not limited to the embodiment shown in FIG. 1, and may be, for example, that shown in FIGS. 2(a) to 2(c).

FIG. 2(a) is a cross-sectional diagram schematically showing another embodiment of a multilayer printed circuit board according to the present invention, and FIGS. 2(b) and 2(c) are cross-sectional diagrams showing enlarged portions of other embodiments of a multilayer printed circuit board according to the present invention.

In a multilayer printed circuit board 200 shown in FIGS. 2(a) to 2(c), each of micro lenses 249 are provided directly in the end portion of optical signal transmitting regions 242 formed of a resin composite 242a and a conductor layer 245 on the optical element 238 and 239 side.

Micro lenses are provided in this manner, whereby transmission loss of optical signals can be reduced.

In addition, in the multilayer printed circuit board 200, the entirety of the outermost layers is covered with optical waveguides 250 made of lower clads 252a, cores 251 and upper clads 252b, and optical path conversion mirrors 253 are formed of a metal vapor deposition layer in portions of the outermost layers (directly above or directly beneath optical signal transmitting regions 252).

The embodiment of the multilayer printed circuit board 200 is the same as the embodiment of the multilayer printed circuit board 100 shown in FIG. 1, except that the entirety of optical signal transmitting regions 242 is filled in with resin composite 247, and micro lenses 249 are provided on the end portions of optical signal transmitting regions 242, and in addition, the form of optical waveguides 250 formed in the outermost layers is slightly different.

Here, in the case where micro lenses are provided on end portions of the above described optical signal transmitting regions, these micro lenses may be formed on end portions of all of the optical signal transmitting regions formed in the above described multilayer printed circuit board, or may be formed on the end portions of only some optical signal transmitting regions formed in the above described multilayer printed circuit board.

In addition, a surface process, such as a hydrophilic process or a water repellant process may be carried out on the end portions of the optical signal transmitting regions where micro lenses are formed as described above.

The locations where the above described micro lenses are provided are not limited to end portions of optical signal transmitting regions, and may be inside optical signal transmitting regions.

In addition, in the case where micro lenses are provided, it is desirable for the micro lens provided on the side facing a light emitting element 239 to be designed so that the focal point falls on the core of the optical waveguide on the side opposite to the side facing the light emitting element, and in addition, it is desirable for the micro lens provided on the side facing light receiving element 238 to be designed so that light that transmits through the optical waveguide is converted to collimated light.

In addition, the configuration of the outermost layers (see the region shown in A in the figure) of the multilayer printed circuit board may be as those shown in FIGS. 2(b) and 2(c).

That is to say, a configuration where a solder resist layer 1234 and conductor circuits and pads are formed and layered on an optical waveguide 1250 made of a core 1251 and a clad 1252, and solder bumps 1237 are formed therein may be provided, as shown in the embodiment of FIG. 2(b). In this case, a conductor circuit 1225 in the outermost layer formed on insulating layer 1222 and a conductor circuit (pad) 1225b formed on the optical waveguide 1250 are connected through a non-penetrating via hole 1227b.

Here, the non-penetrating via holes 1227b are formed by creating holes in the optical waveguide 1250 through, for example, a laser process, forming a thin film conductor layer on the surface of the optical waveguide including these holes through electroless plating, sputtering and the like, and furthermore, forming a plating resist, carrying out electrolytic plating and removing the plating resist and the thin film conductor layer beneath the plating resist.

In addition, a configuration where a conductor circuit (pad) 2225b is formed on top of a lower clad 2252a and a core 2251 after these are formed, and furthermore, an upper clad 2252b which functions as a solder resist layer is layered on top, which is a configuration where solder bumps 2237 are formed on the upper clad 2252b, may be provided, as shown in the embodiment of FIG. 2(c). In this case also, a conductor circuit 2225 in the outermost layer formed on an insulating layer 2222 and the conductor circuit (pad) 2225b formed on the core 2251 are connected through a non-penetrating via hole 2227b.

In addition, in the embodiment shown in FIG. 2(c), a solder resist may further be formed on the upper clad.

Figure 3:
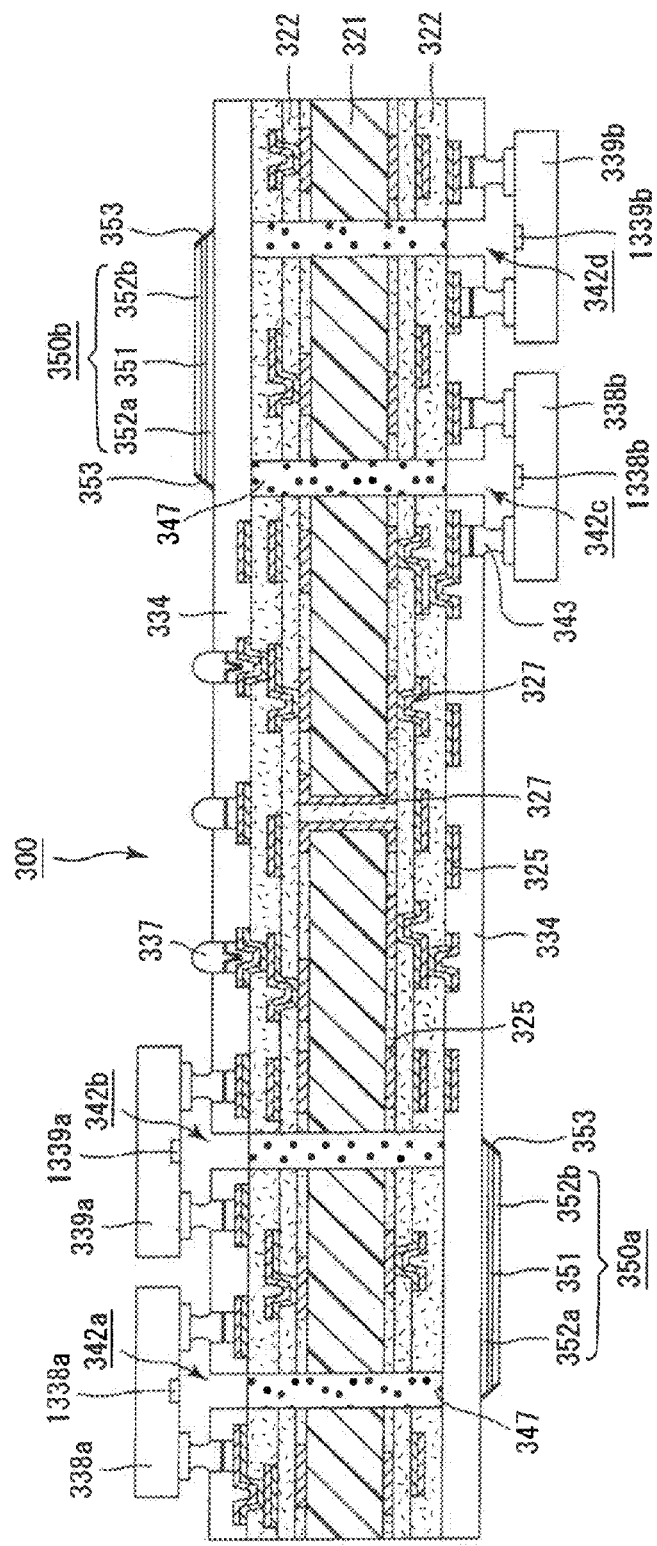
FIG. 3 is a cross-section view schematically showing a multilayer printed circuit board according to another embodiment of the present invention.
Figure 4:
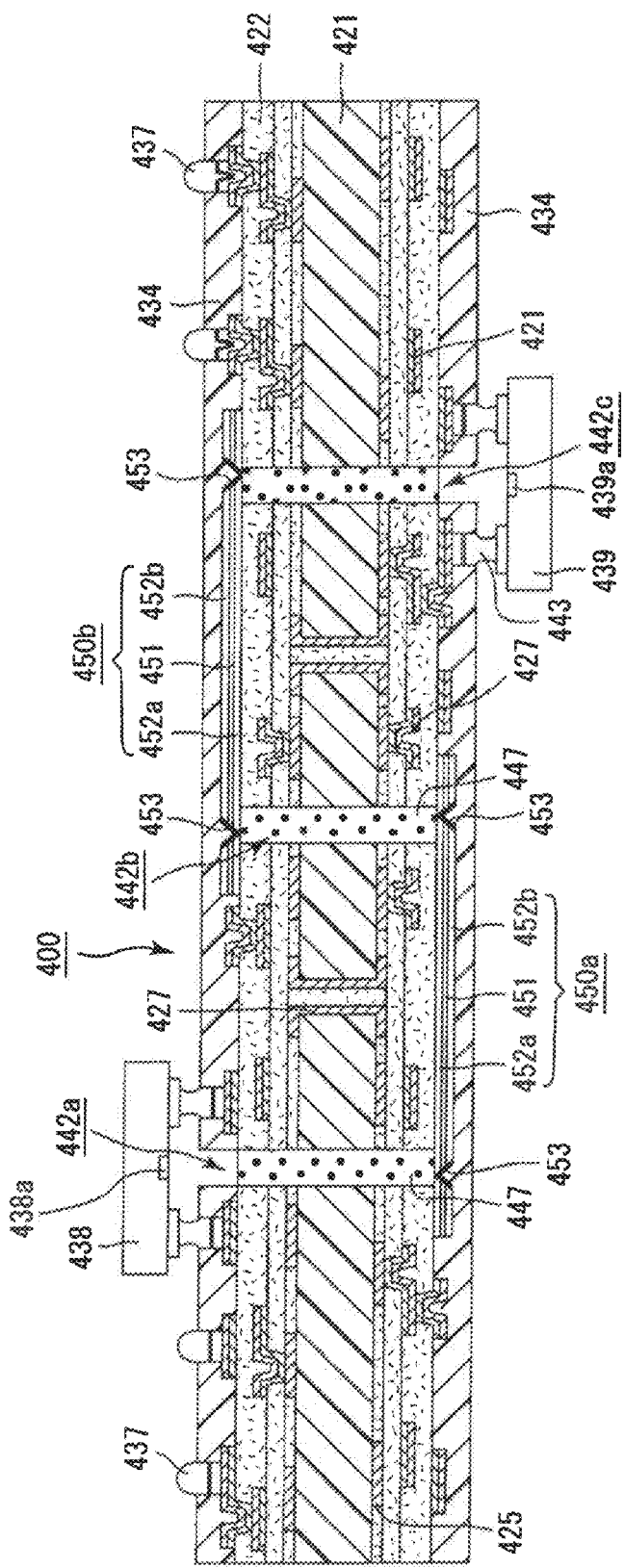
FIG. 4 is a cross-section view schematically showing a multilayer printed circuit board according to another embodiment of the present invention.

In addition, an embodiment of a multilayer printed circuit board according to the present invention may be an embodiment as that shown in FIGS. 3 and 4.

FIGS. 3 and 4 are cross-sectional diagrams schematically showing multilayer printed circuit boards according to other embodiments of the present invention.

FIG. 3 is a cross-sectional diagram schematically showing a multilayer printed circuit board according to one embodiment of the present invention.

As shown in FIG. 3, in a multilayer printed circuit board 300, conductor circuits 325 and insulating layers 322 are sequentially formed and layered on the two surfaces of a substrate (insulating layer) 321, and conductor circuits sandwiching the substrate (insulating layer) 321 and conductor circuits sandwiching an insulating layer 322 are electrically connected to each other through non-penetrating via holes 327.

In addition, solder resist layers 334 which are transparent to transmitting light are formed on the outermost insulating layers 322 on the two sides, and optical waveguides 350a and 350b are formed in portions of these solder resist layers 334 by pasting and securing an optical waveguide film to a transparent UV setting epoxy resin, where each of these optical waveguides 350a and 350b are formed of a core 351, a lower clad 352a and an upper clad 352b. In addition, optical path conversion mirrors 353 are formed on both ends of the respective optical waveguides 350a and 350b so that the angle formed with the surface which makes contact with the optical waveguide of an insulating layer is about 45°, and a metal vapor deposition layer is formed on these optical path conversion mirrors 353.

In this manner, in the multilayer printed circuit board 300, optical waveguides 350a and 350b are formed in different layers, that is to say, on the respective solder resist layers 334 on both sides sandwiching a substrate 321.

Here, in the present specification, the solder resist layers being transparent means that the transmittance of optical signals is about 60%/30 mm.

Furthermore, in the multilayer printed circuit board 300, optical signal transmitting regions 342a to 342d are formed so as to penetrate through a substrate 321, insulating layers 322 and solder resist layers 334 so that one end of each of these optical signal transmitting regions 342a to 342d is optically connected to an end portion of optical waveguides 350a and 350b. Specifically, as shown in the figure, the optical waveguide 350a is formed so that optical path conversion mirrors 353 on both ends are respectively provided directly beneath the lower end of the optical signal transmitting regions 342a and 342b, and the optical waveguide 350b is formed so that each of the optical path conversion mirrors 353 on both ends are provided directly above the upper end of optical signal transmitting regions 342c and 342d.

In addition, these optical signal transmitting regions 342a to 342d are partially filled in with a resin composite 347.

In addition, light receiving elements 338a and 338b and light emitting elements 339a and 339b, are mounted on the outermost layers of the multilayer printed circuit board 300 via solder connection portions 343, and these are mounted so that light receiving portions 1338a and 1338b and light emitting portions 1339a and 1339b are in such locations as to enable transmission of optical signals between each of optical signal transmitting regions 342a to 342d.

Furthermore, solder bumps 337 are formed on a solder resist layer 334 on one side via solder pads. Accordingly, a variety of electronic parts such as a CPU can be mounted on the multilayer printed circuit board 300 via these solder bumps 337. Furthermore, connection to a substrate for mounting an IC chip, other external substrates and the like is possible via these solder bumps.

Here, though solder bumps are formed in the solder resist layer on only one side of the multilayer printed circuit board 300, solder bumps may be formed in the solder resist layers on both sides of a multilayer printed circuit board according to the present invention.

In addition, though openings are formed in the portions of solder resist layers 334 which form optical signal transmitting regions 342a to 342d, these portions may be coated with the solder resist layers. This is because the solder resist layers are transparent.

In the multilayer printed circuit board 300 having this configuration, signal transmission within the multilayer printed circuit board 300, that is to say, signal transmission between a light receiving element and a light emitting element can be carried out through via optical signal transmitting regions, optical waveguides and solder resist layers.

Specifically, optical signals emitted from light emitting element 339a (light emitting portion 1339a) can be transmitted to light receiving element 338a (light receiving portion 1338a) via optical signal transmitting region 342b, solder resist layers 334, an optical waveguide 350a and an optical signal transmitting region 342a, and optical signals emitted from light emitting element 339b (light emitting portion 1339b) can be transmitted to a light receiving element 338b (light receiving portion 1338b) via an optical signal transmitting region 342d, solder resist layers 334, an optical waveguide 350b and an optical signal transmitting region 342c.

In addition, in the multilayer printed circuit board 300, optical signals can be transmitted, and at the same time, electrical signals can also be transmitted via conductor circuits and via holes.

Next, the multilayer printed circuit board according to another embodiment, shown in FIG. 4, is described.

In a multilayer printed circuit board 400 shown in FIG. 4, conductor circuits 425 and insulating layers 422 are sequentially formed and layered on the two surfaces of a substrate (insulating layer) 421, and conductor circuits sandwiching substrate 421 and conductor circuits sandwiching an insulating layer 422 are electrically connected to each other through non-penetrating via holes 427.

Optical waveguides 450a and 450b are formed in portions of the outermost insulating layers 422 on both sides, and each of these optical waveguides 450a and 450b are formed of a core 451, a lower clad 452a and an upper clad 452b. In addition, optical path conversion mirrors 453 in V shape with an angle of about 90° are formed in the portions of optical waveguides 450a and 450b which are optically connected to optical signal transmitting regions 442a to 442c. Here, a metal vapor deposition layer is formed on optical path conversion mirrors 453.

In this manner, optical waveguides are formed in different layers of the multilayer printed circuit board 400.

Furthermore, an optical signal transmitting region 442b which penetrates through a substrate 421 and insulating layers 422 and optical signal transmitting regions 442a and 442c which penetrate through the substrate 421, insulating layers 422 and a solder resist layer 434 on one side are formed in the multilayer printed circuit board 400.

From among these optical signal transmitting regions, the two ends of the optical signal transmitting region 442b are optically connected to the optical waveguides 450a and 450b, respectively, one end of optical signal transmitting region 442a is optically connected to the optical waveguide 450a, and one end of the optical signal transmitting region 442c is optically connected to an optical waveguide 450c.

That is to say, the optical waveguide 450a is formed so that optical path conversion mirrors 453 are provided directly beneath the lower end of optical signal transmitting regions 442a and 442b, and the optical waveguide 450b is formed so that optical path conversion mirrors 453 are provided directly above the upper end of optical signal transmitting regions 442b and 442c.

In addition, a portion or the entirety of these optical signal transmitting regions 442a to 442c is filled in with a resin composite 447.

In addition, a light receiving element 438 and a light emitting element 439 are mounted on the outermost layers of the multilayer printed circuit board 400 via solder connection portions 443, and each of these are mounted in such locations that transmission of optical signals between optical signal transmitting regions 442a and 442c is possible.

Furthermore, solder resist layers 434 are formed in the two outermost layers of the multilayer printed circuit board 400, and solder bumps 437 are formed in a solder resist layer 434 on one side via solder pads. Accordingly, a variety of electronic parts such as a CPU can be mounted on the multilayer printed circuit board 400 via these solder bumps 437. Furthermore, connection to a substrate for mounting an IC chip, other external substrates and the like is possible via these solder bumps.

In the multilayer printed circuit board 400 having this configuration, signal transmission within the multilayer printed circuit board 400, that is to say, signal transmission between a light receiving element and a light emitting element can be carried out through optical signals via optical signal transmitting regions and optical waveguides. Specifically, optical signals emitted from a light emitting element 439 can be transmitted to a light receiving element 438 via an optical signal transmitting region 442c, an optical waveguide 450b, an optical signal transmitting region 442b, an optical waveguide 450a and an optical signal transmitting region 442a.

In addition, in the multilayer printed circuit board 400, optical signals are transmitted, and at the same time, electrical signals can also be transmitted via conductor circuits and via holes.

In addition, as shown in FIGS. 1 to 4, solder resist layers may be formed in the multilayer printed circuit boards according to the present invention. Here, these solder resist layers do not include insulating layers in the present specification.

Though the embodiments shown in FIGS. 1 to 4 are embodiments of the above described (1), that is to say, embodiments where optical circuits are formed in the two outermost layers on the insulating layers, as described above, the multilayer printed circuit boards according to the present invention are not limited to these embodiments, and may have embodiments as those shown in FIGS. 5 to 8.

Figure 5:
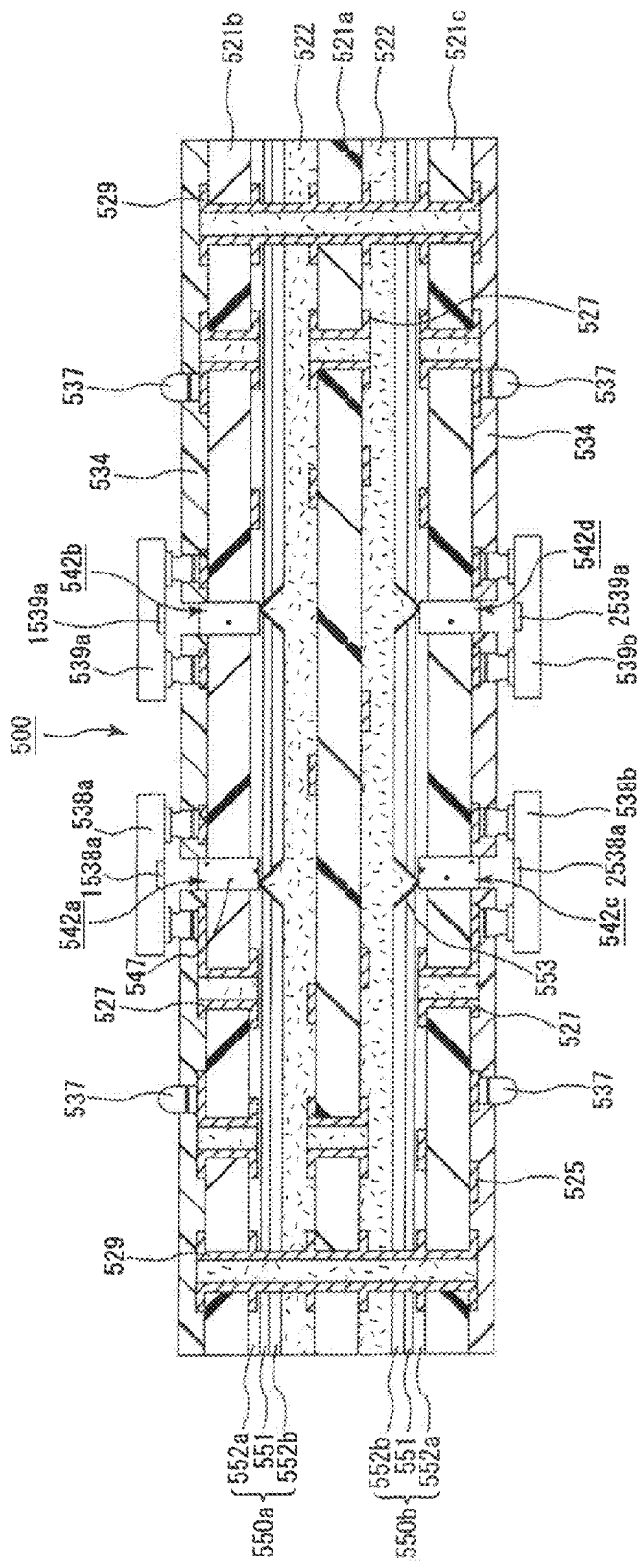
FIG. 5 is a cross-section view schematically showing a multilayer printed circuit board according to another embodiment of the present invention.

FIG. 5 is a cross-sectional diagram schematically showing another example of a multilayer printed circuit board according to the present invention.

As shown in FIG. 5, in a multilayer printed circuit board 500, a substrate (insulating layer) 521a where conductor circuits 525 are formed on the two surfaces, a substrate (insulating layer) 521b where conductor circuits 525 is formed on the two surfaces, and in addition, an optical waveguide 550a are formed on one surface, and a substrate (insulating layer) 521c where conductor circuits 525 are formed on the two surfaces, and in addition, an optical waveguide 550b is formed on one surface, are provided in such a manner that with the substrate 521a placed at the center, substrates 521b and 521c are formed and layered so as to sandwich this substrate 521a via insulating layers 522 made of an adhesive insulating material. Here, each of the substrates 521b and 521c are layered so that the optical waveguide faces the substrate 521a side.

In addition, optical waveguides 550a and 550b are both formed of a lower clad 552a, a core 551 and an upper clad 552b.

In addition, in the multilayer printed circuit board 500, conductor circuits sandwiching each of the substrates 521a to 521c are connected via non-penetrating via holes 527, and conductor circuits sandwiching all the substrates and insulating layers 522, that is to say, conductor circuits respectively formed in the outer layers of substrates 521b and 521c (on the side opposite to the side where the optical waveguides are formed) are connected via penetrating via holes 529.

In addition, optical signal transmitting regions 542a to 542d are formed in each of substrates 521b and 521c, and one end of each of optical signal transmitting regions 542a to 542d is optically connected to either an optical waveguide 550a or 550b. Accordingly, optical path conversion mirrors 553 are formed in optical waveguides 550a and 550b in locations corresponding to each of the optical signal transmitting regions 542a to 542d. In addition, a metal vapor deposition layer is formed on optical path conversion mirrors 553.

In addition, solder resist layers 534 are formed on the outer layers of the substrates 521b and 521c, and furthermore, light receiving elements 538a and 538b and light emitting elements 539a and 539b are mounted on the outside. In addition, solder bumps 537 are formed in solder resist layers 534, so that a variety of electronic parts can be mounted via these solder bumps.

In the multilayer printed circuit board 500 having this configuration, optical signals from a light emitting element 539a (light emitting portion 1539a) is transmitted to a light receiving element 538a (light receiving portion 1538a) via an optical signal transmitting region 542b, an optical waveguide 550a and an optical signal transmitting region 542a, and an optical signals from a light emitting element 539b (light emitting portion 2539a) is transmitted to a light receiving element 538b (light receiving portion 2538a) via an optical signal transmitting region 542d, an optical waveguide 550b and an optical signal transmitting region 542c.

Figure 6:
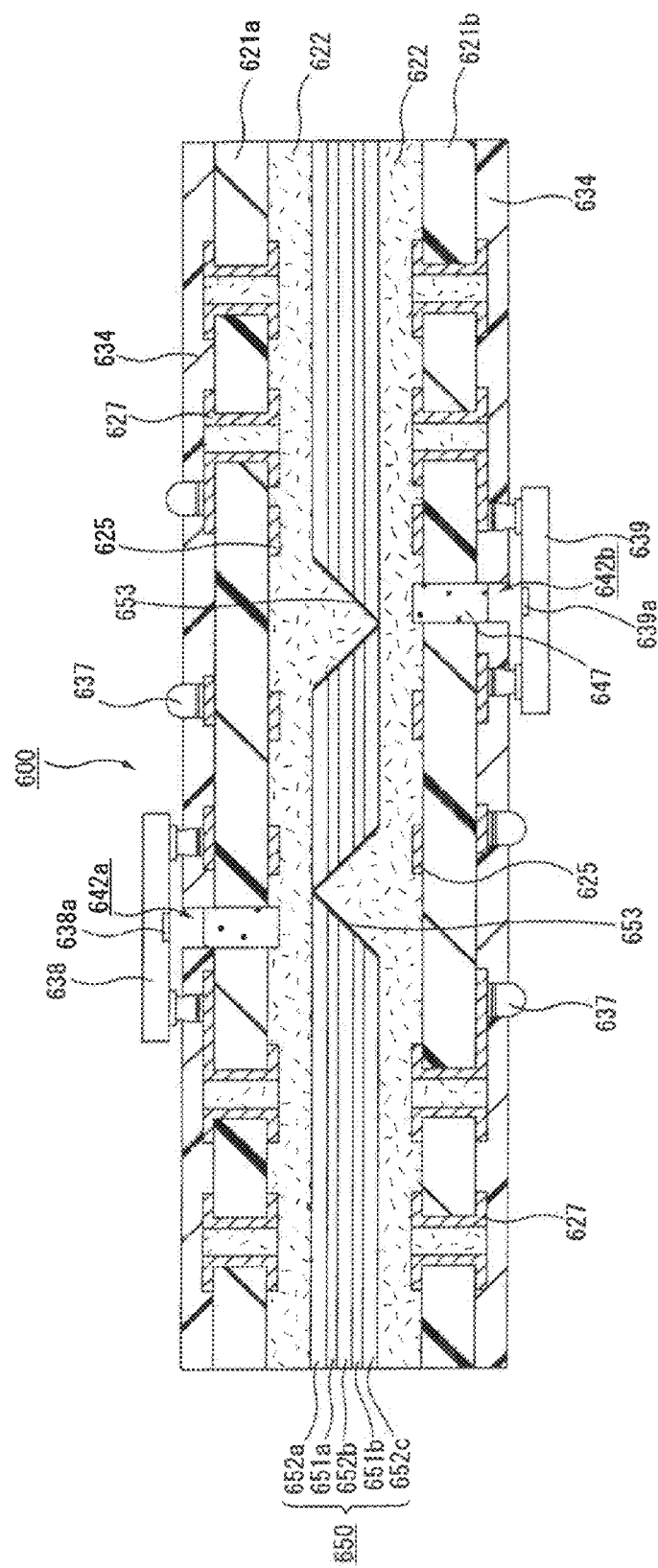
FIG. 6 is a cross-section view schematically showing a multilayer printed circuit board according to another embodiment of the present invention.

In addition, the multilayer printed circuit boards according to the present invention may have an embodiment as that shown in FIG. 6.

FIG. 6 is a cross-sectional diagram schematically showing another example of a multilayer printed circuit board according to the present invention.

As shown in FIG. 6, in a multilayer printed circuit board 600, substrates (insulating layers) 621a and 621b where conductor circuits 625 are formed on the two surfaces and an optical waveguide film 650 where cores 651a and 651b and clads 652a, 652b and 652c are alternately layered are provided in such a manner that the substrates 621a and 621b are formed and layered via insulating layers 622 made of an adhesive insulating material so as to sandwich the optical waveguide film 650.

In addition, in the multilayer printed circuit board 600, conductor circuits sandwiching each of substrates 621a and 621b are connected through non-penetrating via holes 627.

In addition, optical signal transmitting regions 642a and 642b are formed in the substrates 621a and 621b in such a manner that one end of each of the optical signal transmitting regions 642a and 642b is optically connected to an optical waveguide film 650 via insulating layers 622. Accordingly, the insulating layers 622 are formed of an adhesive insulating material which is transparent to transmitting light. In addition, optical path conversion mirrors 653a and 653b are formed on the optical waveguide film 650 in locations corresponding to the optical signal transmitting regions 642a and 642b, respectively. In addition, a metal vapor deposition layer is formed on the optical path conversion mirrors.

In addition, solder resist layers 634 are respectively formed on the outer layers of substrates 621a and 621b, and furthermore, each of a light receiving element 638 and a light emitting element 639 are mounted on the outside. In addition, solder bumps 637 are formed in solder resist layers 634, so that a variety of electronic parts can be mounted, via these solder bumps.

Furthermore, though not shown, conductor circuits sandwiching substrates 621a and 621b, optical waveguide film 650 and insulating layers 622, that is to say, the conductor circuits formed on the outer layer side of the substrates 621a and 621b, are connected through penetrating via holes (not shown).

In the multilayer printed circuit board 600 having this configuration, optical signals from a light emitting element 639 (light emitting portion 639a) is transmitted to the outside of the multilayer printed circuit board 600 via optical signal transmitting regions 642b, insulating layers 622 and optical waveguide films 650, and in addition, optical signals transmitted from outside the multilayer printed circuit board 600 are transmitted to a light receiving element 638 (light receiving portion 638a) via the optical waveguide films 650, the insulating layers 622 and an optical signal transmitting region 642a.

Figure 7:
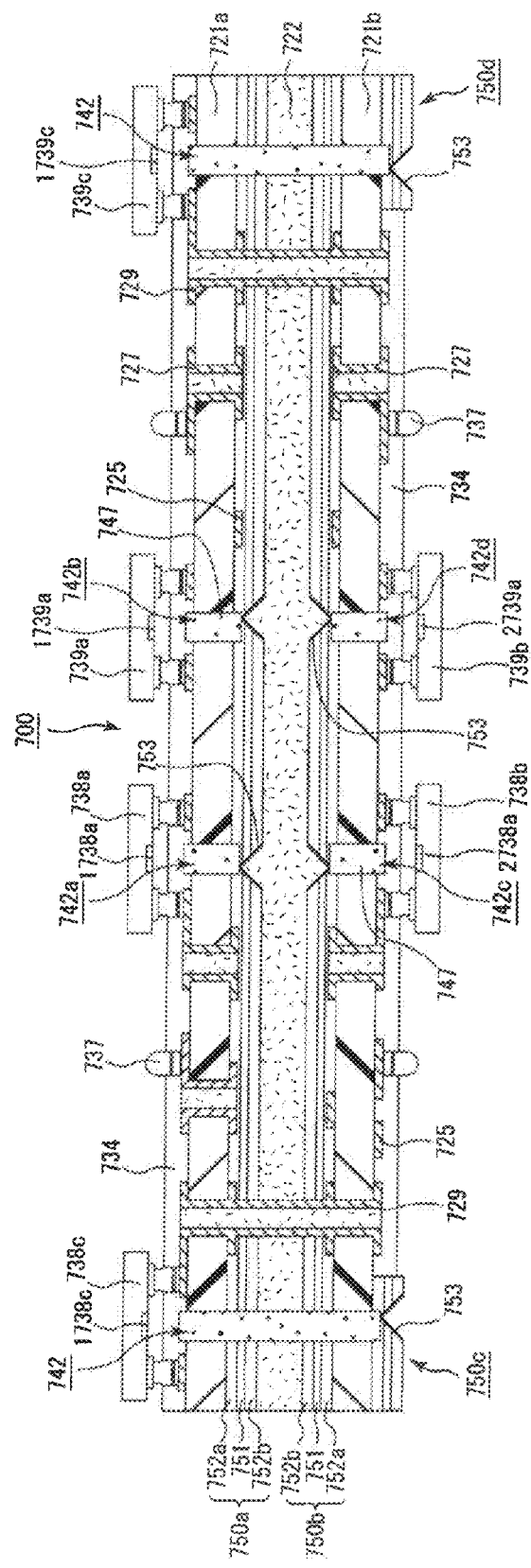
FIG. 7 is a cross-section view schematically showing a multilayer printed circuit board according to another embodiment of the present invention.

In addition, multilayer printed circuit boards according to the present invention may have an embodiment as that shown in FIG. 7.

FIG. 7 is a cross-sectional diagram schematically showing another example of a multilayer printed circuit board according to the present invention.

As shown in FIG. 7, in a multilayer printed circuit board 700, a substrate (insulating layer) 721a where conductor circuits 725 are formed on the two surfaces and an optical waveguide 750a is formed on one surface, and a substrate (insulating layer) 721b where the conductor circuits 725 are formed on the two surfaces and an optical waveguide 750b is formed on one surface are pasted together via an insulating layer 722 made of an adhesive insulating material, so that optical waveguides 750a and 750b respectively formed on the two substrates face each other.

In addition, optical waveguides 750a and 750b are both formed of a lower clad 752a, a core 751 and an upper clad 752b.

In addition, in the multilayer printed circuit board 700, conductor circuits sandwiching each of substrates 721a and 721b are connected via non-penetrating via holes 727, and conductor circuits sandwiching all of the substrates and an insulating layer 722, that is to say, conductor circuits formed on the outer layers of the substrates 721a and 721b (on the side opposite to the side where the optical waveguides are formed), are connected via penetrating via holes 729.

In addition, optical signal transmitting regions 742a to 742d are formed in each of the substrates 721a and 721b, and one end of each of optical signal transmitting regions 742a to 742d is optically connected to either an optical waveguide 750a or 750b. Accordingly, optical path conversion mirrors 753 are formed in the respective optical waveguides 750a and 750b in locations corresponding to the optical signal transmitting regions 742a to 742d. In addition, a metal vapor deposition layer is formed on optical path conversion mirrors 753.

In addition, solder resist layers 734 which are transparent to transmitting light are formed on the outer layer side of the respective substrates 721a and 721b, and furthermore, light receiving elements 738a, 738b and 738c and light emitting elements 739a, 739b and 739c are mounted via solder connection portions. In addition, solder bumps 737 are formed in solder resist layers 734, and a variety of electronic parts can be mounted via these solder bumps.

In the multilayer printed circuit board 700 having this configuration, optical signals from a light emitting element 739a (light emitting portion 1739a) are transmitted to a light receiving element 738a (light receiving portion 1738a) via a solder resist layer 734, an optical signal transmitting region 742b, an optical waveguide 750a, an optical signal transmitting region 742a and a solder resist layer 734, and optical signals from a light emitting element 739b (light emitting portion 2739a) are transmitted to a light receiving element 738b (light receiving portion 2738a) via a solder resist layer 734, an optical signal transmitting region 742d, an optical waveguide 750b, an optical signal transmitting region 742c and a solder resist layer 734.

In addition, optical signals from a light emitting element 739c are transmitted to the outside of the substrate via an optical waveguide 750d, and optical signals from outside the substrate are transmitted to a light receiving element 738c via an optical waveguide 750c.

Figure 8:
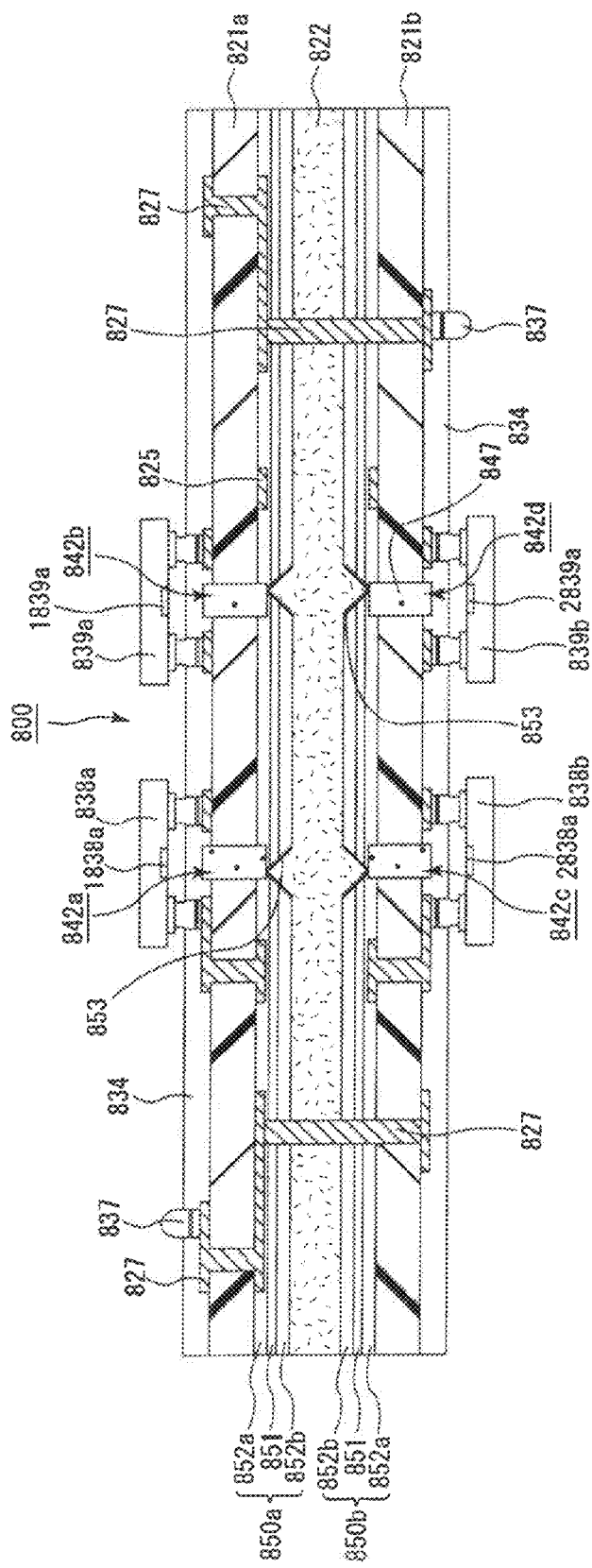
FIG. 8 is a cross-section view schematically showing a multilayer printed circuit board according to another embodiment of the present invention.

In addition, the multilayer printed circuit boards according to the present invention may have an embodiment as that shown in FIG. 8.

FIG. 8 is a cross-sectional diagram schematically showing another example of a multilayer printed circuit board according to the present invention.

A multilayer printed circuit board 800 shown in FIG. 8 has approximately the same structure as that of the multilayer printed circuit board 700 shown in FIG. 7, but the manner in which conductor circuits formed on the outer layers of substrates (insulating layers) 821a and 821b are connected is different. Accordingly, only this point is described for the multilayer printed circuit board 800, and description of other portions is omitted.

That is to say, conductor circuits in the outermost layers of the multilayer printed circuit board 700 are connected via penetrating via holes 729, but no penetrating via holes are formed in the multilayer printed circuit board 800, where conductor circuits in the outermost layers are electrically connected through a plurality of non-penetrating via holes 827 which serve as connections for conductor circuits in the outermost layers.

Figure 9:
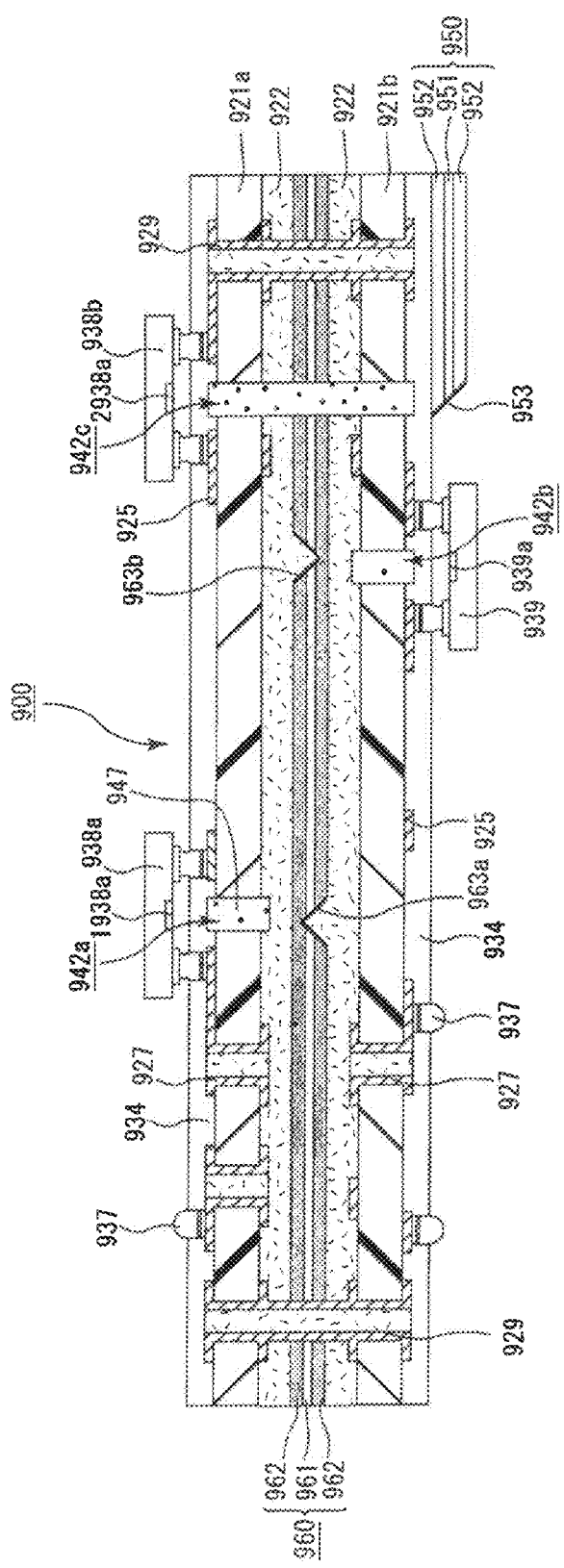
FIG. 9 is a cross-section view schematically showing a multilayer printed circuit board according to another embodiment of the present invention.
Figure 10:
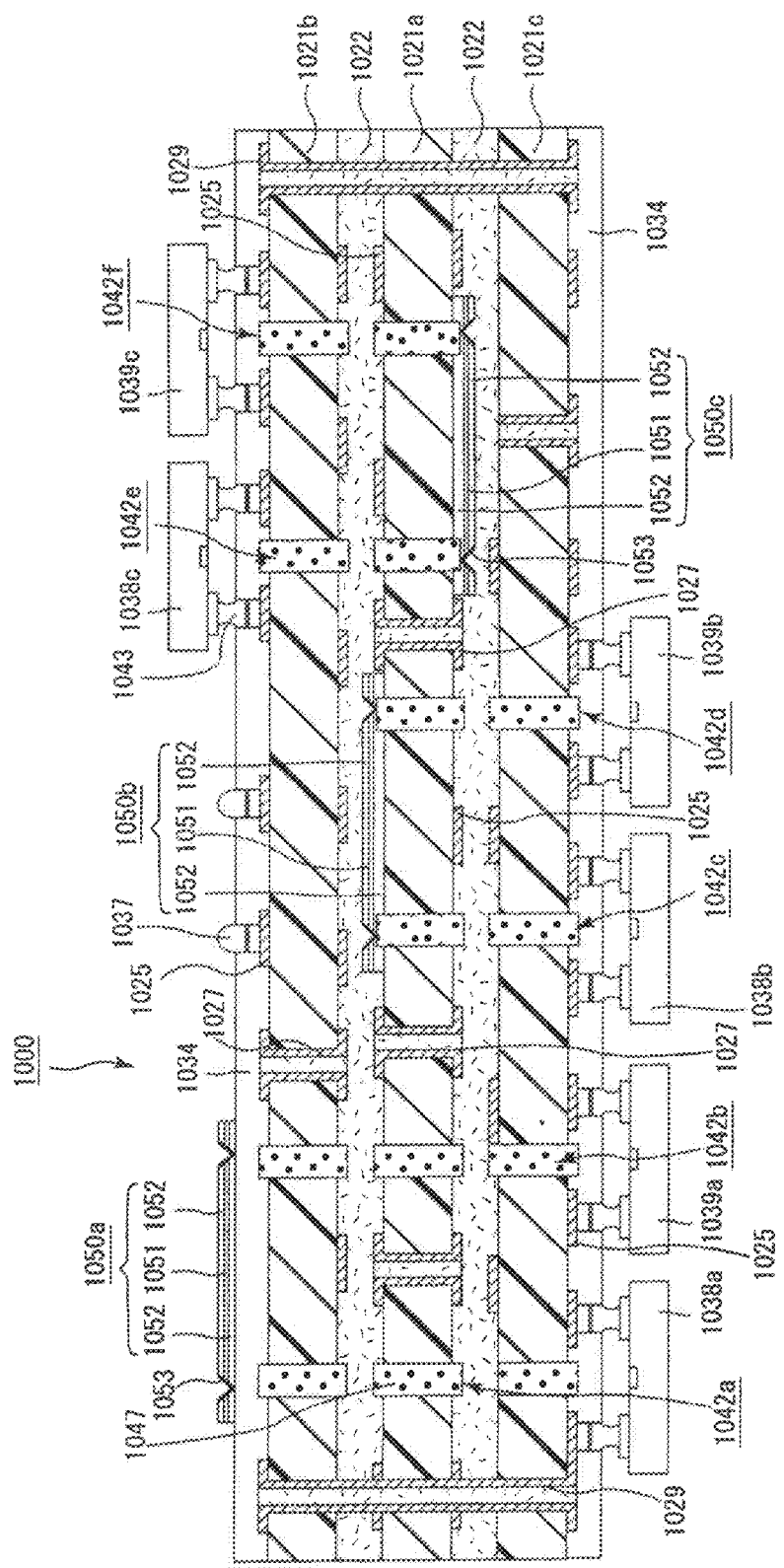
FIG. 10 is a cross-section view schematically showing a multilayer printed circuit board according to another embodiment of the present invention.

The embodiments shown in FIGS. 5 to 8 are the embodiments of the above described (4), that is to say, embodiments where optical circuits are formed in different insulating layers which are inner insulating layers, but the multilayer printed circuit boards according to the present invention are not limited to these embodiments, and embodiments as those shown in FIGS. 9 and 10 may be provided.

FIG. 9 is a cross-sectional diagram schematically showing a multilayer printed circuit board according to another embodiment of the present invention.

As shown in FIG. 9, in a multilayer printed circuit board 900, substrates (insulating layers) 921a and 921b where conductor circuits 925 are formed on the two surfaces and an optical fiber sheet 960 where the surrounding of an optical fiber 961 is coated with a cover resin layer 962 are provided in such a manner that the substrates 921a and 921b are formed and layered via insulating layers 922 made of an adhesive insulating material so as to sandwich an optical fiber sheet 960.

In addition, in the multilayer printed circuit board 900, conductor circuits sandwiching each of substrates 921a and 921b are connected through non-penetrating via holes 927, and conductor circuits sandwiching all of the substrates, an optical fiber sheet 960 and insulating layers 922, that is to say, conductor circuits formed on the outer layers of the respective substrates 921a and 921b (on the side opposite to the side where the optical fiber sheet is formed), are connected through penetrating via holes 929.

In addition, optical signal transmitting regions 942a and 942b are formed in substrates 921a and 921b, respectively, and one end of each of optical signal transmitting regions 942a and 942b is optically connected to the optical fiber sheet 960 via insulating layers 922. Accordingly, the insulating layers 922 are formed of an adhesive insulating material which is transparent to transmitting light. In addition, optical path converting mirrors 963a and 963b are formed in the optical fiber sheet 960 in locations corresponding to each of the optical signal transmitting regions 942*a* and 942*b*. In addition, a metal vapor deposition layer is formed on the optical path conversion mirrors.

In addition, solder resist layers 934 which are transparent to transmitting light are formed on the outer layers of the respective substrates 921*a* and 921*b*, and furthermore, each of a light receiving element 938*a* and a light emitting element 939 are mounted on the outside.

Furthermore, an optical waveguide 950 which is formed of a core 951 and a clad 952 on solder resist layer 934 and where an optical path conversion mirror 953 is formed is formed in the outermost layer on the substrate 921*b* side, and an optical signal transmitting region 942*c* which is optically connected to this optical waveguide 950 is formed so as to penetrate through substrates 921*a* and 921*b*, an optical fiber sheet 960 and insulating layers 922. In addition, a light receiving element 938*b* is mounted in the outermost layer on the side opposite to the side where the optical waveguide 950 is formed.

In addition, solder bumps 937 are formed in solder resist layers 934 and a variety of electronic parts can be mounted via these solder bumps.

In the multilayer printed circuit board 900 having this configuration, optical signals from a light emitting element 939 (light emitting portion 939*a*) are transmitted to a light receiving element 938*a* (light receiving portion 1938*a*) via a solder resist layer 934, an optical signal transmitting region 942*b*, an insulating layer 922, an optical fiber sheet 960, an insulating layer 922, an optical signal transmitting region 942*a* and a solder resist layer 934.

In addition, optical signals transmitted from outside the multilayer printed circuit board 900 are transmitted to a light receiving element 938*b* (light receiving portion 2938*a*) via an optical waveguide 950, a solder resist layer 934, an optical signal transmitting region 942*c* and a solder resist layer 934.

FIG. 10 is a cross-sectional diagram schematically showing a multilayer printed circuit board according to another embodiment of the present invention.

As shown in FIG. 10, in a multilayer printed circuit board 1000, a substrate (insulating layer) 1021*a* where conductor circuits 1025 and optical waveguides 1050*b* and 1050*c* are formed on the two surfaces, and substrates (insulating layers) 1021*b* and 1021*c* where conductor circuits 1025 are formed on the two surfaces, are provided in such a manner that with the substrate 1021*a* located at the center, substrates 1021*b* and 1021*c* are formed and layered via insulating layers 1022 made of an adhesive insulating material so as to sandwich this substrate 1021*a*.

In addition, the optical waveguides 1050*b* and 1050*c* are both formed of a clad 1052 and a core 1051.

In addition, an optical waveguide 1050*a* is formed on solder resist layer 1034 formed on the outer layer of substrate 1021*b*.

In addition, in the multilayer printed circuit board 1000, conductor circuits sandwiching each of substrates 1021*a* to 1021*c* are connected via non-penetrating via holes 1027, and conductor circuits sandwiching all of the substrates and insulating layers 1022, that is to say, conductor circuits formed on the outer layers of the respective substrates 1021*b* and 1021*c* (on the side opposite to the side where the optical waveguide is formed) are connected via penetrating via holes 1029.

In addition, optical signal transmitting regions 1042*a* and 1042*b* which penetrate through substrates 1021*a* to 1021*c*, optical signal transmitting regions 1042*c* and 1042*d* which penetrate through substrates 1021*a* and 1021*b*, and optical signal transmitting regions 1042*e* and 1042*f* which penetrate through substrates 1021*a* and 1021*c* are formed so that one end of each of the optical signal transmitting regions 1042*a* to 1042*f* is optically connected to one of optical waveguides 1050*a* to 1050*c*. Accordingly, optical path conversion mirrors 1053 are formed in the respective optical waveguides 1050*a* to 1050*c* in locations corresponding to the optical signal transmitting regions 1042*a* to 1042*f*. In addition, a metal vapor deposition layer is formed on optical path conversion mirrors 1053.

In addition, solder resist layers 1034 which are transparent to transmitting light are formed on the outer layers of respective substrates 1021*b* and 1021*c*, and furthermore, each of light receiving elements 1038*a* to 1038*c* and light emitting elements 1039*a* to 1039*c* are mounted on the outside. In addition, solder bumps 1037 are formed in solder resist layers 1034, so that a variety of electronic parts can be mounted via these solder bumps.

In the multilayer printed circuit board 1000 having this configuration, optical signals from a light emitting element 1039*a* are transmitted to a light receiving element 1038*a* via a solder resist layer 1034, an optical signal transmitting region 1042*b*, a solder resist layer 1034, an optical waveguide 1050*a*, the solder resist layer 1034, an optical signal transmitting region 1042*a* and the solder resist layer 1034, and optical signals from light emitting elements 1039*b* and 1039*c* are also transmitted to light receiving elements 1038*b* and 1038*c*, respectively, via the optical signal transmitting regions, the optical waveguide, the solder resist layers and the like.

The embodiments shown in FIGS. 9 and 10 are the embodiments of the above described (2), that is to say, embodiments where optical circuits are formed on the insulating layer which is the outermost layer on one side and on inner insulating layers.

In addition, in the embodiments shown in FIGS. 9 and 10, optical waveguides may be formed not only in the outermost layer on one side of the substrate but also in the outermost layers on both sides of the substrate, and in this case, the embodiment becomes that of the above described (3), that is to say, an embodiment where optical circuits are formed on the insulating layers in the two outermost layers and on the inner insulating layers.

In addition, in the embodiments shown in FIGS. 1 to 10, optical fiber sheets may be formed as optical circuits instead of optical waveguides, or conversely, optical waveguides may be formed instead of optical fiber sheets.

In addition, though optical elements are mounted directly on the multilayer printed circuit boards shown in FIGS. 1 to 10, package substrates on which an optical element is mounted (see FIG. 38) may be mounted instead of the optical elements.

Next, a method for manufacturing a multiplayer printed circuit board according to the present invention is described.

The methods for manufacturing multilayer printed circuit boards according to the present invention can be roughly divided into two kinds of methods; one is a method using an insulating layer (substrate) which becomes a base as a starting material for forming conductor circuits, insulating layers and optical circuits through layering in sequence on the two surfaces of the insulating layer (hereinafter, referred to as the first manufacturing method), and the other is a method for preparing a required number of insulating layers (substrates) which become bases where conductor circuits, insulating layers and optical circuits are layered on one surface or the two surfaces, if necessary, and pasting these together under pressure using an adhesive insulating material (hereinafter, referred to as the second manufacturing method).

In addition, when the two methods are compared, the first manufacturing method is appropriate as a method for forming optical circuits in the outermost layer of a multilayer printed circuit board, and the second manufacturing method is appropriate as a method for forming optical circuits in inner layers of a multilayer printed circuit board.

First, the first manufacturing method is described following the order of processes.

(1) An insulating substrate (insulating layer which becomes a base) is used as a starting material, and first, conductor circuits are formed on this insulating substrate.

The above described insulating substrate is not particularly limited, and resin substrates such as glass epoxy substrates, bismaleimide-triazine (BT) resin substrates, copper-clad laminates and RCC substrates, ceramic substrates such as aluminum nitride substrates, silicon substrates and glass substrates, and the like can be cited as examples.

The above described conductor circuits can be formed for example, by carrying out an etching process after the formation of a solid conductor layer on the surface of the above described insulating substrate through an electroless plating process.

In addition, non-penetrating via holes for connecting conductor circuits sandwiching the above described insulating substrate may be formed. In addition, the surface of the conductor circuits may be roughened through an etching process and the like if necessary after the formation of the conductor circuits.

The above described non-penetrating via holes can be formed by drilling holes in the above described insulating substrate and carrying out a plating process on the wall surface of the holes.

(2) Next, an insulating layer having openings for via holes is formed on the substrate on which the conductor circuits are formed.

The above described insulating layer may be formed of a thermosetting resin, a photosensitive resin, a resin where a photosensitive group is attached in a portion of a thermosetting resin, a resin compound which includes any of these and a thermoplastic resin and the like.

Specifically, first, an uncured resin is applied using a roll coater, a curtain coater and the like, or a resin film is made to adhere to the substrate under the application of heat and pressure, whereby a resin layer is formed, and after that, a curing process is carried out if necessary, and openings for via holes are formed through a laser process or a light exposure and developing process, whereby an insulating layer can be formed.

In addition, a resin layer made of a thermoplastic resin as that described above can be formed by making a resin mold in film form adhere to the substrate under application of heat and pressure.

As the above described thermosetting resin, epoxy resins, phenol resins, polyimide resins, polyester resins, bismaleimide resins, polyolefin based resins, polyphenylene ether resins, polyphenylene resins, fluorine resins and the like can be cited as examples.

As the above described photosensitive resin, acrylic resins and the like can be cited as examples.

In addition, the resin prepared by adding a photosensitive group to a part of a thermosetting resin include, for example, resins prepared by allowing a thermosetting group of the above-mentioned thermosetting resin to be acrylated with methacrylic acid or acrylic acid, and the like.

As the above described thermoplastic resin, phenoxy resins, polyether sulfone (PES), polysulfone (PSF), polyphenylene sulfone (PPS), polyphenylene sulfide (PPES), polyphenylene ether (PPE), polyether imide (PI) and the like can be cited as examples.

In addition, as a specific combination for the above described resin compound, phenol resin/polyether sulfone, polyimide resin/polysulfone, epoxy resin/polyether sulfone and epoxy resin/phenoxy resin can be cited as examples. In addition, as a specific combination for the photosensitive resin and the thermoplastic resin, acrylic resin/phenoxy resin, epoxy resin where a portion of an epoxy group is acrylated/polyether sulfone, and the like can be cited as examples.

In addition, it is desirable for the mixture ratio of the thermosetting resin or photosensitive resin and the thermoplastic resin in the above described resin compound to be thermosetting resin or photosensitive resin/thermoplastic resin=about 95/about 5 to about 50/about 50. This is because a high tenacity value can be secured without the heat resistance deteriorating.

In addition, the above described insulating layer may be formed of two or more different resin layers.

In addition, the above described insulating layer may be formed of a resin compound for creating a rough surface.

The above described resin compound for creating a rough surface is, for example, an uncured heat resistant resin matrix which is insoluble in a coarsening liquid made of at least one type selected from acid, alkali and oxidants and where a substance which is soluble in the coarsening liquid made of at least one type selected from acid, alkali and oxidants is dispersed.

Here, as for the above described words "insoluble" and "soluble," substances of which the rate of dissolution is relatively high when immersed in the same coarsening liquid for the same period of time are referred to as "soluble," and substances of which the rate of dissolution is relatively low are referred to as "insoluble," for the purpose of convenience.

As the laser used in the above described laser process, carbon dioxide gas lasers, ultraviolet-ray lasers, excimer lasers and the like can be cited as examples. A desmearing process may be carried out if necessary after the creation of openings for via holes.

In addition, in this process, openings for via holes which penetrate through all of the insulating layers may be formed if necessary.

(3) Next, conductor circuits are formed on the surface of the insulating layer, including the inner wall of the openings for via holes, if necessary.

First, a method for forming conductor circuits in accordance with a semi-additive method is described.

Specifically, a thin film conductor layer is first formed on the surface of the insulating layer through electroless plating or sputtering, and then, a plating resist is formed in a portion of this surface, and after that, an electrolytic plating layer is formed in portions where the plating resist is not formed. Next, the plating resist and the thin film conductor layer beneath the plating resist are removed, and thus, conductor circuits are formed.

As the material for the above described thin film conductor layer, copper, nickel, tin, zinc, cobalt, thallium, lead and the like can be cited as examples. Materials made of copper or copper and nickel are desirable in that they have excellent electrical properties and are economical.

In addition, it is desirable for the thickness of the above described thin film conductor layer to be at least about 0.1 μm and at most about 2.0 μm.

In addition, the surface of the insulating layer may be coarsened before the formation of the above described thin film conductor layer.

The above described plating resist can be formed by carrying out in a light exposure and developing process after pasting a photosensitive dry film, for example.

In addition, it is desirable for the thickness of the above described electrolytic plating layer to be at least about 5 μm and at most about 20 μm. Copper plating is desirable as the electrolytic plating for the formation of the above described electrolytic plating layer.

The removing of the plating resist may be carried out by using, for example, an aqueous alkali solution and the like, and the removing of the thin-film conductor layer may be carried out by using a mixed solution of sulfuric acid and hydrogen peroxide, or an etching solution such as sodium persulfate, ammonium persulfate, ferric chloride and cupric chloride.

In addition, the catalyst on the insulating layer may be removed using an acid or an oxidant if necessary after the formation of the above described conductor circuits. This is because deterioration of the electrical properties can be prevented.

In addition, the above described conductor circuits may be formed in accordance with a subtractive method.

In this case, a thin film conductor layer is formed on the surface of the insulating layer through electroless plating or sputtering, and then, a thick-affixing process of the thin film conductor layer is carried out through electrolytic plating if necessary.

After that, an etching resist is formed in portions on the surface of the conductor layer and the conductor layer is removed from portions where the etching resist is not formed, whereby conductor circuits are formed.

Here, electrolytic plating, etching and the like can be carried out using the same methods as those used in the semi-additive method, for example.

(4) Furthermore, in the case where the process of forming conductor circuits of the above described (3) is carried out, the process of the above described (2) is carried out repeatedly, so that insulating layers are formed and layered.

After that, the processes of (3) and (2) may be repeated if necessary, so that conductor circuits and insulating layers are formed and layered.

(5) Next, conductor circuits are formed on the outermost insulating layers and optical signal transmitting regions which penetrate through the insulating layers are formed.

Here, the optical signal transmitting regions may be formed so that an end portion thereof protrudes from the surface of an outermost insulating layer.

In addition, when optical signal transmitting regions are formed in this process, a metal layer may be formed on the wall surface of the optical signal transmitting regions. In the case where a desmearing process is carried out as required on the wall surface of through holes for an optical path without forming a metal layer, and after that, the through holes for an optical path are filled in with a resin composite, there is a risk that voids may be created in the resin composite, while the formation of a metal layer as described above reduces the risk of voids being formed.

In addition, in the case where a metal layer is formed as described above, it is desirable to carry out a coarsening process on the surface thereof, and in this case, it is desirable for the surface roughness Ra to be at least about 0.1 μm and at most about 5 μm. This is because the adhesiveness with the resin composite increases when a coarsening process is carried out.

In addition, a resin layer may be separately formed on the wall surface of the optical signal transmitting regions.

Specifically, conductor circuits and optical signal transmitting regions can be formed by carrying out, for example, the following processes (a) to (d).

(a) First, a thin film conductor layer is formed on the outermost insulating layers in accordance with the same method as that used in the process of the above described (3), and then, if necessary, a thick-affixing process of the thin film conductor layer is carried out through electrolytic plating and the like.

(b) Next, through holes for an optical path are formed so as to penetrate through the substrate, the insulating layers and the conductor layers. The above described through holes for an optical path are formed through, for example, a drilling process, a router process, a laser process and the like.

As the laser used in the above described laser process, the same lasers as those that can be used for the creation of openings for the above described via holes can be cited.

It is desirable in the above described drilling process to use an apparatus with a function for recognizing recognition marks which allows for correction of the location for processing for carrying out a drilling process by reading recognition marks (alignment marks) on the multilayer printed circuit board.

Here, through holes for an optical path corresponding to optical signal transmitting regions having a collective through hole structure or an individual through hole structure are formed in accordance with the design.

In addition, in the case where a through hole for an optical path having a form where a plurality of round pillars are aligned in parallel and portions on the sides of adjacent round pillars are connected are formed, in this process, it is desirable for the number of formed round pillars to be an odd number, and in addition, it is desirable to first form round pillars which are not adjacent to each other and after that form round pillars between the round pillars which are not adjacent to each other so that portions on the sides are connected to adjacent round pillars.

This is because in the case where adjacent round pillars of which portions on the sides are connected are attempted to be formed in sequence, the end of the drill tends to escape toward the already formed round pillar, causing deviation of the end of the drill, and thus, the precision of the drilling process may lower.

In addition, after the creation of through holes for an optical path, a desmearing process may be carried out on the wall surface of the through holes for an optical path if necessary.

The above described desmearing process can be carried out using, for example, a process using a permanganic acid solution, a plasma process, a corona process and the like. Here, resin residue, burrs and the like can be removed from the inside of the through holes for an optical path by carrying out a desmearing process as described above, and thus, transmission loss of optical signals caused by diffuse reflection of light from the wall surface can be prevented from increasing in the completed optical signal transmitting regions.

In addition, after the creation of through holes for an optical path and before filling in the holes with an uncured resin composite in the following process, the surface coarsening process of coarsening the wall surface of the through holes for an optical path may be carried out if necessary. This is because the adhesiveness with the resin composite can be increased by doing so.

Coarsening of the surface as described above can be carried out using, for example, an acid such as sulfuric acid, hydrochloric acid, and nitric acid; an oxidant such as chronic acid, chrome sulfuric acid, permanganate, and the like. In addition, it can be carried out through a plasma process, a corona process, and the like.

(c) Next, the through holes for an optical path are filled in with a resin composite.

The through holes for an optical path is filled in with an uncured resin composite, and after that, a curing process is carried out, whereby optical signal transmitting regions of which end portions protrude from the surface of the outermost insulating layers can be formed.

The method for filling in the holes with an uncured resin composite is not particularly limited, and specifically, a method for printing potting, or the like for example, can be used.

(d) Next, an etching resist is formed on a conductor layer, and after that, the conductor layer on portions where the etching resist is not formed is removed, whereby conductor circuits are formed.

Here, the etching process can be carried out using the same method as that used in the process of the above described (3).

In addition, the following method may be used instead of the above described methods (a) to (d).

That is to say, after the formation of a thin film conductor layer in the process of the above described (a), the processes up to the process of the above described (c) is carried out without a thick-affixing process of the thin film conductor layer, and a plating resist is formed on the thin film conductor layer in the process of the above described (d), and then, an electrolytic plating layer is formed in portions where the plating resist is not formed, and after that, the electrolytic plating layer and the thin film conductor layer beneath this plating resist are removed, whereby, conductor circuits and optical signal transmitting regions may be formed.

In addition, in accordance with another method, after the formation of conductor circuits in the outermost layers by carrying out the processes of the above described (a) and (d) in advance, the processes of the above described (b) and (c), that is to say, the processes of creating through holes for an optical path and then filling in the holes with a resin composite, may be carried out, for example, whereby the optical signal transmitting regions may be formed.

(6) Next, optical circuits such as an optical waveguide, an optical waveguide film, and an optical fiber sheet are formed in predetermined locations (these may be a portion or the entirety on the insulating layers) in accordance with the design of the insulating layers.

Here, the above described optical circuits may be formed on a solder resist layer which may be formed in the process described below if necessary.

In the case where optical waveguides are formed as the above described optical circuits, and in the case where the above described optical waveguides are formed using an inorganic material such as silica glass, as the raw material, formation can be achieved by attaching optical waveguides which have been formed in a predetermined form in advance via an optical adhesive.

In addition, optical waveguides can be formed of an inorganic material as that described above by forming a film from an inorganic material such as $LiNbO_3$ or $LiTaO_3$, in accordance with a liquid-phase epitaxial method, a chemical vapor deposition method (CVD), a molecular beam epitaxial method.

In addition, as the method for forming optical waveguides from a polymer material, (1) a method for pasting an optical waveguide film which has been formed in advance on a glass substrate, a silicon substrate, a resin substrate and the like in film form to an insulating layer, (2) a method for forming optical waveguides directly on the above described insulating layers and the like by sequentially forming a lower clad, a core and an upper clad through layering on the insulating layers and the like can be cited.

Here, the same method can be used as the method for forming optical waveguides in the case where optical waveguides are formed on a glass substrate and also in the case where optical waveguides are formed on an insulating layer.

Here, in the case where an optical waveguide film is formed, a mold release material, such as a silicone resin, may be applied to the glass substrate and the like. In addition, after formation, the optical waveguide film can be removed using a hydrofluoric acid solution and the like.

Specifically, a method using reactive ion etching, a light exposure and developing method, a molding method, a resist forming method, a method combining any of these and the like can be used.

In accordance with the above described method a reactive ion etching, (i) first, a lower clad is formed on top of a glass substrate or an insulating layer (hereinafter, simply referred to as glass substrate and the like), (ii) next, a resin composite for a core is applied on top of this lower clad, and furthermore, a curing process is carried out if necessary, whereby a resin layer for forming a core is gained. (iii) Next, a resin layer for forming a mask is formed on the above described resin layer for forming a core, and then, a light exposure and developing process is carried out on this resin layer for forming a mask, whereby a mask (etching resist) is formed on the resin layer for forming a core.

(iv) Next, reactive ion etching is carried out on the resin layer for forming a core, whereby the resin layer for forming a core is removed from portions where the mask is not formed, and thus, a core is formed on the lower clad. (v) Finally, an upper clad is formed over the lower clad so as to cover the above described core, and thus, optical waveguides are gained.

In accordance with this method using reactive ion etching, optical waveguides having high reliability in terms of the dimensions can be formed. In addition, this method is excellent in terms of reproducibility.

In addition, in accordance with the light exposure and developing method, (i) first, a lower clad is formed on top of a glass substrate and the like, (ii) next, a resin composite for a core is applied to this lower clad, and a semi-curing process is carried out if necessary, whereby a layer of a resin composite for forming a core is formed.

(iii) Next, a mask where a pattern which corresponds to the portions where the core is formed is drawn is placed on top of the above described layer of a resin composite for forming a core, and after that, a light exposure and developing process is carried out, whereby a core is formed on top of the lower clad. (iv) Finally, an upper clad is formed over the lower clad so as to cover the above described core, and thus, optical waveguides are gained.

The number of processes is small in this light exposure and developing method, which therefore is appropriate for use at the time of mass production of optical waveguides, and in addition, the number of heating processes is small, and therefore, it is difficult for stress to occur in the optical waveguides.

In addition, in accordance with the above described molding method, (i) first, a lower clad is formed on top of a glass substrate and the like, (ii) next, trenches for forming a core are formed in the lower clad through molding. (iii) Furthermore, the above described trenches are filled in with a resin composite for a core through printing, and after that, a curing process is carried out, whereby a core is formed. (iv) Finally, an upper clad is formed over the lower clad so as to cover the above described core, and thus, optical waveguides are gained.

This molding method is appropriate for use at the time of mass production of optical waveguides, and optical waveguides having a high level of reliability in terms of the dimensions can be formed. In addition, this method is excellent also in terms of reproducibility.

In addition, in accordance with the above described resist forming method, (i) first, a lower clad is formed on top of a glass substrate and the like, (ii) furthermore, a resin composite for a resist is applied on top of this lower clad, and after that, a light exposure and developing process is carried out, whereby a resist for forming a core is formed in portions where the core is not formed on top of the above described lower clad.

(iii) Next, a resin composite for a core is applied to portions where the resist is not formed on top of the lower clad, (iv) furthermore, the resin composite for a core is cured, and after that, the above described resist for forming a core is removed, whereby a core is formed on the lower clad. (v) Finally, an upper clad is formed over the lower clad so as to cover the above described core, and thus, optical waveguides are gained.

This resist forming method is appropriate for use at the time of mass production of optical waveguides, and optical waveguides having a high level of reliability in terms of the dimensions can be formed. In addition, this method is excellent also in terms of reproducibility.

In the case where optical waveguides are formed from a polymer material using these methods, and in the case where optical waveguides where particles are mixed into the cores are formed, a molding method is desirable over a light exposure and developing method. The reason for this is as follows.

That is to say, in the case where a core is formed in accordance with a molding method, where a trench for forming a core is formed in a lower clad through molding, and after that, a core is formed within this trench, particles to be mixed into the core are all put in the core, and therefore, the surface of the core is flat, providing excellent transmission for optical signals, while in the case where a core is formed in accordance with a light exposure and developing method, some particles may protrude from the surface of the core after development, or dents may be formed when particles come off from the surface of the core, and thus, the surface of the core sometimes becomes uneven, and light may not be reflected in a desired direction due to this unevenness, and as a result, the transmission of optical signals may lower.

In addition, though different resin composites are prepared as the resin composite for a core and the resin composite for a clad for the formation of optical waveguides in accordance with the methods for forming optical waveguides described in the above, optical waveguides may be formed in accordance with, for example, a photo-bleaching method, where only a resin composite for a clad is prepared and a core is formed by changing the index of refraction of the resin composite for a clad using a single pulse laser, for example a femtosecond laser, or through exposure to light.

In addition, in the case where optical waveguides are formed directly and in the case where optical waveguides are formed on conductor circuits, it is desirable for a lower clad to be formed so as to be thicker than the conductor circuits. This is because undulation and the like can be prevented from being caused in the optical waveguides.

In addition, in the case where a resin composite for a clad is applied using a spin coater at the time of formation of the lower clad, a lower clad having a flat surface can be formed by applying a large amount and adjusting the rotational speed so that a sufficient amount of the resin composite can be supplied into the space between the conductor circuits.

In addition, at the time of formation of the lower clad, a flattening process may be carried out, in such a manner that after the application of the resin composite for a clad, a film is mounted, and pressure is applied using a flat plate.

Here, the resin composite for an optical waveguide (resin composite for a clad, resin composite for a core) can be applied using a roll coater, a bar coater, a curtain coater and the like, in addition to a spin coater.

In addition, in the case where an optical fiber sheet is formed as optical circuits, an optical fiber sheet that has been manufactured in advance may be pasted in a predetermined location via an adhesive material and the like.

In addition, the optical fiber sheet can be formed by wiring a required number of optical fibers on a base film (cover resin layer) made of a polyimide resin and the like using an optical fiber wiring apparatus, and after that, coating the surroundings of the optical fibers with a protective film (cover resin layer) made of a polyimide resin and the like. Here, a commercially available optical fiber sheet can also be used.

In addition, in the case where optical circuits are formed using an optical waveguide film or an optical fiber sheet, it is difficult to adjust the optical axes because they are in sheet form. Therefore, it is desirable to select a rigid material for the insulating layer to which an optical waveguide film or an optical fiber sheet is pasted, as described above, so that the optical waveguide film and the like can be prevented from bending. This is because positioning becomes easy.

In addition, optical path conversion mirrors are formed in the above described optical circuits.

Though the above described optical path conversion mirrors may be formed before the attachment of the optical circuits to the insulating layer, or may be formed after the attachment of the optical circuits to the insulating layer, it is desirable to form optical path conversion mirrors in advance, except in the case where the optical circuits are formed directly on the insulating layer. This is because work can be easily carried out and there is no risk of other members that form the multilayer printed circuit board; for example the substrate, the conductor circuits, the insulating layers and the like, being scratched or damaged at the time or work. Here, the precision is higher when the optical path conversion mirrors are formed after attachment of the optical circuits to the insulating layer.

The method for forming the above described optical path conversion mirrors is not particularly limited, and conventional, well known methods for formation can be used. Specifically, a machine process using a diamond saw having an end in V shape with an angle of about 90°, a cutting instrument or a blade, a process using reactive ion etching, laser ablation and the like can be used. In addition, in the case where optical diverting mirrors are formed at both ends of an optical waveguide film and the like, optical path conversion mirrors may be formed by securing the optical waveguide film and the like to the jig of a polishing machine and then polishing the two ends.

In addition, buried optical path diverting members may be formed instead of optical path conversion mirrors.

In addition, in the case where optical path conversion mirrors are formed in the optical waveguides with an angle of about 90 degrees, the angle formed between the surface on which the lower clad makes contact with the substrate or the insulating layer and the surface for diverting the optical path may be about 45 degrees or about 135 degrees.

(7) Next, solder resist layers are formed in the outermost layers, if necessary.

The above described solder resist layers can be formed by carrying out a curing process after an uncured solder resist composite is applied, or by pasting a film made of the above described solder resist composite by applying pressure, and then carrying out a curing process if necessary.

In addition, in the case where a solder resist layer of which the transmittance is not high is formed as the solder resist layer in this process, openings for an optical path which can work as an optical signal transmitting region are formed at the same time as the formation of the solder resist layer. Here, in the case where a solder resist layer which is transparent to transmitting light is formed, it is not necessary to create openings for an optical path.

The above described openings for an optical path can be formed by carrying out a light exposure and developing process, for example, after application of the above described solder resist composite.

In addition, openings for forming solder bumps (openings for mounting an IC chip or an optical element) may be formed at the same time as the formation of the openings for an optical path. Openings for an optical path and openings for forming a solder bump may, of course, be formed separately.

In addition, at the time of formation of a solder resist layer, a resin film having openings at desired locations is manufactured in advance, and a solder resist layer having openings for an optical path and openings for forming solder bumps may be formed by pasting the resin film.

In addition, the openings for an optical path formed in this process may be filled in with the same resin composite as the resin composite with which the through holes for an optical path are filled in.

(8) Next, micro lenses are provided on end portions of the optical signal transmitting regions if necessary.

Here, the micro lenses may be provided on the solder resist layer in the case where a transparent solder resist layer is formed as the above described solder resist layer.

In addition, in the case where micro lenses are provided, a surface process, such as a process using a water repellant coating material, a water repellant process using $CF_4$ plasma or a hydrophilic process using $O_2$ plasma, may be carried out in advance in portions where micro lenses are provided. Inconsistencies in the form of micro lenses, particularly in the degree of sagging, may easily be caused, depending on the wettability in the portions where the above described micro lenses are provided, but inconsistencies in the degree of sagging can be reduced by carrying out a surface process.

A specific method for the above described surface process is briefly described in the following.

In the case where the above described process using a water repellant coating agent is carried out, first, a mask having openings in portions which correspond to the portions where micro lenses are formed is made, and then, a water repellant coating agent is applied through application using a spray or application using a spin coater, and after that, the water repellant coating agent is naturally dried, and furthermore, the mask is removed, whereby the surface process is completed. Here, the thickness of the water repellent coating agent layer is usually about 1 μm. Here, a plate with a mesh or a mask on which a resist is formed may be used.

Here, in the case where a process using a water repellant coating agent is carried out, the process using a water repellant coating agent may be carried out on the entirety of the solder resist layer without using a mask.

In addition, in the case where a water repellant process using $CF_4$ plasma is carried out as described above, first, a mask having openings in portions on the solder resist layer which correspond to the portions where micro lenses are formed is made, and then, a $CF_4$ plasma process is carried out, and furthermore, the mask is removed, whereby the surface process is completed. Here, a mask where a resist is formed may be used.

In addition, in the case where a hydrophilic process using $O_2$ plasma is carried out as described above, first, a mask having openings in portions on the solder resist layer which correspond to the portions where micro lenses are formed is made, and then, an $O_2$ plasma process is carried out, and furthermore, the mask is removed, whereby the surface process is completed. Here, a metal plate or a mask where a resist is formed may be used.

In addition, it is desirable to carry out a water repellant process (including a process using a water repellant coating agent) and a hydrophilic process as described above in combination.

In addition, the above described micro lenses may be provided directly, or may be provided with an optical adhesive.

Furthermore, they may be provided by using a lens marker. In addition, in the case where they are provided by using a lens marker, a surface process may be carried out in the portions of this lens marker in which micro lenses are provided.

As the method for providing micro lenses directly on the above described solder resist layer, a method for dropping an appropriate amount of uncured resin for an optical lens onto the resin composite and carrying out a curing process on this dropped uncured resin for an optical lens can be cited as an example.

In the above described method, an apparatus such as a dispenser, an inkjet, a micropipette, a microsyringe or the like can be used in order to drop an appropriate amount of uncured resin for an optical lens onto the solder resist layer. In addition, the uncured resin for an optical lens that is dropped onto the solder resist layer using such apparatuses tends to become a sphere due to its surface tension, and therefore, it becomes of a hemispheric form on the above described solder resist layer, and after that, a curing process is carried out on the uncured resin for an optical lens in hemispherical form, whereby micro lenses in hemispherical form can be formed on the solder resist layer.

Here, the diameter and the form of the curved surface of thus formed micro lenses can be controlled by appropriately adjusting the viscosity of the uncured resin for an optical lens and the like taking the wettability between the solder resist layer and the uncured resin for an optical lens into consideration.

(9) Next, solder pads and solder bumps are formed in accordance with the following method, and furthermore, optical elements and the like are mounted, if necessary.

That is to say, portions of the conductor circuits that have been exposed as a result of the creation of openings for the formation of the above described solder bumps are coated with a corrosion-resistant metal, such as nickel, palladium, gold, silver, platinum and the like, so that solder pads are gained.

The above described coating layer can be formed through, for example, plating, vapor deposition, electro-coating or the like, and from among these, formation through plating is desirable in that the coating layer has excellent uniformity.

Here, the solder pads may be formed before the above described micro lens providing process.

Furthermore, the above described solder pads are filled in with a solder paste via a mask where openings are formed in portions corresponding to the above described solder pads, and after that, solder bumps are formed through reflow. In addition, gold bumps may be formed instead of solder bumps.

Furthermore, optical elements (light receiving elements or light emitting elements) and the like are mounted on the solder resist layer. Optical elements and the like can be mounted via, for example, the above described solder bumps. In addition, at the time of formation of the above described solder bumps, optical elements, for example, are attached at the point in time when the solder pads are filled in with a solder paste, and the optical elements may be mounted at the same time as reflow. In addition, the composite of the solder used here is not particularly limited, and any composite, such as Sn/Pb, Sn/Pb/Ag, Sn/Ag/Cu, Sn/Cu, and the like may be used.

In addition, optical elements may be mounted using a conductive adhesive and the like instead of solder.

In addition, in the case where optical elements and the like are mounted, these optical elements and the like may be filled in with an underfill if necessary. Here, as the method for the filling of an underfill, a conventional, well-known method can be used.

Through the processes described above, a multilayer printed circuit board according to the present invention can be manufactured.

Next, the second manufacturing method is described. (1) First, in the same manner as in the process of (1) in the first manufacturing method, an insulating substrate (insulating layer which becomes a base) is used as a starting material, and conductor circuits and a solid conductor layer are formed on this insulating substrate. Here, conductor circuits may be formed on one surface of the insulating substrate and a solid conductor layer may be formed on the other surface.

(2) Next, insulating layers and optical circuits are formed and layered on the insulating substrate on which conductor circuits and solid conductor layers are formed in the above described process of (1).

Here, insulating layers can be formed in accordance with the same method as that used in the process of (2) in the first manufacturing method. In addition, in the case where insulating layers are formed as described above, it is desirable that additional conductor circuits be formed and layered using the same method as in the process of (3) in the first manufacturing method, and at the same time, via holes be formed.

In addition, optical circuits can be formed in accordance with the same method as that used in the process of (6) in the first manufacturing method. In addition, in the case where optical circuits are formed as described above, optical signal transmitting regions may be formed in the insulating substrate if necessary.

Furthermore, insulating layers and optical circuits may both be formed, and in this case, the order of formation is not important. In addition, in this case, optical signal transmitting regions may be formed in accordance with the same method as in the above described process of (5).

Here, in these processes of (1) and (2), a required number of circuit boards where insulating layers and optical circuits are formed and layered on the two surfaces of an insulating substrate are formed.

(3) Two circuit boards that have been formed through the above described processes of (1) and (2), for example, are prepared, and an adhesive insulating material is sandwiched between these circuit boards, and positioning is carried out using a pin lamination method or a mass lamination method, and then, these are pressed against each other, so that the insulating layers and the adhesive insulating material are integrated.

As the above described adhesive insulating material, prepreg, nonwoven cloth prepreg, a material in sheet form, such as an adhesive film, and a resin composite in liquid form can be cited as examples. In addition, as the material for the above described adhesive insulating material, epoxy resins, BT resins and the like can be cited.

In addition, in the case where the above described insulating layer is made of a resin material, it is desirable for the resin which becomes the material for insulating layers and the resin which becomes the material for the adhesive insulating material to be the same.

In addition, in the case where a material in sheet form is used, it may simply be placed between the two circuit boards before pressing, it may be pasted to one circuit board by applying pressure in advance, or it may be pasted to the two circuit boards by applying pressure in advance. Here, in the case where it is pasted to the two circuit boards by applying pressure in advance, two sheets of the material are used.

In addition, in the case where a resin composite in liquid resin form is used, it is applied in advance to one or both of the circuit boards and cured to a state of B stage, and after that, the circuit boards may be pressed against each other, or the circuit boards may be pressed against each other in a state where the resin composite is applied to one or both of the circuit boards.

In addition, particles may be mixed into the above described resin composite in liquid form.

In some cases, the above described adhesive insulating material, for example, prepreg, may form a portion of an optical signal transmitting region, and in this case, it is desirable for the transmittance for a thickness of 30 μm to be about 60% or more.

In the case where the transmittance is about 60%/30 μm, the transmission loss due to the prepreg and the like is about 2.0 dB; in the case of about 80%/30 μm, the transmission loss is about 0.8 dB; and in the case of about 90%/30 μM, the transmission loss is about 0.4 dB; and optical signals can be transmitted with a loss in this range. Here, the transmittance may be selected in accordance with the distance for transmission.

In addition, as the above described adhesive insulating material, a transparent resin having a high transmittance, for example, the same resins as the resins that can be used for the formation of optical waveguides, can be used.

In the case where a resin having such a high transmittance, specifically, a resin having a transmittance of about 70%/1 mm, is used with a thickness of about 30 μm, the transmission loss is as small as about 0.05 dB; and in the case where a resin having a transmittance of about 90%/1 mm is used with a thickness of about 30 μm, the transmission loss is as small as about 0.01 dB.

In addition, in the case where optical signal transmitting regions are formed so as to penetrate through the insulating layers made of the above described adhesive insulating material, it is desirable for the index of refraction of the resin composite with which the through holes for an optical path are filled in and that of the adhesive insulating material to be the same. This is because there is no reflection or refraction in the interface between the two.

The above described pressing can be carried out while heat and pressure are applied after circuit boards are positioned in accordance with a pin lamination method or a mass lamination method, layered, and then sandwiched between hot plates (SUS plates and the like). In addition, the above described pressing may be carried out in a vacuum.

In addition, in the case where pressing is carried out in accordance with the above described method, it is desirable for the outermost layers (surfaces which make contact with the hot plates) to be formed of a solid conductor layer. In the case where conductor circuits are formed in an outermost layer, for example, the pressure applied by the hot plates becomes uneven (pressure applied to regions where conductor circuits are formed becomes great in comparison with regions where conductor circuits are not formed), and as a result, undulation may be caused in the conductor circuits, insulating layers and optical circuits which form each layer. In particular, in the case where undulation is caused in optical circuits, this becomes a cause of increase in the transmission loss, and uneven pressure becomes the cause of positional deviation of optical circuits.

In terms of the conditions for the above described pressing, an example where the pressure is at least about 20 and at most about 50 kg/cm$^2$, the time for pressing at a temperature of about 180° C. or more is about 40 minutes or more, the total time for pressing is about 150 minutes and the like can be cited.

In addition, in the case where circuit boards and an adhesive insulating material are pressed for layering in this process, three or more circuit boards may be prepared, so that the adhesive insulating material is sandwiched between the respective pairs of circuit boards when pressed.

In addition, in this process, optical circuits that have been manufactured in film form in advance are prepared, in addition to the circuit boards and the adhesive insulating material, so that these are layered in the order of, for example, circuit board, adhesive insulating material, optical circuits, adhesive insulating material, circuit board when pressed.

Here, as the member layered in this process, a copper foil with a prepreg attached on one surface and the like can be used.

(4) Next, via holes (penetrating via holes) which penetrate through all of the insulating layers are formed, if necessary.

The above described penetrating via holes can be formed by forming through holes which penetrate through all of the insulating layers through a drilling process, and after that, forming a conductor layer on the wall surface of these through holes through plating and the like, for example.

In addition, in this process, optical signal transmitting regions which penetrate through all of the insulating layers may be formed, and in this case, it is desirable to form optical circuits in the outermost layers.

In addition, conductor circuits sandwiching all of the insulating layers may be connected to each other through a plurality of non-penetrating via holes, as shown in FIG. 8.

These non-penetrating via holes can be formed by creating non-penetrating holes in accordance with a laser process in the two surfaces of the layered insulating layers so that the non-penetrating holes are directed toward one conductor circuit formed in an inner layer (in this case, each non-penetrating hole becomes a bottomed hole which forms on the two surfaces of the above described conductor circuit), and after that, forming a conductor layer through plating and the like on the wall surface of the non-penetrating holes (the entirety of the inside may be filled in).

In addition, in the present process, after the creation of penetrating via holes, the above described process of (2), that is to say, the process of layering an insulating layer or conductor circuits or the process of layering optical circuits, may be repeated one or more times.

(5) Next, formation of a solder resist layer, provision of micro lenses, formation of solder bumps, mounting of optical elements and the like are carried out in accordance with the same methods as in (7) to (9) in the first manufacturing method, if necessary.

Through the processes described above also, a multilayer printed circuit board according to the present invention can be manufactured.

Here, though in the first and second manufacturing methods, focusing on a semi-active method, the processes of forming insulating layers and conductor circuits are described, a full additive method, an RCC method, a via sheet lamination method, a bump sheet lamination method or the like may be used for the formation instead of the semi-additive method.

In addition, though in the first and second manufacturing methods, non-penetrating via holes are described as photo via holes or laser via holes, the form of the above described non-penetrating via holes are not particularly limited to conformal via holes, field via holes, stud via holes and the like.

EXAMPLES

In the following, the present invention is described in further detail.

Example 1

A. Manufacture of Resin Film for Insulating Layer

To 20 parts by weight of ethyldiglycol acetate and 20 parts by weight of solvent naphtha were added 30 parts by weight of bisphenol A-type epoxy resin (epoxy equivalent: 469, EPI-COAT 1001 made by Yuka Shell Epoxy K.K.), 40 parts by weight of cresol novolak-type epoxy resin (epoxy equivalent: 215, EPICRON N-673 made by Dainippon Ink & Chemicals, Inc.) and 30 parts by weight of triazine structure-containing phenol novolak resin (phenolic hydroxide group equivalent: 120, PHENOLITE KA-7052 made by Dainippon Ink & Chemicals, Inc.) so as to be dissolved therein while being stirred under heat, and to this were further added 15 parts by weight of polybutadiene rubber with epoxidized terminals (DENAREX R-45EPT, made by Nagase Kasei Kogyo K.K.), 1.5 parts by weight of 2-phenyl-4,5-bis(hydroxymethyl) imidazole pulverized product, 2 parts by weight of fine pulverized silica and 0.5 parts by weight of silicone-based antifoamer, so that an epoxy resin composition was prepared.

After the resulting epoxy resin composition had been applied onto a PET film of 38 μm in thickness by using a roll coater so as to provide a thickness of 50 μm when dried, the resulting film was dried for 10 minutes at a temperature in the range of 80 to 120° C., so that a resin film for an insulating layer was manufactured.

B. Preparation of Resin Composite for Filling Through Holes 100 parts by weight of a bisphenol F-type epoxy monomer (YL983U, made by Yuka Shell Co., Ltd., molecular weight: 310), 170 parts by weight of SiO$_2$ particles in spherical form having a particle diameter of 0.4 to 0.6 μM (SO-E2, made by Admatec GmbH) and 1.5 parts by weight of a leveling agent (PELENOL S4, made by San Nopco Co., Ltd) were put in a container and stirred and mixed, whereby a resin filler having a viscosity of 45 to 49 Pa·s at 23±1° C. was prepared. Here, 6.5 parts by weight of an imidazole curing agent (2E4MZ-CN, made by Shikoku Corp.) was used as a curing agent.

C. Manufacture of Multilayer Printed Circuit Board (1) A copper-clad laminated board where copper foil 28 having a thickness of 18 μM were laminated on the two surfaces of an insulating substrate (insulating layer) 21 made of a glass epoxy resin or a BT (bismaleimide triazine) resin having a thickness of 0.8 mm was used as a starting material (see FIG. 11(a)). First, holes were drilled in this copper-clad laminated board, on which electroless plating was then carried out and a pattern was etched, whereby conductor circuits 25 and non-penetrating via holes 27 were formed on the two surfaces of the substrate 21.

Figure 11:
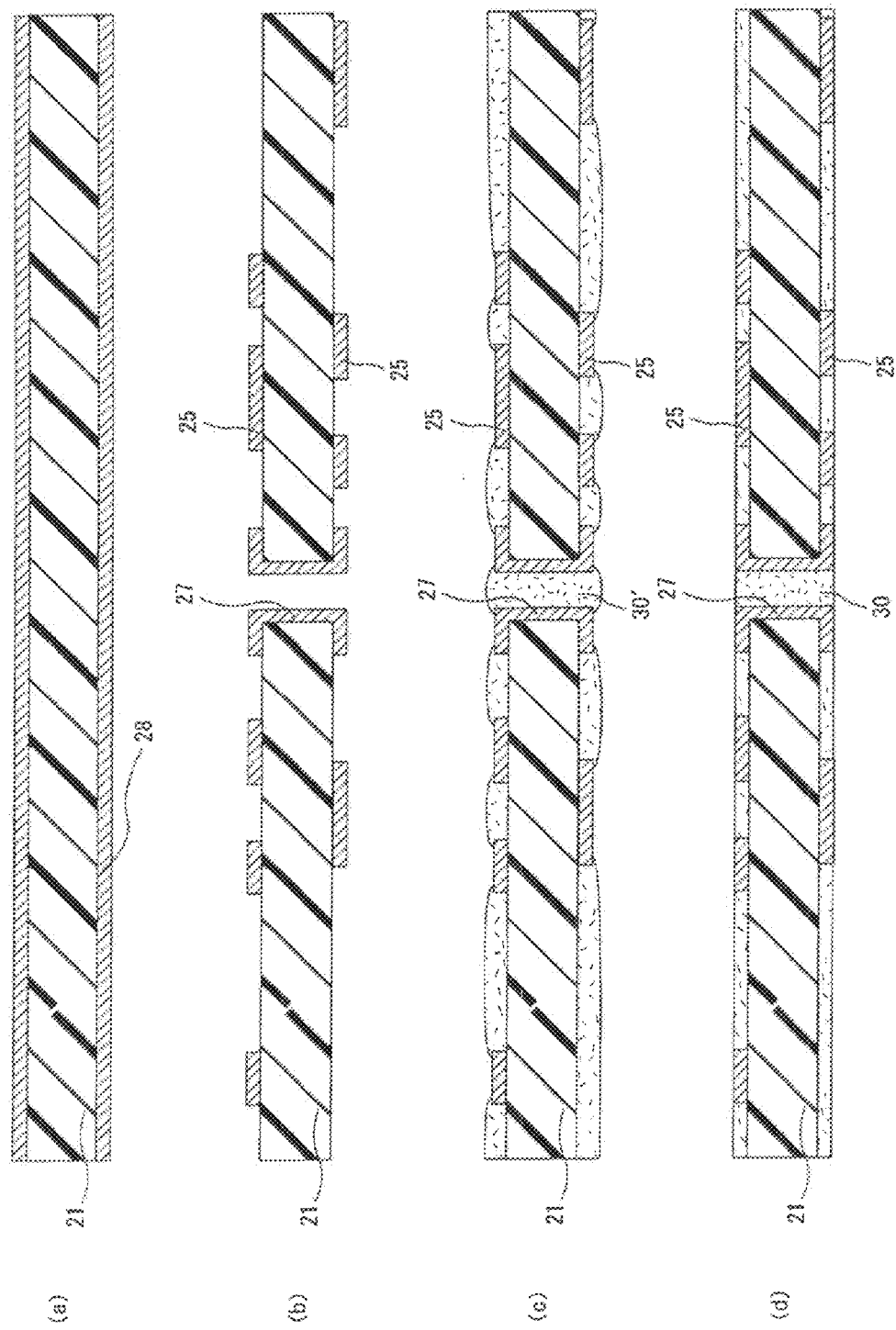
FIGS. 11(a) to 11(d) are cross-section views for schematically illustrating part of a method for manufacturing a multilayer printed circuit board according to the present invention.

(2) The substrate in which non-penetrating via holes 27 and conductor circuits 25 were formed was washed with water, and after drying, a blackening process using an aqueous solution containing NaOH (10 g/l), $NaClO_2$ (40 g/l) and $Na_3PO_4$ (6 g/l) in a blackening bath (oxidizing bath), and a reducing process using a solution containing NaOH (10 g/l) and $NaBH_4$ (6 g/l) as a reduction bath were carried out, and thus, the surface of conductor circuits 25, including non-penetrating via holes 27, was coarsened (not shown) (see FIG. 11(b)).

(3) After the preparation of the resin filler described in the above B, a layer of a resin filler 30' was formed within non-penetrating via holes 27, portions where conductor circuits were not formed on substrate 21 and outer peripheral portions of conductor circuits 25 in accordance with the following method within 24 hours after preparation.

That is to say, first, the resin filler was pressed into the non-penetrating via holes using a squeegee, and after that, dried under conditions of 100° C. and 20 minutes. Next, a mask having openings in portions which correspond to portions where conductor circuits were not formed was mounted on the substrate, and portions where conductor circuits were not formed, which became recesses, were filled in with the resin filler using a squeegee, and dried under conditions of 100° C. and 20 minutes, whereby a layer of resin filler 30' was formed (see FIG. 11(c)).

(4) One surface of the substrate that underwent the above described process of (3) was polished through a belt sander grind using a #600 belt grinding paper (made by Sankyo-Rikagaku Co., Ltd.), so that no resin filler 30' remained on the surface of conductor circuits 25 or the land surface of non-penetrating via holes 27, and next, buffing was carried out in order to remove scratches caused by the above described belt sander grind. This grinding process was carried out in the same manner on the other surface of the substrate.

Next, heat processes were carried out at 100° C. for one hour, 120° C. for three hours, 150° C. for one hour and 180° C. for seven hours, so that a resin filler layer 30 was formed.

In this manner, the surface layer portion of a resin filler layer 30 formed in non-penetrating via holes 27 and in portions where conductor circuits are not formed and the surface of conductor circuits 25 were flattened, and an insulating substrate was gained, where the resin filler layer 30 and the sides of the conductor circuits 25 firmly adhered to each other through the coarsened surface (not shown), and in addition, the surface of the inner walls of non-penetrating via holes 27 and resin filler 30 firmly adhered to each other through the coarsened surface (not shown) (see FIG. 11(d)). In this process, the surface of resin filler layer 30 and the surface of conductor circuits 25 were made of the same plane.

(5) The above described substrate was washed with water acid-degreased, and then soft-etched, and then, an etchant was sprayed against the two surfaces of the substrate, so that the surface of conductor circuits 25 and the land surface of non-penetrating via holes 27 were etched, whereby the entire surface of conductor circuits 25 was coarsened (not shown). As the etchant, an etchant containing 10 parts by weight of an imidazole copper (II) complex, 7 parts by weight of glycolic acid and 5 parts by weight of potassium chloride (MEC etch BOND made by Mec Co., Ltd.) was used.

Figure 12:
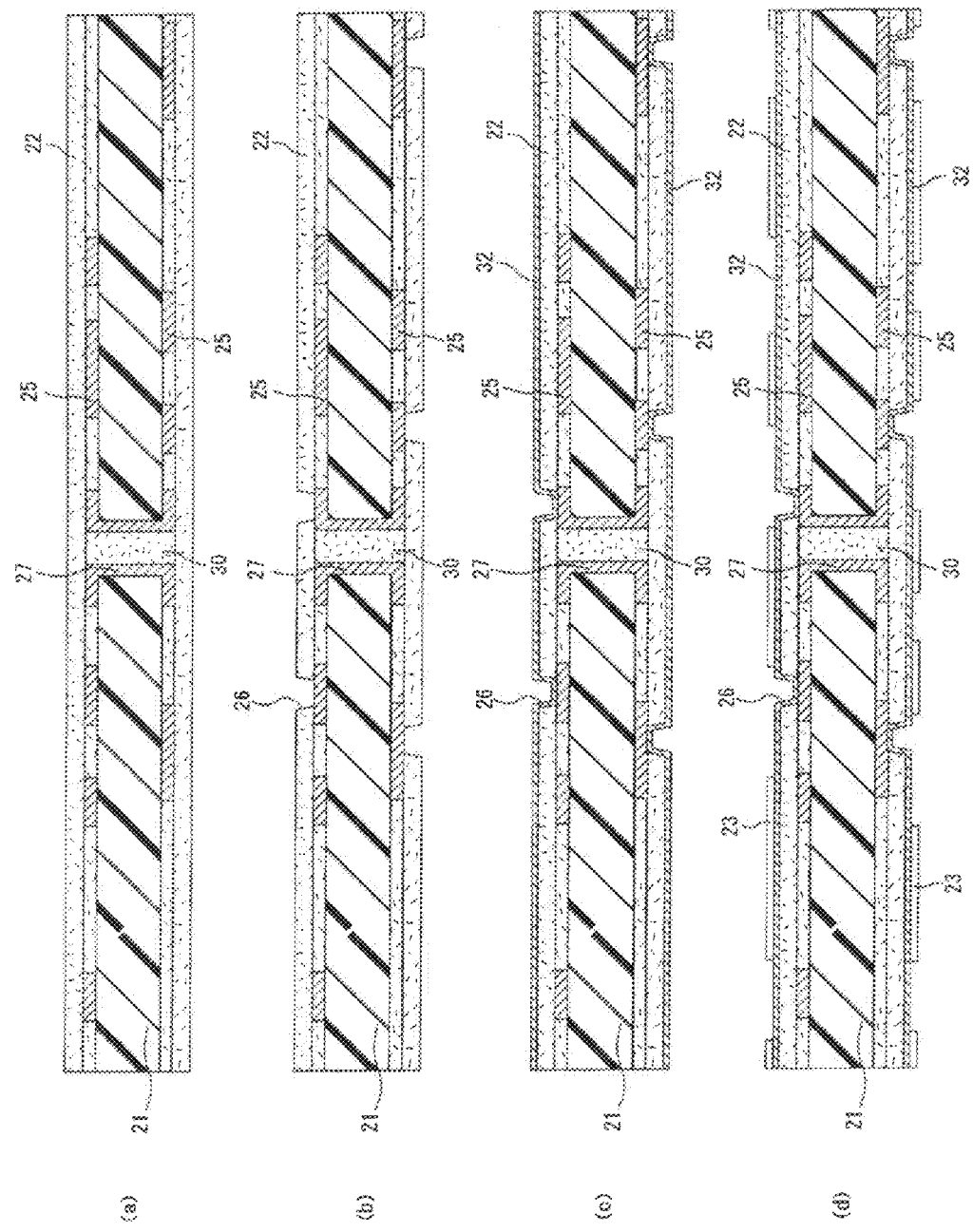
FIGS. 12(a) to 12(d) are cross-section views for schematically illustrating part of a method for manufacturing a multilayer printed circuit board according to the present invention.

(6) Next, a resin film for an insulating layer which was slightly larger than the substrate manufactured in the above A was mounted on the substrate, temporarily press-bonded thereto conditions of a pressure of 0.4 MPa, a temperature of 80° C. and a press-bonding time of 10 seconds, and then cut, and after that, the film was pasted using a vacuum laminator device in accordance with the following method, whereby an insulating layer 22 was formed (see FIG. 12(a)).

In other words, the resin film for an insulating layer was actually press-bonded onto the substrate under conditions of a degree of vacuum of 65 Pa, a pressure of 0.4 MPa, a temperature of 80° C. and a press-bonding time of 60 seconds, and then heated for curing at 170° C. for 30 minutes.

(7) Next, by applying a $CO_2$ gas laser having a wavelength of 10.4 μm onto the insulating layer 22 via a mask of 1.2 mm in thickness in which a through hole was formed, under conditions of one shot of a beam diameter of 4.0 mm, in a top-hat mode, a pulse width of 8.0 μs, and the through hole of the mask having 1.0 mm in diameter, an opening 26 for a via hole of 80 μm in diameter was formed on the insulating layer 22 (see FIG. 12(b)).

(8) The substrate in which the opening 26 for a via hole had been formed was immersed for 10 minutes in a solution at 80° C. containing permanganate of 60 g/l, and epoxy resin particles remaining on the surface of the insulating layer 22 were dissolved and removed, such that a roughened face (not shown) was formed on the surface including the inner wall faces of the opening 26 for a via hole.

(9) Next, the substrate that underwent the above described process was submerged in a neutralizing solution (made by Shipley Co., Ltd.) and then washed with water.

Furthermore, on the surface of the surface-roughened substrate (roughened depth: 3 μm), a palladium catalyst was applied to deposit the catalyst nucleus on the surface of the insulating layer 22 (including the inner wall faces of the opening 26 for a via hole) (not shown in the figure). In other words, the substrate was immersed in a catalyst solution containing palladium chloride ($PdCl_2$) and stannous chloride ($SnCl_2$), such that the catalyst was applied thereto by depositing palladium metal.

(10) Next, the substrate was submerged in an electroless copper plating solution having the following composition, so that a thin film conductor layer (electroless copper plating film) 32 having a thickness of 0.6 to 3.0 μm was formed on the surface of insulating layer 22 (including the inner wall surface of openings 26 for a via hole) (see FIG. 12(c)).

[Electroless Plating Solution]

| | |
|---|---|
| $NiSO_4$: | 0.003 mol/l |
| Tartaric acid: | 0.200 mol/l |
| Copper sulfate: | 0.030 mol/l |
| HCHO: | 0.050 mol/l |
| NaOH: | 0.100 mol/l |
| α,α'-Bipyridyl: | 100 mg/l |
| Polyethylene glycol (PEG): | 0.10 g/l |

[Conditions for Electroless Plating]
40 minutes at a bath temperature of 30° C.

(11) Next, a commercially available photosensitive dry film was pasted to the substrate where the thin film conductor layer (electroless copper plating film) 32 was formed, a mask was placed on the substrate, the substrate was exposed to light of 100 mJ/$cm^2$, and a developing process was carried out using a solution of 0.8% sodium carbonate, whereby a plating resist 23 was provided (see FIG. 12(d)).

Figure 13:
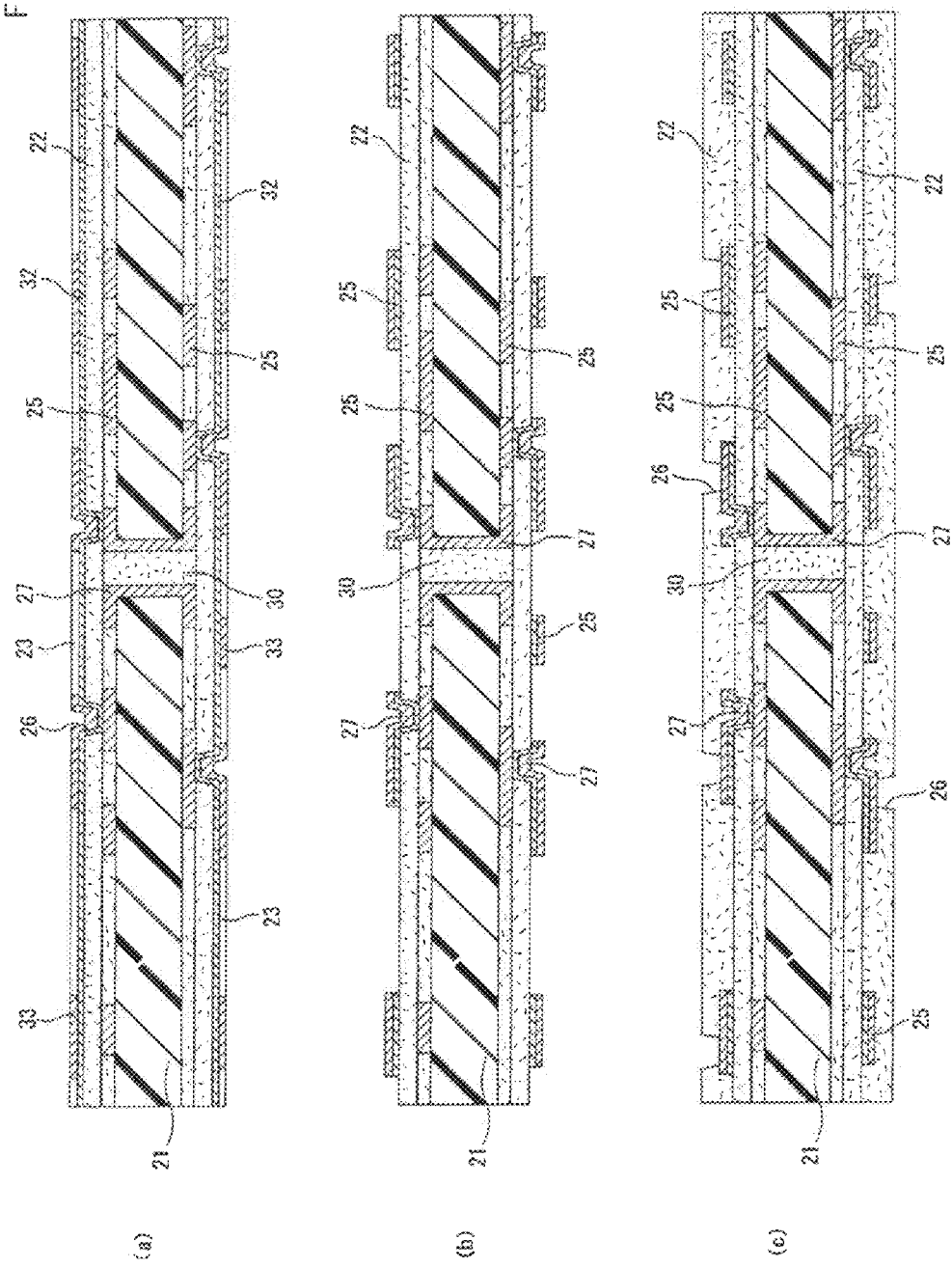
FIGS. 13(a) to 13(c) are cross-section views for schematically illustrating part of a method for manufacturing a multilayer printed circuit board according to the present invention.
Figure 14:
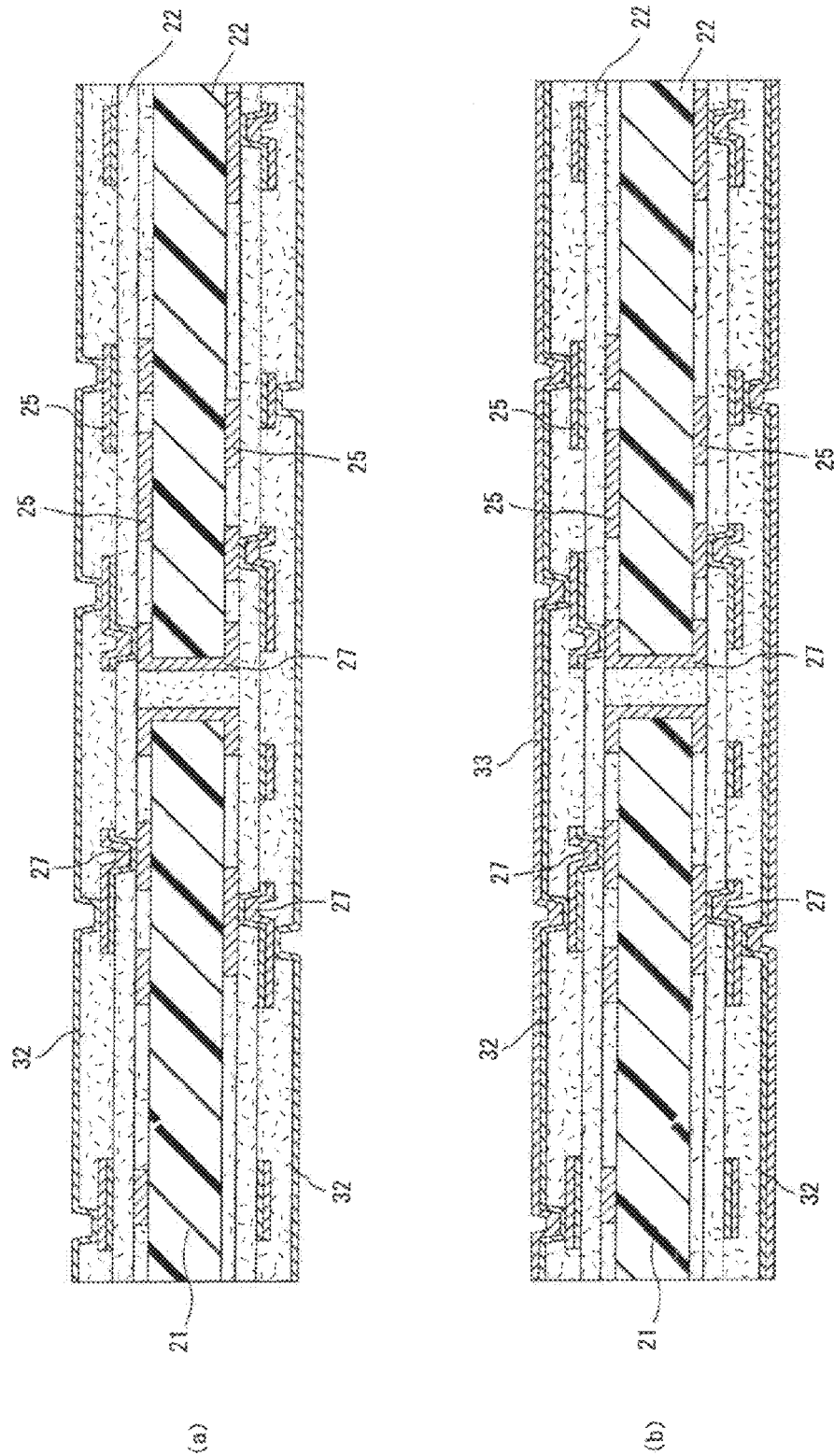
FIGS. 14(a) and 14(b) are cross-section views for schematically illustrating part of a method for manufacturing a multilayer printed circuit board according to the present invention.

(12) Next, the substrate was washed with water of 50° C. to be degreased, washed with water of 25° C., and in addition, washed with sulfuric acid, and then, electrolytic plating was carried out under the following conditions, so that an electrolytic copper plating film 33 was formed in portions where plating resist 23 was not formed (see FIG. 13(a)).
[Electrolytic Plating Liquid]

| | |
|---|---|
| Sulfuric acid: | 2.24 mol/l |
| Copper sulfate: | 0.26 mol/l |
| Additive: | 19.5 ml/l |
| (KAPARACID HL, made by Atotech Japan K.K.) | |

[Conditions for Electrolytic Plating]

| | |
|---|---|
| Current density: | 1 A/dm$^2$ |
| Time: | 65 minutes |
| Temperature: | 22 ± 2° C. |

(13) Furthermore, a plating resist 23 was peeled and removed using a solution of 5% NaOH, and after that, an etching process was carried out on the thin film conductor layer beneath this plating resist 23 using a mixed liquid of sulfuric acid and hydrogen peroxide, so that the thin film conductor layer was dissolved and removed, and thus, conductor circuits 25 (including non-penetrating via holes 27) were formed of the thin film conductor layer (electroless copper plating film) 32 and the electrolytic copper plating film 33 (see FIG. 13(b)).

(14) Next, the above described processes of (6) to (8) were repeated, whereby an insulating layer 22 having openings for a via hole and of which the surface was roughened (not shown) was formed and layered (see FIG. 13(c)).

(15) Furthermore, the above described processes of (9) to (13) were repeated, whereby conductor circuits 25 (non-penetrating via holes 27) were formed on insulating layer 22.

Next, a router process was carried out using a drill having a diameter of 395 μm, whereby through holes for an optical path 46 which penetrated through a substrate 21 and the insulating layer 22 were formed, and furthermore, a desmearing process was carried out on the wall surface of through holes for an optical path 46 (see FIGS. 14(a) to 15(a)).

(16) Next, through holes for an optical path 46 were filled in with an uncured resin composite including an epoxy resin using a squeegee and dried, and after that, the surface layer of the substrate was flattened through buffing. Furthermore, a curing process was carried out, whereby a multilayer circuit board where through holes for an optical path 46 were filled in with a resin composite 47 was gained (see FIG. 15(b)).

(17) Next, optical waveguides were formed on the outermost insulating layers in accordance with the following method. Here, as the optical waveguides, waveguides 50 having four channels with four cores arranged in parallel were formed. First, an acryl based resin (index of refraction: 1.52, transmittance: 94%, CTE: 72 ppm) was prepared as the resin for forming a core, and an acryl based resin (index of refraction: 1.51, transmittance: 93%, CTE: 70 ppm) to which 25% by weight of SiO$_2$ particles in spherical form having a particle diameter of 0.4 to 0.6 μm (SO-E2, made by Admatec GmbH) were added so that the transmittance became 81%, the CTE became 53 ppm and the viscosity became 1000 cps was prepared as the resin for forming a clad.

Next, the resin for forming a clad was applied in predetermined locations on a substrate 21 and pre-baked for 10 minutes at 80° C., followed by a process for exposure to light of 2000 mJ and post-baking for one hour at 150° C., and thus, a lower clad having a thickness of 50 μm was formed. Here, the lower clad was formed so that the thickness was greater than that of conductor circuits 25.

Next, the resin for forming a core was applied on top of a lower clad 52 and pre-baked for 10 minutes at 80° C., followed by a process for exposure to light of 500 mJ through a mask, a developing process of 2 minutes through dipping using a solution of 1% TMAH (tetramethylammonium solution), a process for exposure to light of 2000 mJ with a mask which has no pattern exposed or without a mask and post-baking for one hour at 150° C., and thus, cores 51 having a width of 50 μm×a thickness of 50 μm were formed.

Next, a dicing process using a blade #3000 with an angle of 90 degrees was carried out in predetermined locations on the layered bodies of the lower clad 52 and the core 51 (locations corresponding to optical signal transmitting regions), and furthermore, an Au/Cr vapor deposition film was formed on the surface that was exposed in the process, and thus, optical path conversion mirrors for converting the optical path by 90 degrees were gained.

Next, the resin for forming a clad was applied using a spin coater (1000 μm/10 sec) and pre-baked for 10 minutes at 80° C., followed by a process for exposure to light of 2000 mJ and post-baking for one hour at 150° C., and thus, an upper clad layer 52 was formed as the entirety of the outermost layer of the substrate including cores 51, and thus, optical waveguides 50 were gained (see FIG. 16(a)).

(18) Next, a photo mask having a thickness of 5 mm where a pattern of openings for forming a solder bump (including openings for mounting an optical part) was drawn was made to make contact with an upper clad layer 52 and pre-baked for 10 minutes at 80° C., followed by a process for exposure to light of 500 mJ through a mask, a developing process of 2 minutes through dipping using a solution of 1% TMAH (tetramethylammonium solution), a process for exposure to light of 2000 mJ with a mask which has no pattern exposed or without a mask and post-baking for one hour at 150° C., and thus, openings for forming a solder bump (including openings for mounting an optical part) 43 were formed (see FIG. 16(b)).

(19) Next, the substrate where the above described clad layers were formed as the outermost layers was submerged for 20 minutes in an electroless nickel plating liquid having a pH of 4.5 and including nickel chloride ($2.3 \times 10^{-1}$ mol/l), sodium hypophosphite ($2.8 \times 10^{-1}$ mol/l) and sodium citrate ($1.6 \times 10^{-1}$ mol/l), and a nickel plating layer having a thickness of 5 μm was formed in openings for forming a solder bump (including openings for mounting an optical part) 43. Furthermore, this substrate was submerged for 7.5 minutes under conditions of 80° C. in an electroless gold plating liquid including potassium gold cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l), and thus, a gold plating layer having a thickness of 0.03 μm was formed on the nickel plating layer as solder pads 36.

(20) Next, micro lenses 49 were provided in locations on upper clads 52 corresponding to end portions of optical signal transmitting regions 42 in accordance with the following method using an inkjet apparatus.

That is to say, a UV setting type epoxy-based resin (transmittance: 91%/mm, index of refraction: 1.53) was adjusted to a viscosity of 20 cps at room temperature (25° C.), and after that, this resin was adjusted to a viscosity of 8 cps within the resin container in the inkjet apparatus at a temperature of 40° C., and after that, applied to predetermined locations on the upper clads and then, UV set, and thus, convex lenses having a diameter of 220 μm were provided.

Here, the degree of sagging of the micro lenses was such that the micro lenses could be formed so as to have a form which allows transmitting light to be converted to collimated light on the side facing a package substrate on which a light receiving element was mounted in the post-process, and the micro lenses could be formed so as to have a form which allows the focal point of transmitting light to coincide with the core of the optical waveguide on the side facing a package substrate on which a light emitting element is mounted.

Figure 17:
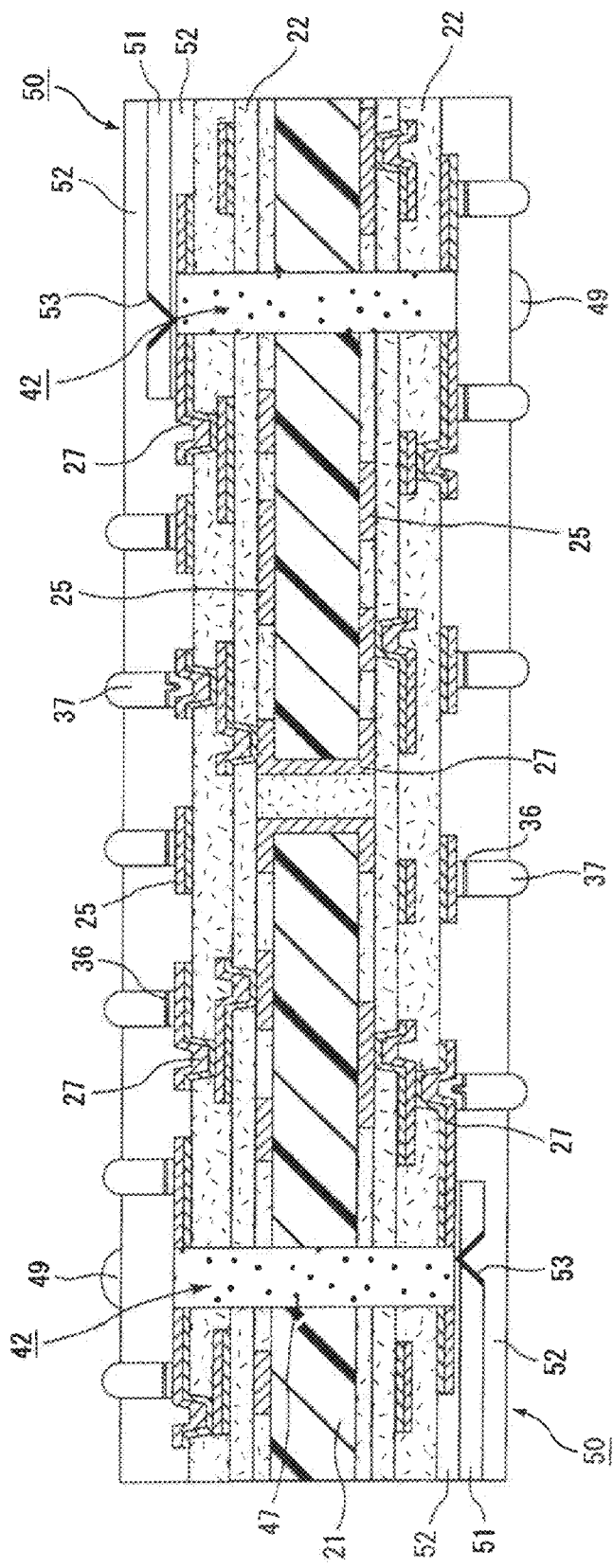
FIG. 17 is a cross-section view for schematically illustrating part of a method for manufacturing a multilayer printed circuit board according to the present invention.

(21) Next, a solder paste (Sn/Ag=96.5/3.5) was printed in openings for forming a solder bump (including openings for mounting an optical part) 43, and thus, solder bumps 37 were formed (see FIG. 17(*a*)).

Next, a package substrate on which a PD was mounted as light receiving element 38 and a package substrate on which a VCSEL was mounted as light emitting element 39 were mounted via the solder bumps, and thus, a multilayer printed circuit board was gained.

Figure 38:
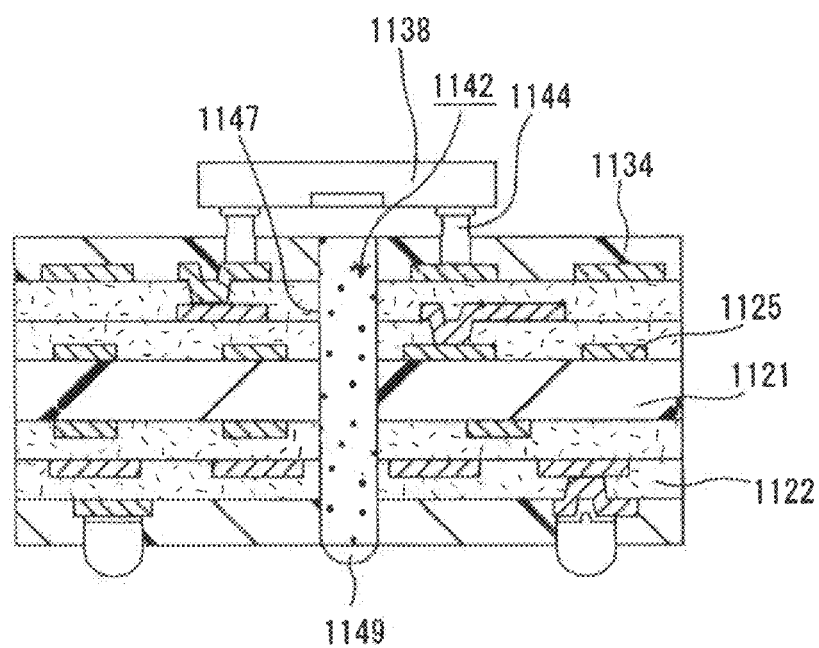
FIG. 38 is a cross-section view for describing a package substrate mounted on a multilayer printed circuit board of one example.

Here, as the package substrates, package substrates where conductor circuits 1125 and insulating layers 1122 were formed and layered on a substrate 1121, an optical signal transmitting region 1142 having a collective through hole structure filled in with a resin composite 1147 was formed, and in addition, a micro lens 1149 was provided on an end portion of the optical signal transmitting region on the multilayer printed circuit board side were used (see FIG. 38).

Here, in the figure, 1134 indicates a solder resist layer, 1138 indicates an optical element, and 1144 indicates a solder connection portion.

Example 2

1. Manufacture of Circuit Board A (1) A copper-clad multilayer board where copper foil of 18 μm was laminated on the two surfaces of an insulating substrate 10021 made of a glass epoxy resin or a BT (bismaleimide-triazine) resin having a thickness of 0.8 mm, and thus, surface conductor layers 10028 were formed, was used as a starting material (see FIG. 18(*a*)). First, holes were drilled in this copper-clad multilayer board and an electroless plating process was carried out, and in addition, holes 10009 were filled in with a resin composite 10030', whereby conductor layers 10027' which formed the wall surface of non-penetrating via holes were formed (see FIGS. 18(*b*) and 18(*c*)).

Here, as the resin composite, a resin composite gained by putting 100 parts by weight of a bisphenol F-type epoxy monomer (YL983U, made by Yuka Shell K.K., molecular weight: 310), 170 parts by weight of $SiO_2$ particles in spherical form having an average particle diameter of 1.6 μm where the surface was coated with a silane coupling agent and a maximum particle diameter was 15 μm or less (CRS1101-CE, made by Admatec GmbH) and 1.5 parts by weight of a leveling agent (PERENOL S4, made by San Nopco Co., Ltd.) in a container and stirring and mixing this, thereby adjusting the viscosity to 45 to 49 Pa·s at 23±1° C. was used. In addition, as a curing agent, 6.5 parts by weight of an imidazole curing agent (2E4MZ-CN, made by Shikoku Corp.) was used.

Figure 18:
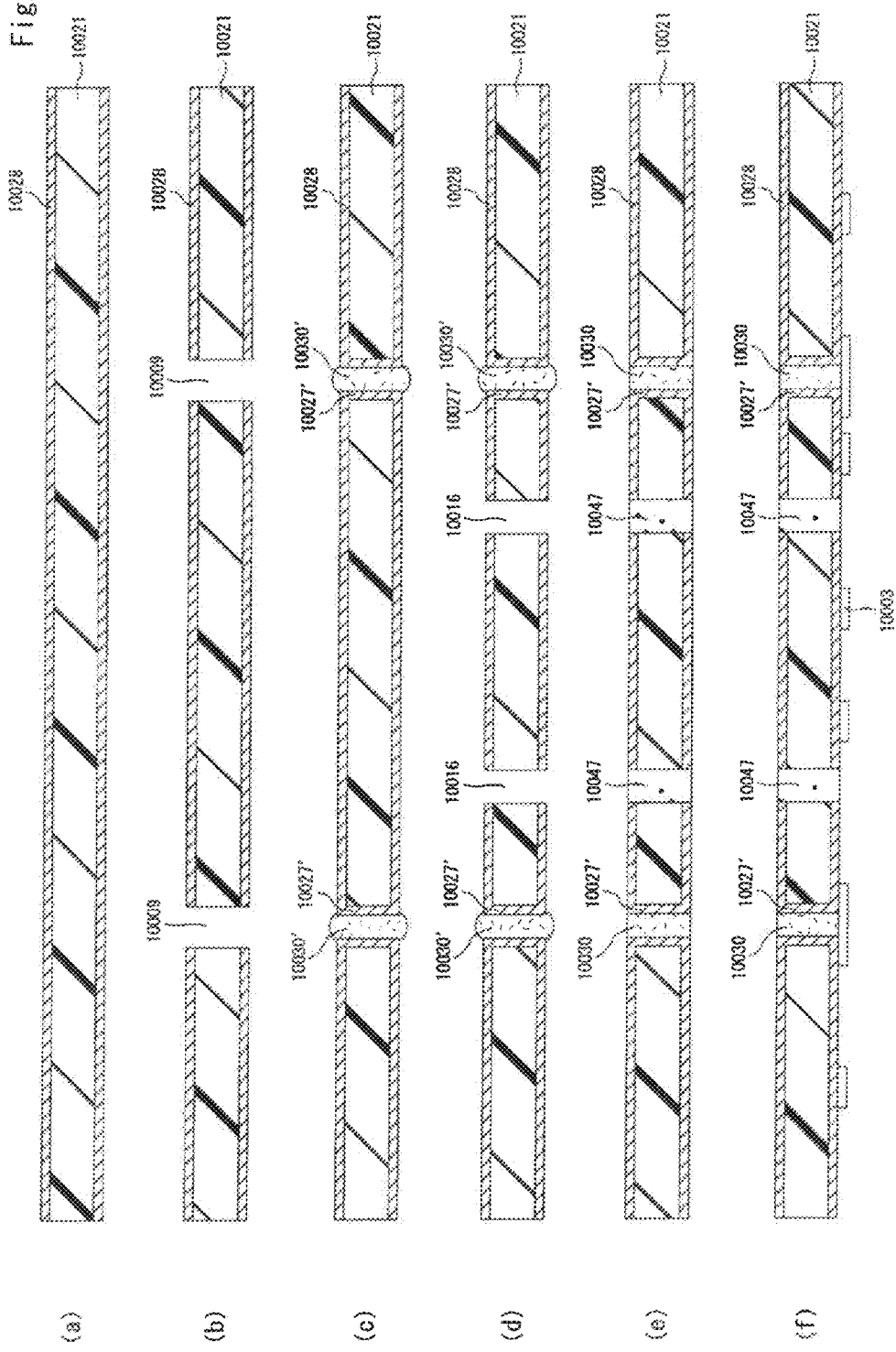
FIGS. 18(a) to 18(f) are cross-section views for schematically illustrating part of a method for manufacturing a multilayer printed circuit board according to the present invention.

(2) Next, through holes for an optical path 10016 were formed in accordance with a router process so as to penetrate through substrate 10021 and surface conductor layers 10028, and furthermore, a desmearing process was carried out on the wall surface of through holes for an optical path 10016 (see FIG. 18(*d*)). Here, through holes for an optical path having a collective through hole structure were formed.

(3) Next, resin was placed on a mask for filling in holes of a printer and screen printing was carried out, whereby through holes for an optical path 10016 were filled in with a resin composite, and after that, a curing process was carried out under conditions of 120° C. for one hour and 150° C. for one hour, and after that, the resin which protruded from through holes for an optical path 10016 was ground with a #3000 grind paper, and furthermore, alumina particles having a diameter of 0.05 μm were used to grind and flatten the surface. Here, the grinding process was carried out so that the end portions of the optical signal transmitting regions made of a resin composite 10047 and surface conductor layers 10028 formed the same plane (see FIG. 18(*e*)). Here, when the resin composite with which the through holes for an optical path were filled in was ground, the resin protruding from holes 10009 which were filled in with a resin composite in the above described process of (1) was also ground at the same time. Here, the resin may be ground at a stage where the holes are filled in with the resin composite in the process of (1).

As the resin composite in this process, an epoxy resin (transmittance: 91%, CTE: 82 ppm) to which 40% by weight of crushed silica having a grain-size distribution of 0.1 to 0.8 μm was added so that the transmittance was adjusted to 82%, the CTE was adjusted to 42 ppm and the viscosity was adjusted to 200,000 cps was used.

Figure 19:
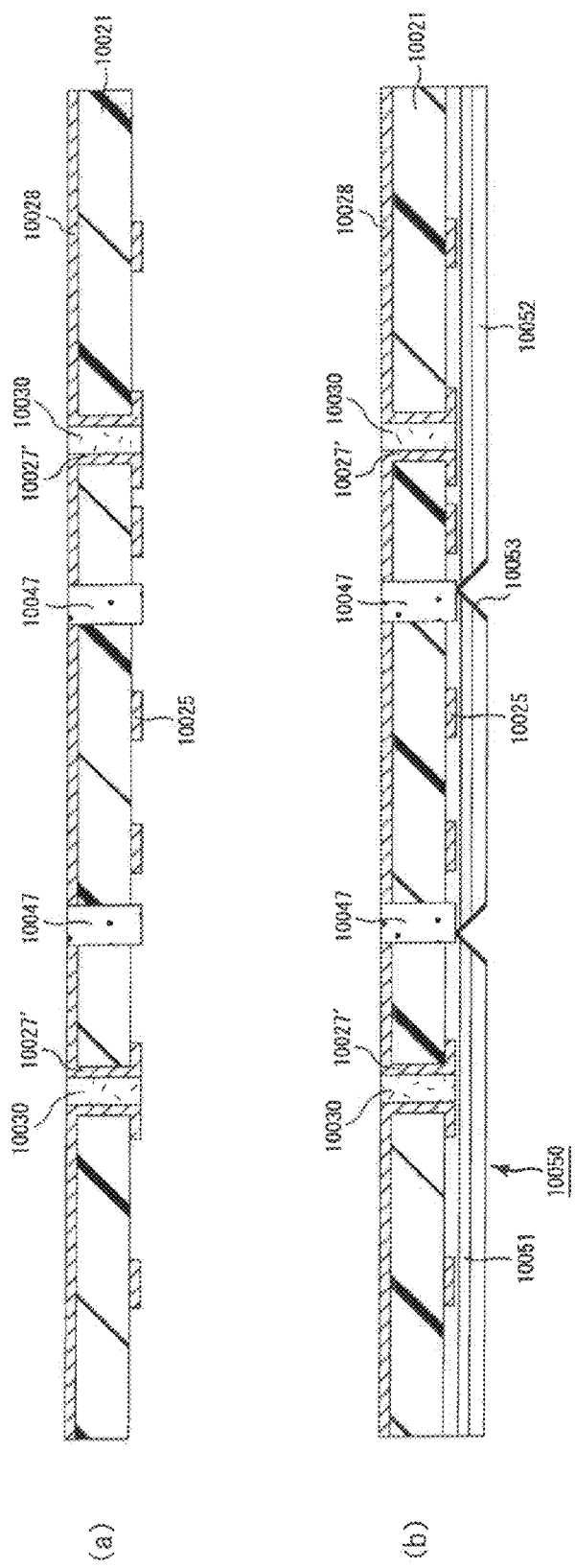
FIGS. 19(a) and 19(b) are cross-section views for schematically illustrating part of a method for manufacturing a multilayer printed circuit board according to the present invention.

(4) Next, an etching resist 10003 was formed in portions of one surface conductor layer (lower side in the figure) (see FIG. 18(*f*)) and an etching process was carried out, whereby conductor circuits 10025 were formed on one side of the substrate (see FIG. 19(*a*)).

(5) Next, an optical waveguide 10050 was formed and layered in accordance with the following method on the side where conductor circuits 10025 were formed. Here, as the optical waveguide, optical waveguide 10050 having four channels where four cores were provided in parallel were formed.

First, as the resin for forming a core, an acryl based resin (index of refraction: 1.52, transmittance: 94%, CTE: 72 ppm) was prepared, and as the resin for forming a clad, an acryl based resin (index of refraction: 1.51, transmittance: 93%, CTE: 70 ppm) to which 25% by weight of $SiO_2$ particles in spherical form having a particle diameter of 0.4 to 0.6 μM (SO-E2, made by Admatec GmbH) was added so that the transmittance became 81%, the CTE became 53 ppm and the viscosity became 1000 cps was prepared.

Next, the resin for forming a clad was applied on the side of substrate 10021 where conductor circuits 10025 were formed using a spin coater (1000 μm/10 sec) and pre-baked at 80° C. for 10 minutes, followed by a process for exposure to light of 2000 mJ and post-baking at 150° C. for 1 hour, and thus, a lower clad 10052 having a thickness of 50 μM was formed. Here, the lower clad was formed so as to have a thickness that is greater than that of conductor circuits 10025.

Next, the resin for forming a core was applied on top of the lower clad 10052 using a spin coater (1200 μm/10 sec) and pre-baked at 80° C. for 10 minutes, followed by a process for exposure to light of 500 mJ through a mask, a developing process for 2 minutes through dipping in a solution of 1% TMAH (tetramethylammonium solution), a process for exposure to light of 2000 mJ with a mask which has no pattern exposed or without a mask and post-baking at 150° C. for one hour, and thus, a core 10051 having a width of 50 μm×a thickness of 50 μM was formed.

Next, the resin for forming a clad was applied using a spin coater (1000 μm/10 sec) and pre-baked at 80° C. for 10 minutes, followed by a process for exposure to light of 2000 mJ and post-baking at 150° C. for one hour, so that an upper clad having a thickness of 50 μm was formed on the core, and thus, an optical waveguide 10050 made of a core 10051 and a clad 10052 was gained.

After that, a dicing process was carried out on the portions of the optical waveguide 10050 corresponding to the optical signal transmitting regions using a blade #3000 with an angle of 90 degrees, and furthermore, an Au/Cr vapor deposition film was formed on the surfaces exposed as a result of processing, and thus, optical path conversion mirrors 10053 with an angle of 90 degrees were gained (see FIG. 19(*b*)).

Through these processes, a circuit board A was completed.

2. Manufacture of Multilayer Printed Circuit Board (6) Next, two pieces of the above-described circuit boards and one prepreg made of a high Tg epoxy having a thickness of 80 μm (MCL-E-679, made by Hitachi Chemical Co., Ltd.) were prepared and layered while circuit boards A were being positioned on the two sides of this prepreg 10022 in accordance with a pin lamination method so that optical waveguides 10050 were located inside, and after that, pressed under such conditions that the pressure was 30 kg/cm$^2$, the time for pressing was 45 minutes at a temperature of 180° C. or more, and the total time for pressing was 150 minutes (see FIG. 20(*a*)).

Here, guide holes (not shown) were formed in advance in circuit boards A.

Figure 20:
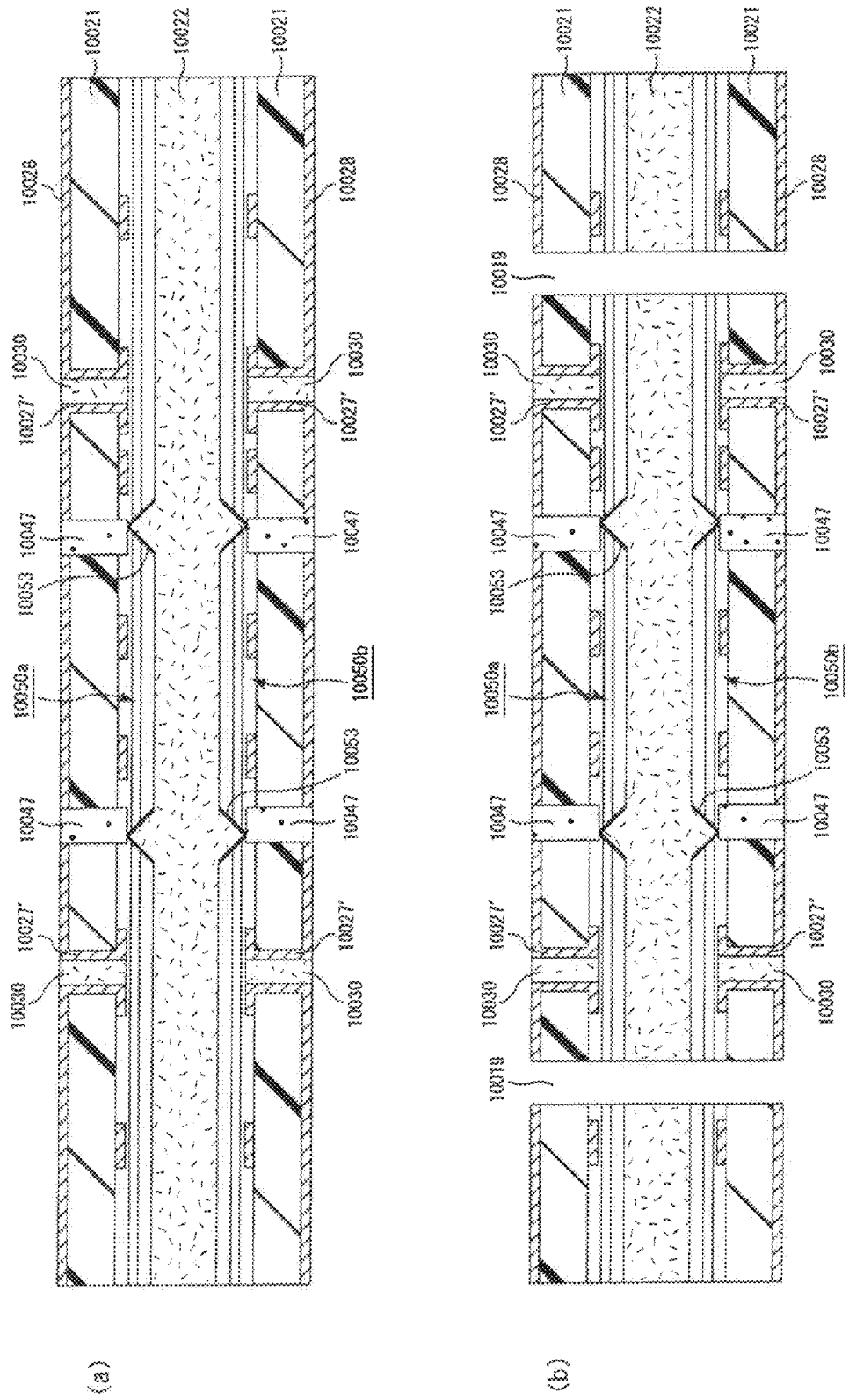
FIGS. 20(a) and 20(b) are cross-section views for schematically illustrating part of a method for manufacturing a multilayer printed circuit board according to the present invention.

(7) Next, through holes 10019 were formed through a drilling process so as to penetrate through the entirety of the multilayer board formed in the above described process of (6) (see FIG. 20(*b*)), and a conductor layer 10029' was formed on the wall surface of these through holes 10019.

Conductor layers 10029' were formed by adding a palladium catalyst to the wall surface of through holes 10019, and after that, forming a mask on the surface of the substrate, and then, forming a copper plating film through electroless plating by immersing the substrate in an electroless copper plating solution having the following composition, and after that, attaching a thick electrolytic copper plating film having the following composition (see FIG. 21(*a*)).

[Electroless Plating Solution]

| | |
|---|---|
| NiSO$_4$: | 0.003 mol/l |
| Tartaric acid: | 0.200 mol/l |
| Copper sulfate: | 0.030 mol/l |
| HCHO: | 0.050 mol/l |
| NaOH: | 0.100 mol/l |
| α,α'-Bipyridyl: | 100 mg/l |
| Polyethylene glycol (PEG): | 0.10 g/l |

[Conditions for Electroless Plating]
40 minutes at a bath temperature of 30° C.
[Electrolytic Plating Liquid]

| | |
|---|---|
| Sulfuric acid: | 2.24 mol/l |
| Copper sulfate: | 0.26 mol/l |
| Additive (KAPARACID HL, made by Atotech Japan K.K.): | 19.5 ml/l |

[Conditions for Electrolytic Plating]

| | |
|---|---|
| Current density: | 1 A/dm$^2$ |
| Time: | 65 minutes |
| Temperature: | 22 ± 2° C. |

(8) Next, through holes 10019 where conductor layer 10029' was formed on the wall surface were filled in with a resin composite 10030 (see FIG. 21(*b*)).

(9) Next, through holes 10046 were formed through a drilling process so as to penetrate through the entirety of the multilayer board (see FIG. 22(*a*)), and these through holes 10046 were filled in with a resin composite 10047 (see FIG. 22(*b*)). Here, the through holes filled in with this resin composite function as optical signal transmitting regions.

In addition, as resin composite 10047, the same resin composite as that with which the holes were filled in the above described process (3) was used.

Figure 23:
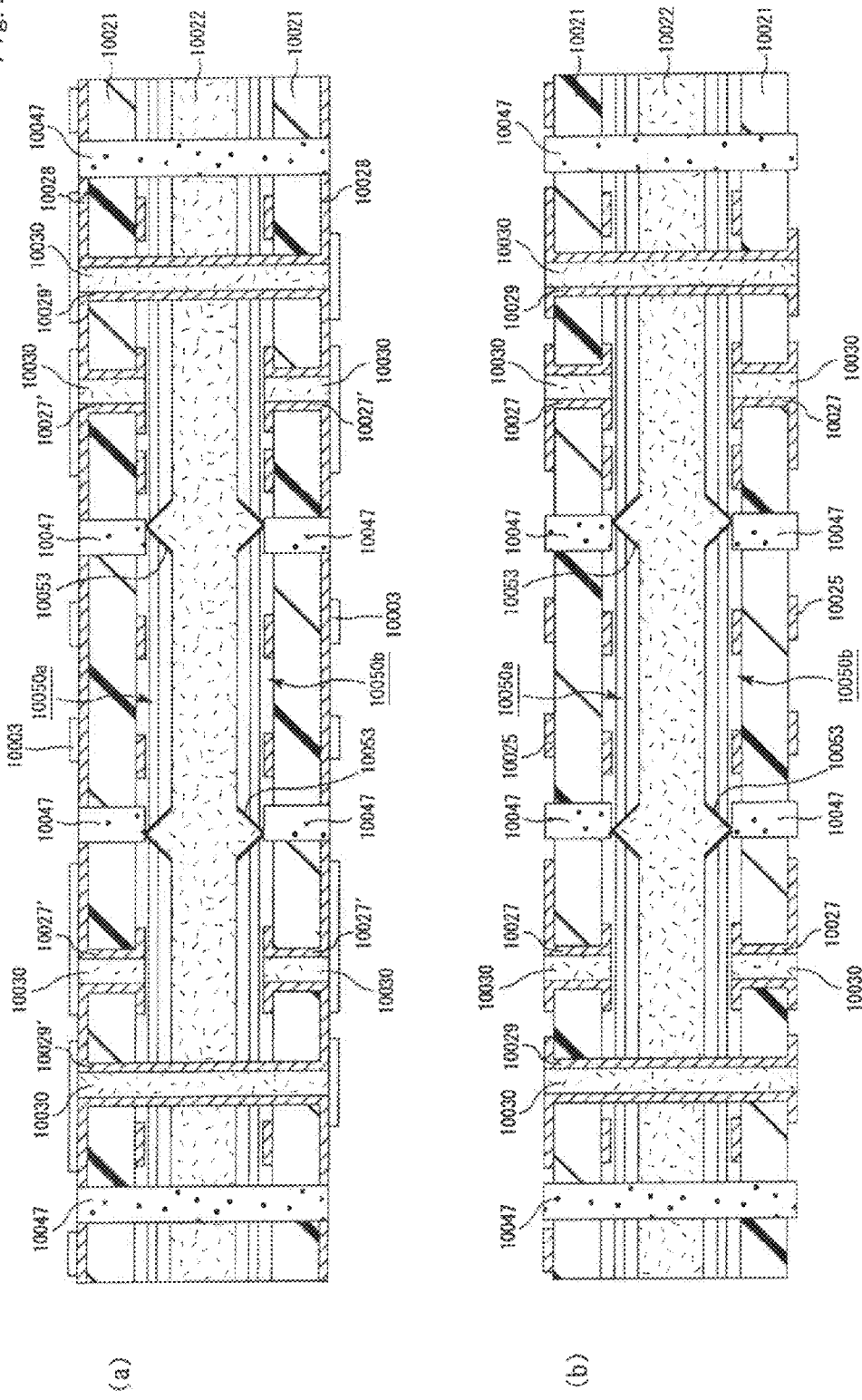
FIGS. 23(a) and 23(b) are cross-section views for schematically illustrating part of a method for manufacturing a multilayer printed circuit board according to the present invention.

(10) Next, an etching resist 10003 was formed on the conductor layers on the two surfaces of the multilayer board (surface conductor layers 10028 formed on circuit boards A) (see FIG. 23(*a*)), and after that, an etching process was carried out, whereby conductor circuits 10025 were formed in the outermost layers (see FIG. 23(*b*)).

In addition, penetrating via holes 10029 were formed at the same time in this process.

(11) Next, layers of a solder resist composite were formed in the outermost layers.

As the above described solder resist composite, a solder resist composite gained by mixing 46.67 g of a photosensitized oligomer (molecular weight: 4000) where 50% of the epoxy groups in a cresol novolac type epoxy resin (made by Nippon Kayaku Co., Ltd.), 60% by weight of which was dissolved in DMDG was converted to acryl, 15.0 g of a bisphenol A-type epoxy resin (Epikoat 1001, made by Yuka Shell Co., Ltd.), 80% by weight of which was dissolved in methyl ethyl ketone, 1.6 g of an imidazole curing agent (trade name: 2E4MZ-CN, made by Shikoku Corp.), 3 g of a polyvalent acrylic monomer (trade name: R604, made by Nippon Kayaku Co., Ltd.), which is a photosensitive monomer, 1.5 g of a polyvalent acrylic monomer (trade name: DPE6A, made by Kyoeisha Chemical Co., Ltd.), which is also a photosensitive monomer, and 0.71 g of a dispersion antifoamer (trade name: S-65, made by San Nopco Co., Ltd.), and furthermore, adding 2 g of benzophenone (made by Kanto Chemical Co., Inc.), which is an photopolymerization initiator, and 0.2 g of Michler's ketone (made by Kanto Chemical Co., Inc.), which is a photosensitizer, to this mixture, so that the viscosity was adjusted to 2.0 Pa·s at 25° C. was used.

Here, the viscosity was measured using a B type viscometer (type DVL-B, made by Tokyo Keiki Co., Ltd.), with a Rotor No. 4 in the case of 60 rpm and a Rotor No. 3 in the case of 6 rpm.

(12) Next, a photomask having a thickness of 5 mm where a pattern of openings for forming solder bumps and optical waveguide forming regions were drawn was made to make contact with a layer of a transparent solder resist composite and exposed to ultraviolet rays of 1000 mJ/cm$^2$, followed by a developing process in a DMTG solution, and thus, openings for forming solder bumps were formed, and at the same time, a layer of the solder resist composite from which the optical waveguide forming regions were exposed was gained.

Furthermore, the respective heating processes were carried out under conditions of 80° C. for one hour, 100° C. for one hour, 120° C. for one hour and 150° C. for three hours so that the layer of the solder resist composite was cured, and thus, a solder resist layer 10034 having openings for forming solder bumps from which the optical waveguide forming regions were exposed was formed (see FIG. 24(*a*)).

(13) Next, the substrate on which solder resist layers 10034 were formed was immersed in an electroless nickel plating liquid including nickel chloride (2.3×10$^{-1}$ mol/l), sodium hypophosphite (2.8×10$^{-1}$ mol/l) and sodium citrate (1.6×10$^{-1}$ mol/l) of which the pH was 4.5 for 20 minutes, whereby a nickel plating layer having a thickness of 5 μm was formed in the openings for forming solder bumps. Furthermore, this substrate was immersed in an electroless gold plating liquid including potassium gold cyanide ($7.6\times10^{-3}$ mol/l), ammonium chloride ($1.9\times10^{-1}$ mol/l), sodium citrate ($1.2\times10^{-1}$ mol/l) and sodium hypophosphite ($1.7\times10^{-1}$ mol/l) for 7.5 minutes under conditions of 80° C., whereby a gold plating layer having a thickness of 0.03 μm was formed on the nickel plating layer, and thus, solder pads 10036 were provided.

(14) Next, optical waveguides 10050c and 10050d were formed in predetermined locations of the outermost layers. Here, the optical waveguides were formed in accordance with the same method as that used in the above described process of (5).

(15) Next, micro lenses 10049 were provided in locations on solder resist layers 10034 corresponding to the end portions of optical signal transmitting regions 10042 in accordance with the following method using an inkjet apparatus.

That is to say, the viscosity of a UV setting epoxy-based resin (transmittance: 91%/mm, index of refraction: 1.53) was adjusted to 20 cps at room temperature (25° C.), and then, the viscosity of this resin was adjusted to 8 cps within a resin container of an inkjet apparatus at a temperature of 40° C., and after that, this resin was applied in predetermined locations on the upper clads and cured with UV rays, and thus, convex lenses having a diameter of 220 μm were provided.

Here, the degree of sagging of the micro lenses was such that the micro lenses could be formed so as to have a form which allows transmitting light to be converted to collimated light on the side facing a package substrate on which a light receiving element was mounted in the post-process, and the micro lenses could be formed so as to have a form which allows the focal point of transmitting light to coincide with the core of the optical waveguide on the side facing a package substrate on which a light emitting element is mounted.

(16) Next, a solder paste (Sn/Ag=96.5/3.5) was printed in the openings for forming solder bumps which were formed in solder resist layers 10034, and thus, solder bumps 10037 were formed (see FIG. 24(b)).

Next, a package substrate on which a PD was mounted as a light receiving element and a package substrate on which a VCSEL was mounted as a light receiving element were mounted by interposing the solder bumps, and thus, a multilayer printed circuit board was gained. Here, as the package substrates, the same package substrates as those used in Example 1 were used.

Example 3

1. Manufacture of Circuit Board A (1) A circuit board A was manufactured in accordance with the same method as in Example 2.

2. Manufacture of Circuit Board B (2) A copper-clad multilayer board, where copper foil having a thickness of 18 μm was laminated on the two surfaces of an insulating substrate 10021 made of a glass epoxy resin or a BT (bismaleimide triazine) resin having a thickness of 0.8 mm so that surface conductor layers 10028 were formed, was used as a starting material (see FIG. 25(a)). First, holes were drilled in this copper-clad multilayer board, an electroless plating process was carried out, and holes 10009 were filled in with a resin composite, whereby conductor layers 10027' which forms non-penetrating via holes on the wall surface thereof were formed (see FIGS. 25(b) and 25(c)).

Here, as the resin composite, the same resin composite as that used for the manufacture of circuit board A was used.

Figure 25:
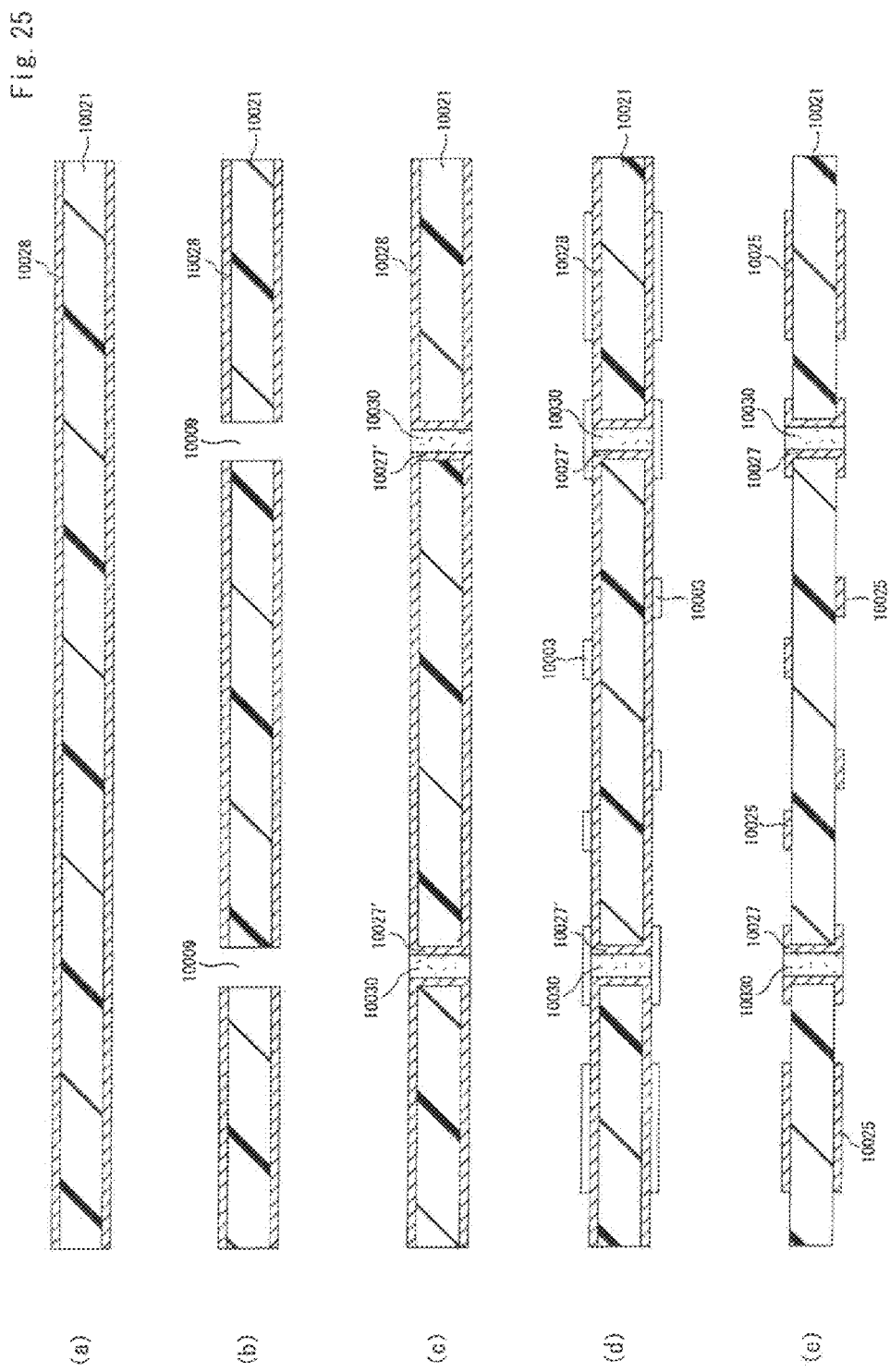
FIGS. 25(a) to 25(e) are cross-section views for schematically illustrating part of a method for manufacturing a multilayer printed circuit board according to the present invention.

(3) Next, an etching resist 10003 was formed on surface conductor layers 10028 (see FIG. 25(d)) and an etching process was carried out, whereby conductor circuits 10025 (including non-penetrating via holes 10027) were formed on the two surfaces of the substrate (see FIG. 25(e)).

3. Method for Manufacturing Multilayer Printed Circuit Board (4) Next, two pieces of the above-described circuit boards A, one piece of the above-described circuit board B and two glass unwoven cloth prepregs made of epoxy having a thickness of 80 μm (AS-5000GP, made by Hitachi Chemical Co., Ltd.) were prepared, and circuit boards A were placed so as to face the above described one piece of the circuit board B at the center via prepregs 10022 on both sides of this circuit board B so that optical waveguides 10050 were located inside, and these were layered while being positioned in accordance with a pin lamination method. After that, they were pressed under such conditions that the pressure was 30 kg/cm², the time for pressing at a temperature of 180° C. or more was 45 minutes and the total time for pressing was 150 minutes (see FIG. 26(a)). Here, guide holes (not shown) were formed in advance in circuit boards A and B.

(5) Next, through holes 10019 were formed through a drilling process so as to penetrate through the entirety of the multilayer board formed in the above described process of (6) (see FIG. 26(b)), and conductor layers 10029' were formed on the wall surface of these through holes 10019.

Conductor layers 10029' were formed by adding a palladium catalyst to the wall surface of through holes 10019, and after that, forming a mask on the surface of the substrate, and then forming a copper plating film through electroless plating by immersing the substrate in an electroless copper plating solution, and after that, carrying out a thick-affixing process of the copper plating film through electroplating.

Here, electroless copper plating and electrolytic copper plating were carried out under the same conditions as those for (7) in Example 2.

(6) Next, through holes 10019 where conductor layer 10029' was formed on the wall surface were filled in with a resin composite 10030 (see FIG. 27(a)).

(7) Next, an etching resist (not shown) was formed on the conductor layers on the surface of the multilayer board (surface conductor layers 10028 formed on circuit boards A), and after that, conductor circuits 10025 (including non-penetrating via holes 10027 and penetrating via holes 10029) were formed in the outermost layers by carrying out an etching process (see FIG. 27(b)).

(8) Next, layers of a solder resist composite were formed as the outermost layers.

As the above described solder resist composite, the same solder resist composite as that used in Example 2 was used.

(9) Next, a photomask having a thickness of 5 mm where a pattern of openings for forming solder bumps were drawn was made to make contact with a layer of a transparent solder resist composite and exposed to ultraviolet rays of 1000 mJ/cm², followed by a developing process in a DMTG solution, and thus, openings for forming solder bumps were formed.

Furthermore, the respective heating processes were carried out under conditions of 80° C. for one hour, 100° C. for one hour, 120° C. for one hour and 150° C. for three hours so that the layer of the solder resist composite was cured, and thus, a solder resist layer 10034 having openings for forming solder bumps was formed.

(10) Next, solder pads 10036 were gained in the same manner as in the process of (13) in Example 2.

Figure 28:
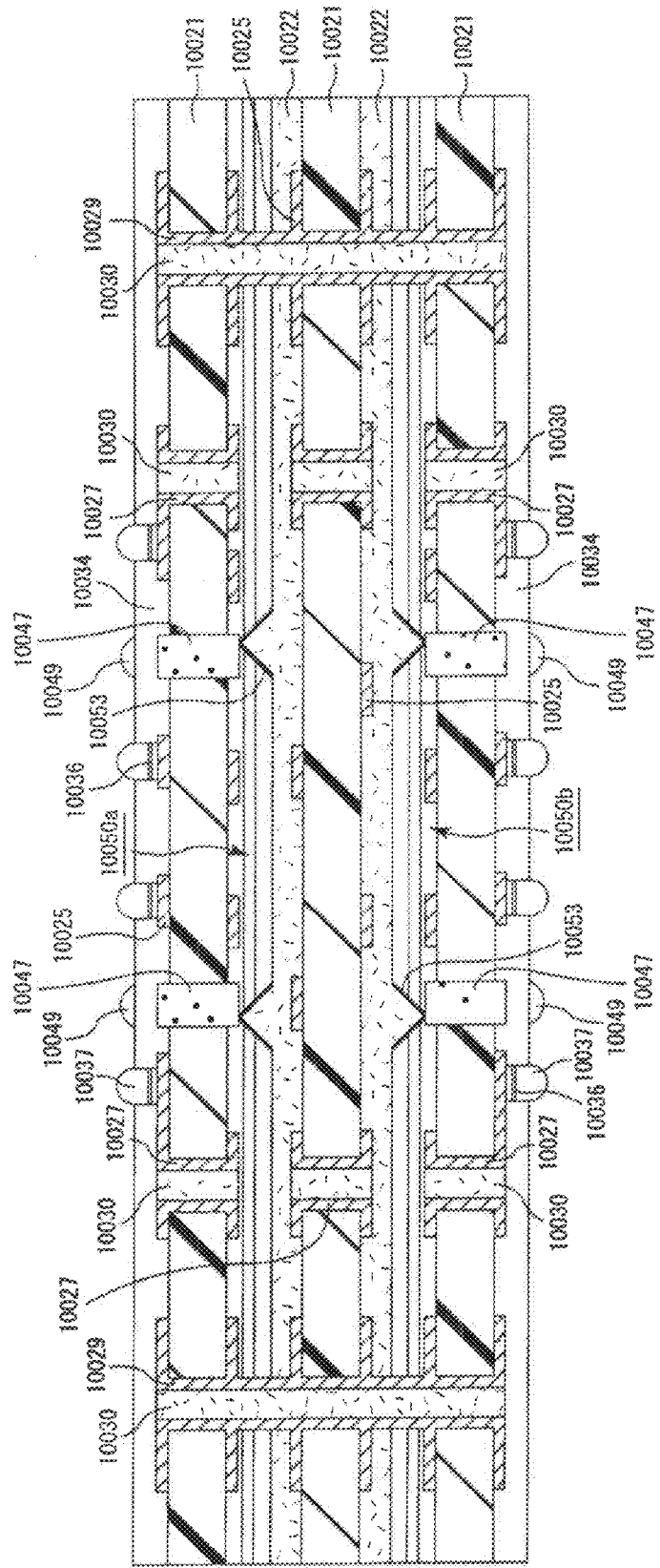
FIG. 28 is a cross-section view for schematically illustrating part of a method for manufacturing a multilayer printed circuit board according to the present invention.

(11) Furthermore, micro lenses 10049 were provided and solder bumps 10037 were formed in the same manner as in the processes of (15) and (16) in Example 2, and furthermore, package substrates were mounted, and thus, a multilayer printed circuit board was manufactured (see FIG. 28).

Example 4

Figure 29:
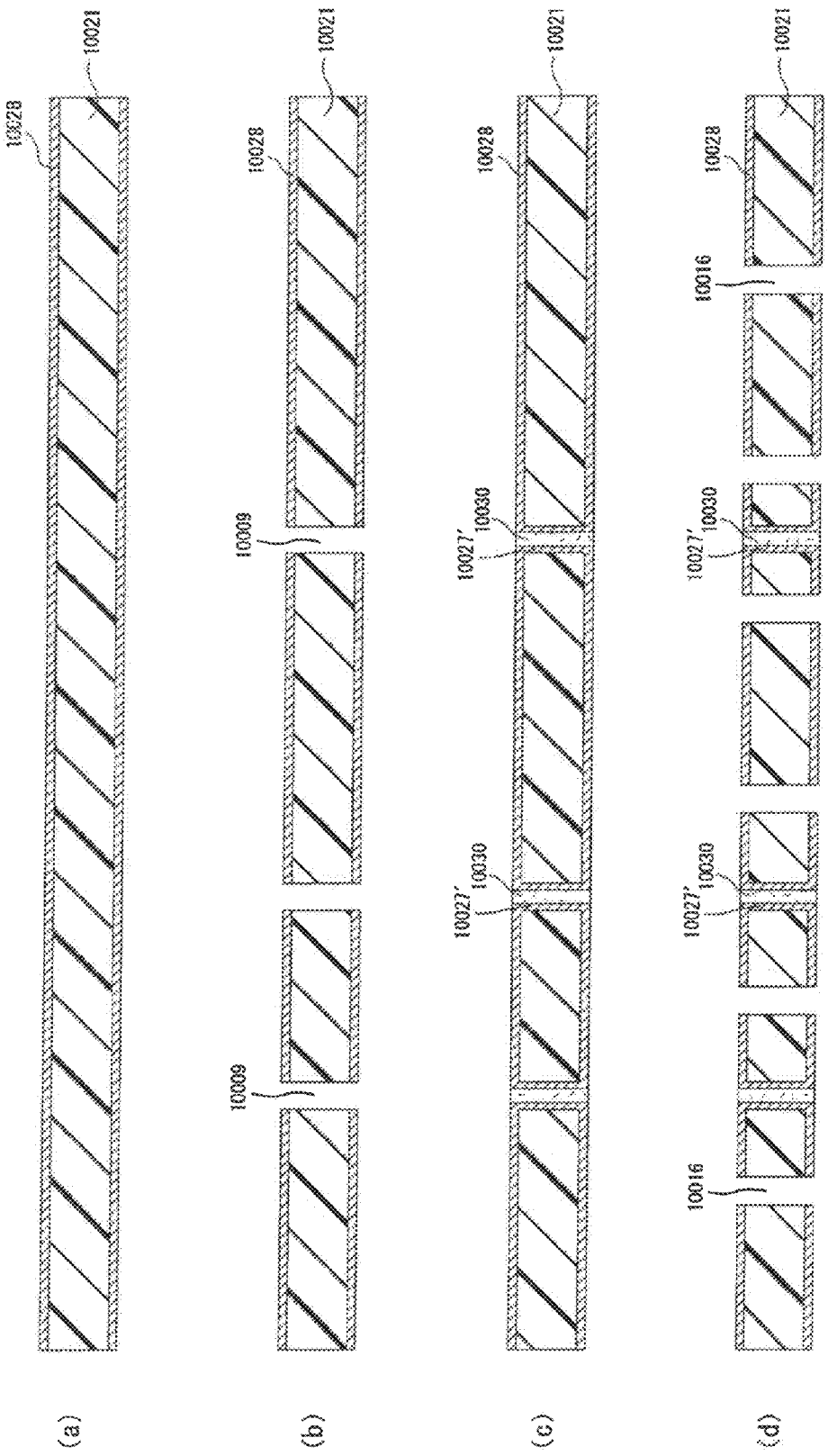
FIGS. 29(a) to 29(d) are cross-section views for schematically illustrating part of a method for manufacturing a multilayer printed circuit board according to the present invention.

1. Manufacture of Circuit Board C (1) A copper-clad multilayer board, where copper foil having a thickness of 18 μm was laminated on both sides of an insulating substrate 10021 made of a glass epoxy resin or a BT (bismaleimide triazine) resin having a thickness of 0.8 mm and surface conductor layers 10028 were formed, was used as a starting material, and optical signal transmitting regions 10042 were formed of a resin composite 10047 in predetermined locations in accordance with the same method as in the processes of (1) to (3) in Example 2 (see FIGS. 29(*a*) to 29(*d*), 30(*a*) and 30(*b*)).

Figure 30:
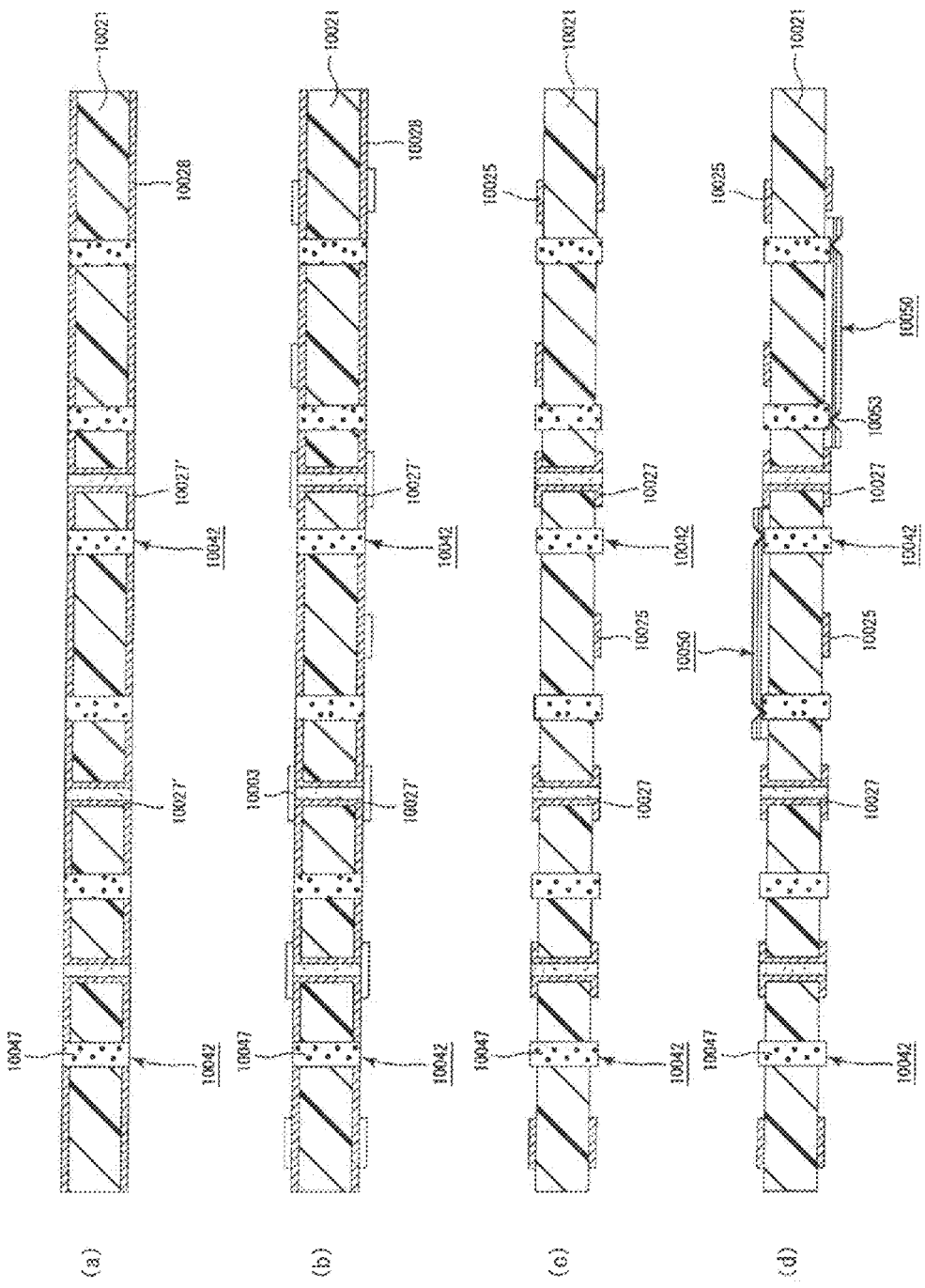
FIGS. 30(a) to 30(d) are cross-section views for schematically illustrating part of a method for manufacturing a multilayer printed circuit board according to the present invention.

(2) Next, an etching resist 10003 was formed in portions of surface conductor layers 10028 on both sides and an etching process was carried out, whereby conductor circuits 10025 and non-penetrating via holes 10027 were formed in the two surfaces of the substrate (see FIG. 30(*c*)).

(3) Next, a circuit board C where optical waveguides 10050 having optical path conversion mirrors were formed in predetermined locations was manufactured in accordance with the same method as in the process of (5) in Example 2 (see FIG. 30(*d*)).

2. Manufacture of Circuit Board D (4) A circuit board D where optical signal transmitting regions 10042 which were filled in with a resin composite 10047 were formed was manufactured in accordance with the same method as in the processes of (2) and (3) in Example 3.

Figure 31:
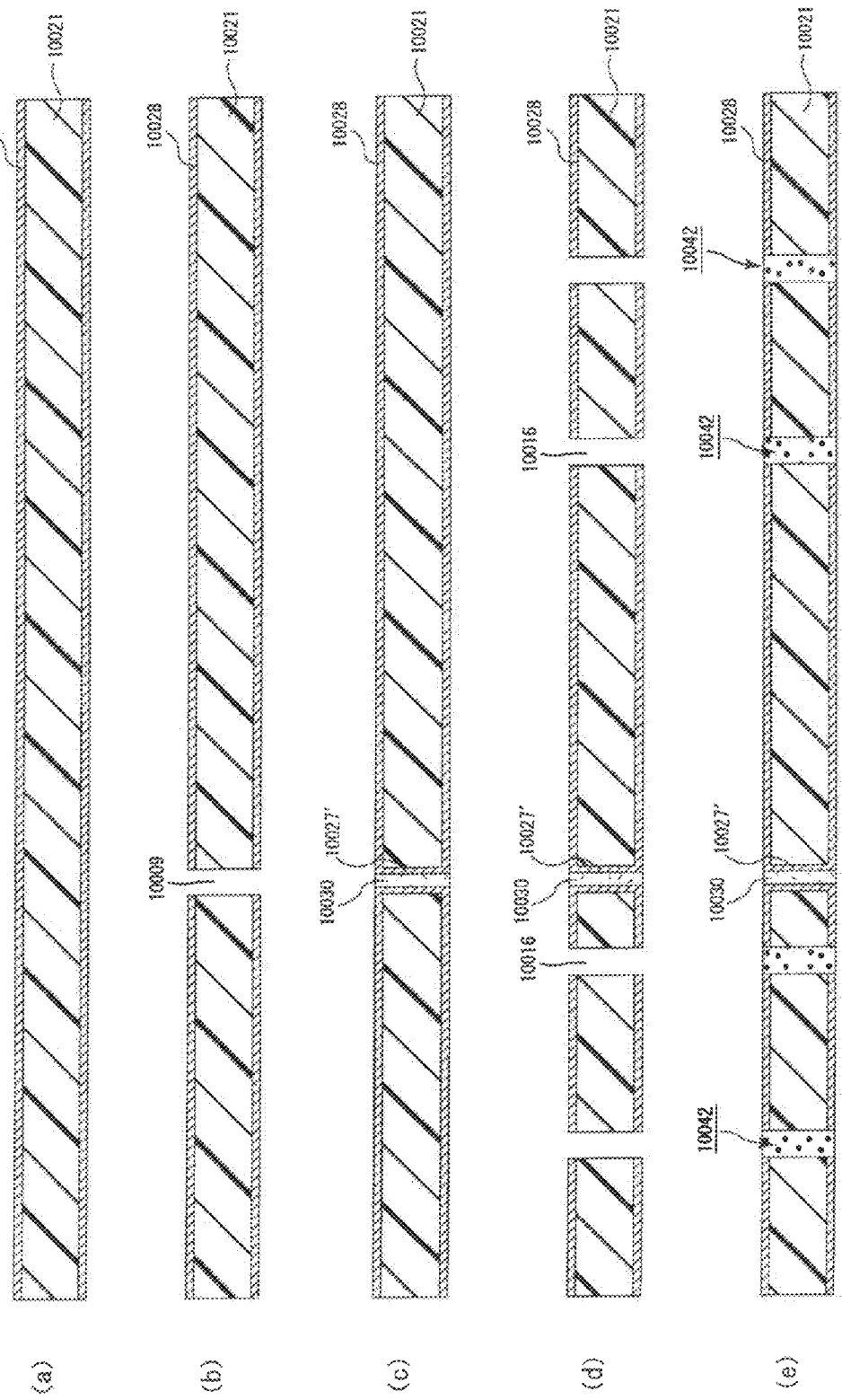
FIGS. 31(a) to 31(e) are cross-section views for schematically illustrating part of a method for manufacturing a multilayer printed circuit board according to the present invention.
Figure 32:
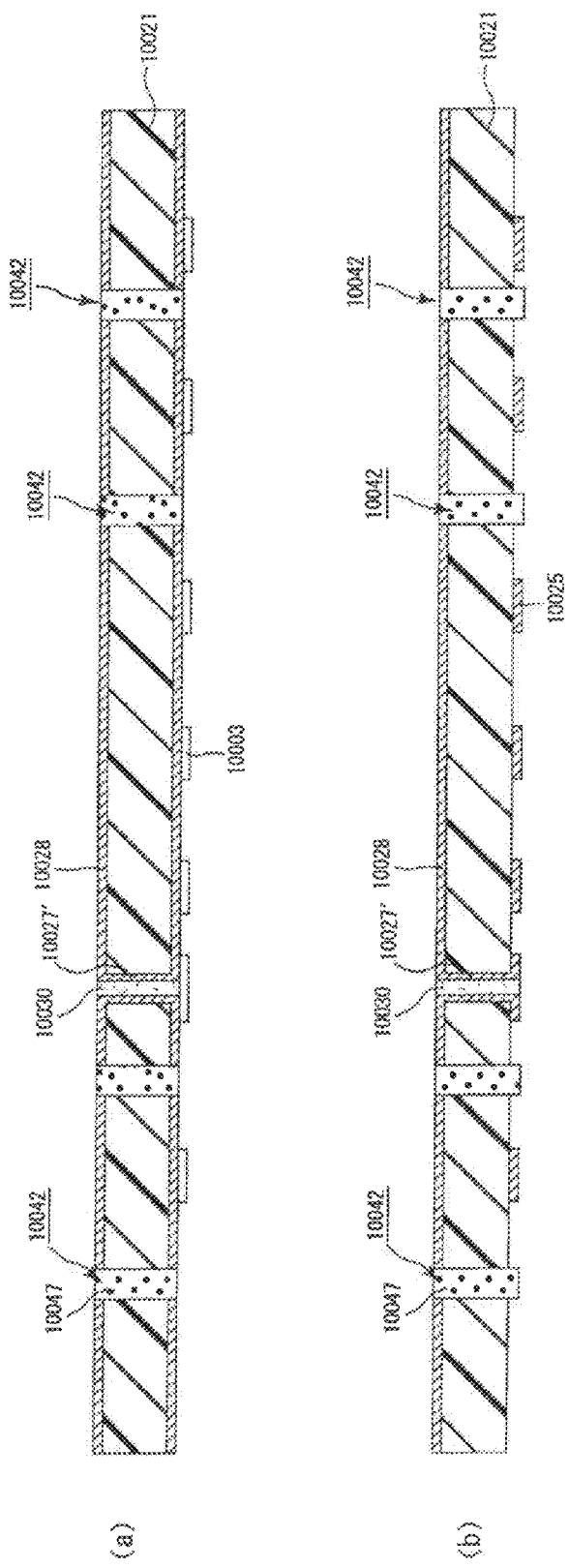
FIGS. 32(a) and 32(b) are cross-section views for schematically illustrating part of a method for manufacturing a multilayer printed circuit board according to the present invention.

Here, as for the formation of the conductor circuits, conductor circuits 10025 were formed only on one surface of the substrate in the same process as that of (3) in Example 3, and the solid conductor circuit (surface conductor layer 10028) was left on the other surface (see FIGS. 31(*a*) to 32(*b*)).

3. Manufacture of Circuit Board E (5) A circuit board E where optical signal transmitting regions 10042 which were filled in with a resin composite 10047 were formed was manufactured in accordance with the same method as that in the processes of (2) and (3) in Example 3.

Figure 33:
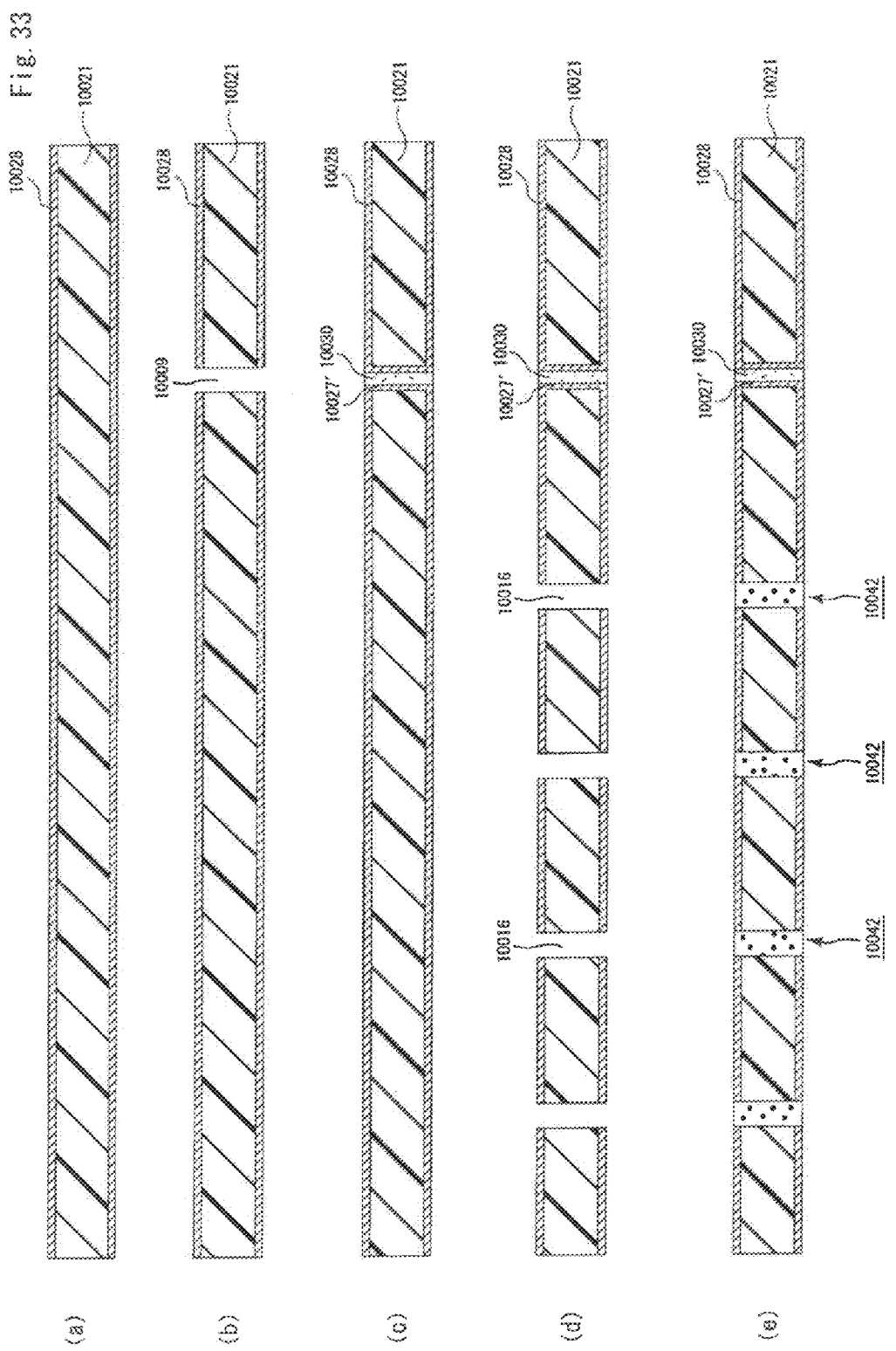
FIGS. 33(a) to 33(e) are cross-section views for schematically illustrating part of a method for manufacturing a multilayer printed circuit board according to the present invention.
Figure 34:
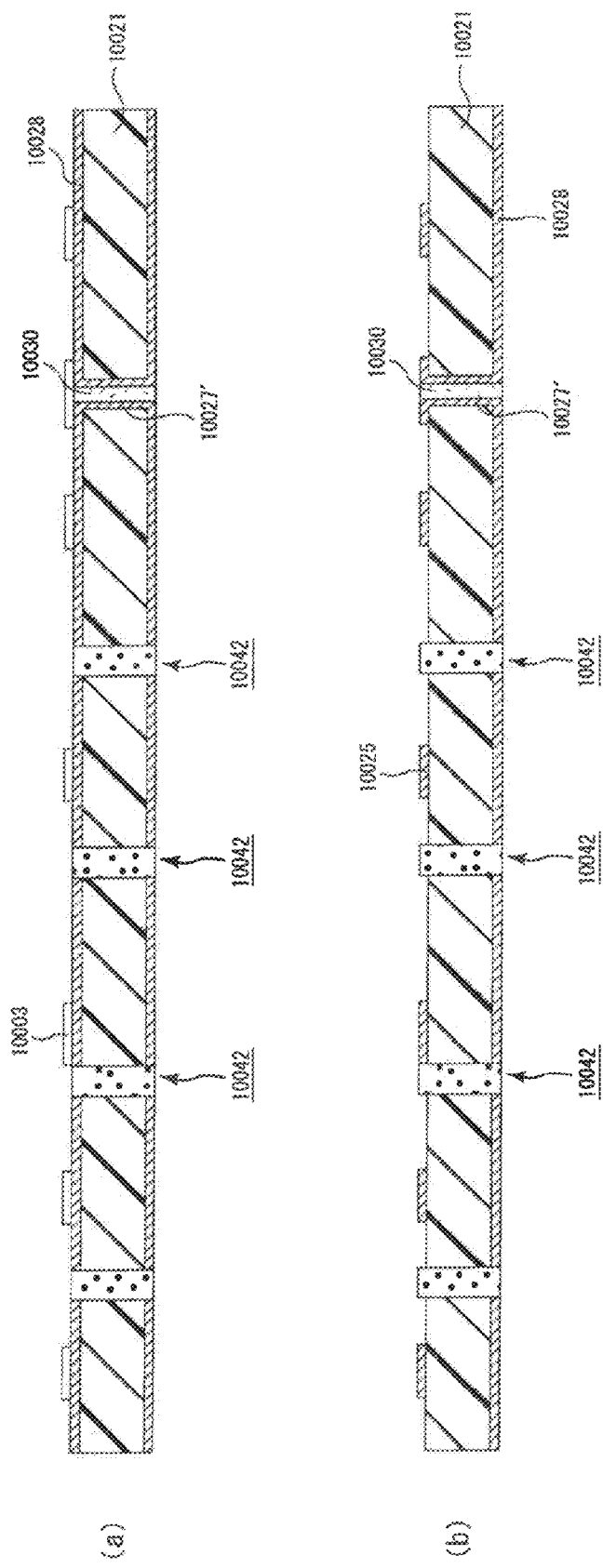
FIGS. 34(a) and 34(b) are cross-section views for schematically illustrating part of a method for manufacturing a multilayer printed circuit board according to the present invention.

Here, as for the formation of the conductor circuits, conductor circuits 10025 were formed only on one surface of the substrate in the same process as that of (3) in Example 3, and the solid conductor circuit (surface conductor layer 10028) was left on the other surface (see FIGS. 33(*a*) to 34(*b*)).

4. Method for Manufacturing Multilayer Printed Circuit Board (6) Next, one piece of each of the above described circuit board C, circuit board D and circuit board E and two adhesive insulating films having a thickness of 80 μm manufactured in accordance with the following method were prepared, and circuit boards D and E were placed on either side of the above described circuit board C at the center via prepregs 10022 so that the optical waveguides 10050 were located inside, and these were layered while being positioned in accordance with a pin lamination method. After that, they were pressed under such conditions that the pressure was 30 kg/cm$^2$, the time for pressing at a temperature of 180° C. or more was 45 minutes and the total time for pressing was 150 minutes (see FIG. 35(*a*)).

The adhesive insulating films were manufactured by stirring with three rollers a mixture of 40 parts by weight of a bisphenol A-type epoxy resin (E-1001, made by Yuka Shell Epoxy K.K.), 60 parts by weight of a phenol novolac type epoxy resin (E-154, made by Yuka Shell Epoxy K.K.), 5 parts by weight of an imidazole type curing agent (2PHZ, made by Shikoku Corp.) and 75 parts by weight of butyl cellosolve acetate to which 30 parts by weight of SiO$_2$ particles in spherical form having a particle diameter of 0.4 to 0.6 μM (SO-E2, made by Admatec GmbH) was added. After that, this resin composite was applied to the substrate using a spin coater and temporarily cured through irradiation with UV rays, whereby an adhesive insulating film was manufactured. Here, the adhesive insulating film had an index of refraction of 1.58 and a transmittance for light having a wavelength of 850 nm of 97%/37 μm.

Figure 35:
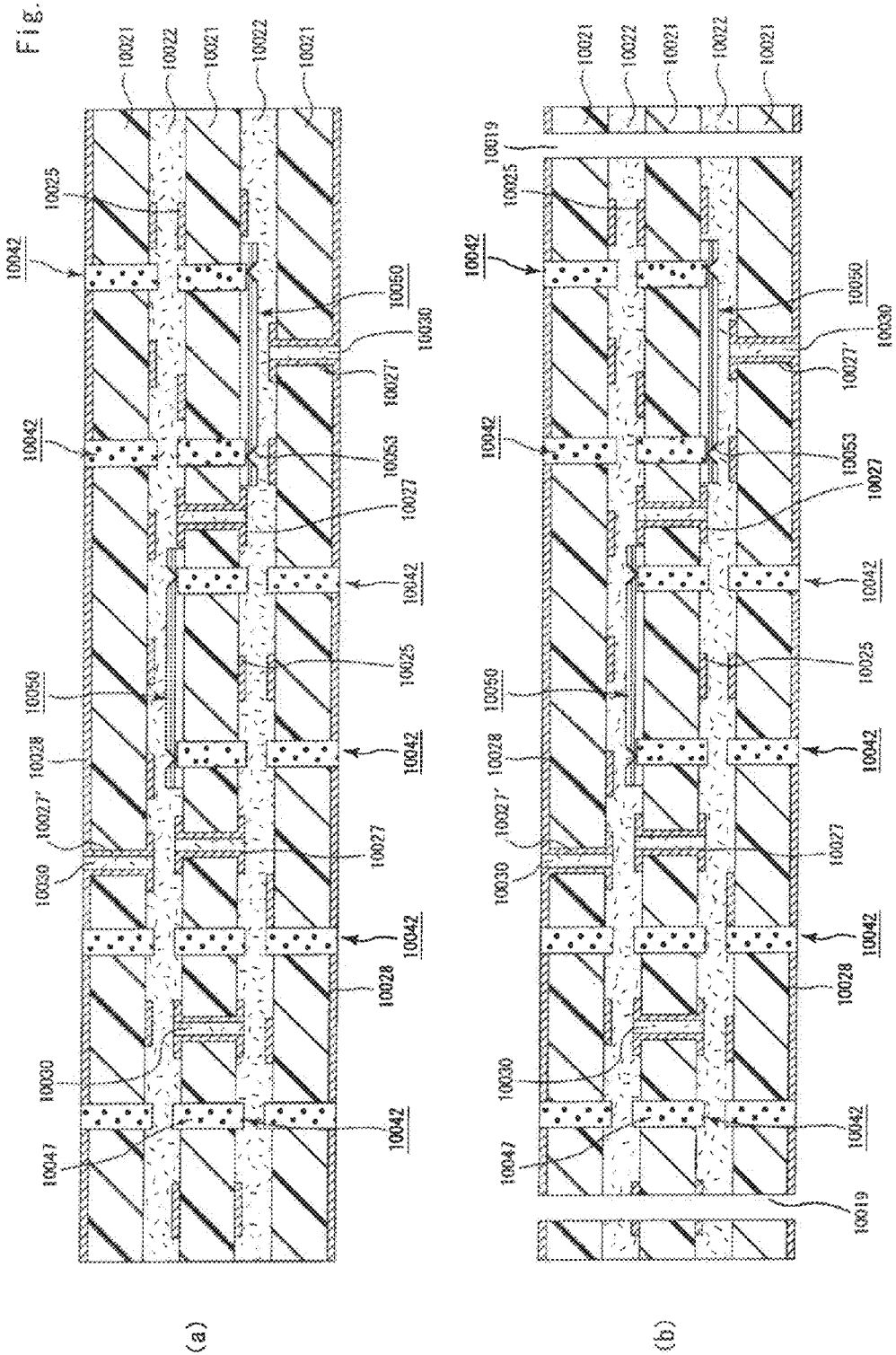
FIGS. 35(a) and 35(b) are cross-section views for schematically illustrating part of a method for manufacturing a multilayer printed circuit board according to the present invention.

(7) Next, through holes 10019 were formed through a drilling process so as to penetrate through the entirety of the multilayer board formed in the above described process of (6) (see FIG. 35(*b*)), and a conductor layer 10029' was formed on the wall surface of these through holes 10019.

Conductor layers 10029' were formed in accordance with the same method as in the process of (5) in Example 3.

(8) Next, through holes 10019 where conductor layer 10029' was formed on the wall surface were filled in with a resin composite 10030 (see FIG. 36(*a*)).

(9) Next, an etching resist (not shown) was formed on the conductor layers on the surface of the multilayer board (surface conductor layers 10028 formed on circuit board A), and after that, an etching process was carried out, whereby conductor circuits 10025 (including non-penetrating via holes 10027 and penetrating via holes 10029) were formed in the outermost layers (see FIG. 36(*b*)).

(10) Next, the same processes as in the processes of (8) to (11) in Example 3 were carried out, and furthermore, optical waveguides 10050 were formed in predetermined locations on the solder resist layers, whereby solder resist layers 10034 having solder bumps 10037 were formed, and thus, a multilayer printed circuit board on which package substrates were mounted was manufactured (see FIGS. 37(*a*) and 37(*b*)).

The multilayer printed circuit boards of Examples 1 to 4 were designed so that the size of the optical signal transmitting regions allows transmitting light to be transmitted without hitting the wall surface. That is to say, the multilayer printed circuit boards were designed taking the thickness (length of optical signal transmitting regions) of the multilayer printed circuit board and the provision of micro lenses into consideration.

When transmission of optical signals between a light emitting element and a light receiving element was evaluated for the thus gained multilayer printed circuit boards of Examples 1 to 4, it became clear that light can be transmitted at 2.5 Gbps in all of the examples.

Here, the transmission of optical signals was evaluated in accordance with the following method.

That is to say, an IC chip was mounted on a package substrate, an electrical signal of 2.5 Gbps was inputted into a connector for testing using a pulse generator, light was emitted from a VCSEL so as to pass through a driver IC, an optical signal was transmitted through the multilayer printed circuit board, the optical signal that transmitted through the multilayer printed circuit board (optical signal transmitting regions and optical circuits) was received by a PD so as to be converted to an electrical signal which passed through an amplifier IC, the electrical signal was taken out from the connector for testing, and whether or not the optical signal was transmitted normally was determined from eye patterns using an oscilloscope.

Here, two multilayer printed circuit boards were prepared as a test sample.

What is claimed is:

1. A multilayer printed circuit board comprising:
   multiple insulating layers;
   a plurality of conductor circuits formed on or between the insulating layers; and
   a plurality of optical circuits formed on or between the insulating layers and including a first optical circuit comprising organic material, and positioned on a first outermost insulating layer of the insulating layers, wherein the insulating layers, conductor circuits and optical circuits are layered to form a multilayer structure having a first surface and a second surface on an opposite side of the first surface such that the multilayer structure is configured to mount optical elements on the first surface and second surface of the multilayer structure, respectively.

2. The multilayer printed circuit board according to claim 1, wherein the multilayer structure has an optical signal transmitting region penetrating through at least one of the insulating layers, and said first optical circuit is optically coupled with at least one end of said optical signal transmitting region.

3. The multilayer printed circuit board according to claim 2, wherein said optical signal transmitting region is formed of a resin composite.

4. The multilayer printed circuit board according to claim 1, wherein the plurality of optical circuits includes two optical circuits in different layers of the multilayer structure such that at least respective portions of the two optical circuits superposed on one another.

5. The multilayer printed circuit board according to claim 1, wherein the multilayer structure has two optical elements mounted independently on each of the first and second surfaces of the multilayer structure.

6. The multilayer printed circuit board according to claim 1, wherein the multilayer structure comprises a via hole connecting at least two of said conductor circuits which sandwich one of said insulating layers, said via hole being one of a penetrating via hole and a non-penetrating via hole.

7. The multilayer printed circuit board according to claim 6, wherein said via hole is a non-penetrating via hole, said optical circuits each comprise a core portion and a clad portion, and said core portion and a portion of said non-penetrating via hole are superposed on one another.

8. The multilayer printed circuit board according to claim 1, wherein the plurality of optical circuits further comprises a second optical circuit positioned on a second outermost insulating layer which is on an opposite side of the first outermost insulating layer having the first optical circuit.

9. The multilayer printed circuit board according to claim 1, wherein said plurality optical circuits comprise at least optical waveguides or optical fiber sheets.

10. The multilayer printed circuit board according to claim 1, wherein at least one of said optical circuits is an organic optical waveguide.

11. The multilayer printed circuit board according to claim 10, wherein said organic optical waveguide includes particles in an amount sufficient such that the particles reduce a difference in coefficients of thermal expansion between the organic optical waveguide and the insulating layers.

12. The multilayer printed circuit board according to claim 11, wherein said organic optical waveguide comprises a core portion and a clad portion, and said particles are provided in said clad portion.

13. The multilayer printed circuit board according to claim 11, wherein the plurality of optical circuits includes a third optical circuit formed in an inner insulating layer among the insulating layers.

14. The multilayer printed circuit board according to claim 11, further comprising:
   a pad formed on the first optical circuit; and
   a solder resist layer formed on the first optical circuit and covering the pad,
   wherein the plurality of conductor circuits includes a conductor circuit formed on the first outermost insulating layer, and the pad is electrically connected to the conductor circuit on the first outermost insulating layer through a non-penetrating via hole.

15. The multilayer printed circuit board according to claim 11, further comprising a pad formed on a core of the first optical circuit, wherein the plurality of conductor circuits includes a conductor circuit formed on the first outermost insulating layer, and the pad is electrically connected to the conductor circuit on the first outermost insulating layer through a non-penetrating via hole.

16. The multilayer printed circuit board according to claim 10, wherein the organic optical waveguide comprises a core portion and a clad portion and includes particles in the clad portion in an amount sufficient such that the particles adjust a transmission of the clad portion.

* * * * *